(12) United States Patent
Sugino et al.

(10) Patent No.: US 7,829,992 B2
(45) Date of Patent: Nov. 9, 2010

(54) SEMICONDUCTOR DEVICE AND METHOD FOR MANUFACTURING SEMICONDUCTOR DEVICE

(75) Inventors: Mitsuo Sugino, Tokyo (JP); Satoru Katsurayama, Tokyo (JP); Tomoe Yamashiro, Tokyo (JP); Tetsuya Miyamoto, Tokyo (JP); Hiroyuki Yamashita, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 0 days.

(21) Appl. No.: 11/886,904

(22) PCT Filed: Apr. 24, 2007

(86) PCT No.: PCT/JP2007/000443

§ 371 (c)(1),
(2), (4) Date: Sep. 21, 2007

(87) PCT Pub. No.: WO2007/129458

PCT Pub. Date: Nov. 15, 2007

(65) Prior Publication Data

US 2009/0243065 A1  Oct. 1, 2009

(30) Foreign Application Priority Data

Apr. 27, 2006 (JP) ............................ 2006-123461
Jun. 15, 2006 (JP) ............................ 2006-166162
Jul. 13, 2006 (JP) ............................ 2006-192658
Jul. 18, 2006 (JP) ............................ 2006-195178

(51) Int. Cl.
*H01L 23/02* (2006.01)
*H01L 23/04* (2006.01)
*H01L 23/053* (2006.01)
*H01L 23/12* (2006.01)
*H01L 23/48* (2006.01)

(52) U.S. Cl. ................. 257/686; 257/698; 257/777; 257/737

(58) Field of Classification Search ................ 257/686, 257/737, 787, 777, 698, 690, 700, 734, 673, 257/675, 680, 684, 676, 706, 782, 783, 712, 257/713, 715, 796
See application file for complete search history.

(56) References Cited

U.S. PATENT DOCUMENTS 6,621,170 B2 * 9/2003 Yamamoto et al. .......... 257/783

(Continued)

FOREIGN PATENT DOCUMENTS

JP            7-183426          7/1995

(Continued)

*Primary Examiner*—Chuong A. Luu
(74) *Attorney, Agent, or Firm*—Smith, Gambrell & Russell, LLP

(57) ABSTRACT

A semiconductor device (100) comprises a first resin substrate (101) on which a first semiconductor chip (125) is mounted a surface thereof; a second resin substrate (111) on which a second semiconductor chip (131) is mounted on a surface thereof; and a resin base material (109), joined to a front surface of the first resin substrate (101) and to a back surface of the second resin substrate (111), so that these surfaces are electrically connected. The resin base material (109) is disposed in a circumference of the first resin substrate (101) in the surface of the first resin substrate (101). Further, the first semiconductor chip (125) is disposed in a space section provided among the first resin substrate (101), the second resin substrate (111) and the resin base material (109) in the surface of the first resin substrate (101).

16 Claims, 26 Drawing Sheets

U.S. PATENT DOCUMENTS

| | | | |
|---|---|---|---|
| 7,049,528 B2 * | 5/2006 | Kariya et al. | 174/262 |
| 7,242,081 B1 * | 7/2007 | Lee | 257/686 |
| 7,244,675 B2 * | 7/2007 | Honda et al. | 438/644 |
| 7,518,239 B2 * | 4/2009 | Hashimoto | 257/734 |
| 2004/0222522 A1 | 11/2004 | Homma | |
| 2006/0237225 A1 | 10/2006 | Kariya et al. | |

FOREIGN PATENT DOCUMENTS

| | | |
|---|---|---|
| JP | 7-249736 | 9/1995 |
| JP | 9-199526 | 7/1997 |
| JP | 11-111914 | 4/1999 |
| JP | 2003-105054 | 4/2003 |
| JP | 2003-218273 | 7/2003 |
| JP | 2004-265955 | 9/2004 |
| JP | 2004-277671 | 10/2004 |
| JP | 2004-281491 | 10/2004 |

* cited by examiner

Fig.5
(a)
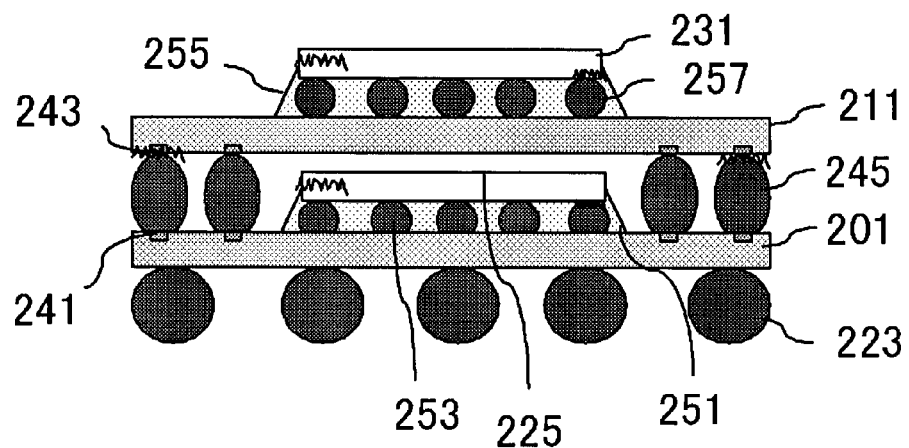
(b)
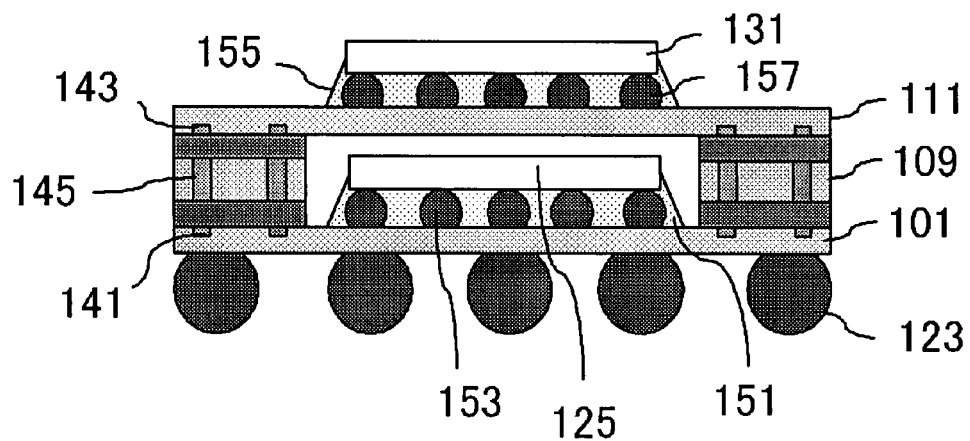

Fig.34
(a)
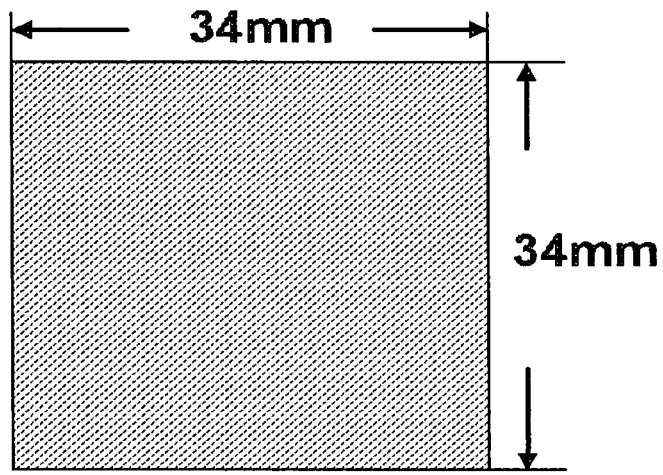
(b)
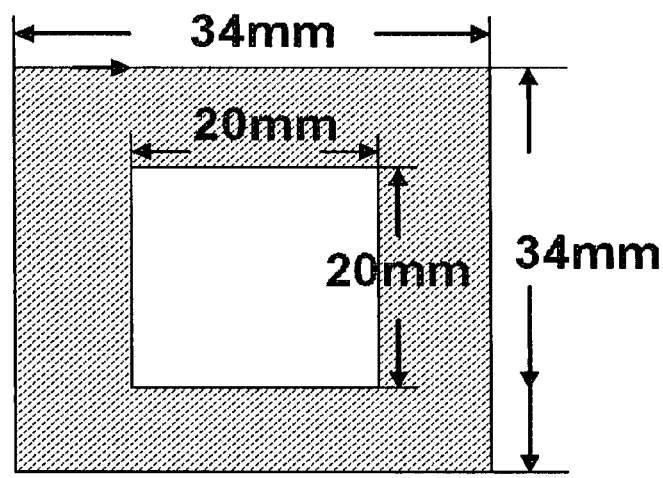
(c)
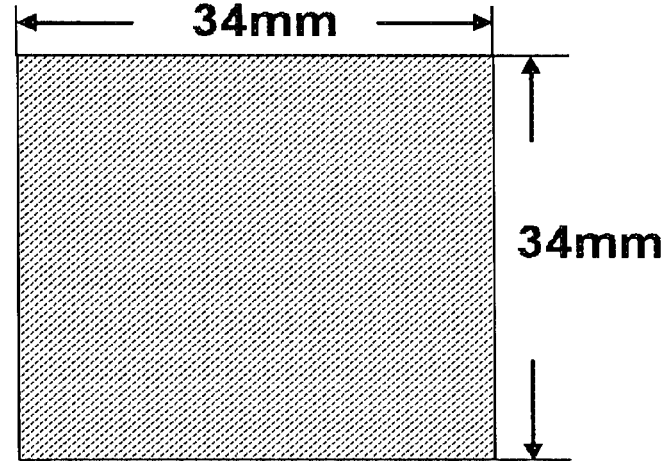

SEMICONDUCTOR DEVICE AND METHOD FOR MANUFACTURING SEMICONDUCTOR DEVICE

BACKGROUND

1. Technical Field

The present invention relates to a semiconductor device, and particularly relates to a semiconductor device having a plurality of stacked semiconductor chips and a method for manufacturing a semiconductor device.

2. Background Art

In recent years, lighter, more compact and more sophisticated semiconductor devices are generally required in the industry, and a dense integration of electronic components and a dense installation of electronic components are progressed. Semiconductor packages employed for these electronic equipments are miniaturized and have multiple pins, and further, substrates for packaging electronic components including semiconductor packages are also miniaturized.

Typical semiconductor packages that achieves a high-density package include a stack structure, in which a plurality of semiconductor chips are stacked on an interconnect substrate. When a combination of a larger semiconductor chip and a smaller semiconductor chip are stacked in such structure, the larger semiconductor chip is mounted on the interconnect substrate and the smaller semiconductor chip is mounted on the larger semiconductor chip.

On the contrary, a package-on-package (POP) structure is proposed for another type of a structure including a stacked combination of a larger semiconductor chip and a smaller semiconductor chip, in which the smaller semiconductor chip is mounted on the mounting substrate (see Japanese Patent Laid-Open No. H7-183,426 (1995) and Japanese Patent Laid-Open No. H7-249,736 (1995)).

In such POP structure, a substrate including a second semiconductor chip mounted thereon is mounted on a mounting substrate including a first semiconductor chip mounted thereon. For example, when the first semiconductor chip is smaller than the second semiconductor chip, the above-described relationship in the sizes of the chips is provided.

In the POP structure, it is required that the mounting substrate is electrically connected to the first semiconductor chip and a space for mounting the second semiconductor chip is ensured in the mounting substrate.

To fulfill the requirements, Japanese Patent Laid-Open No. H7-183,426 discloses a configuration of a semiconductor device, which is provided with a bump electrode having a height, which larger than a thickness of the semiconductor chip mounted on the mounting substrate. Then, another substrate having another semiconductor chip mounted thereon is disposed on such bump electrode, and these are electrically connected to ensure an electrical conduction between the semiconductor chip on the substrate and the mounting substrate.

In addition, in a semiconductor assembly as set forth in Japanese Patent Laid-Open No. H7-249,736, "J"-shaped leads are provided in the assembly, and a bottom of a lead in the upper portion of the assembly is coupled to an upper surface of a lead in the lower portion of the assembly.

Patent literature 1
Japanese Patent Laid-Open No. H7-183,426

Patent literature 2
Japanese Patent Laid-Open No. H7-249,736

However, a stress is exerted on the bump electrode or the lead when a thermal history is encountered in the conventional POP structures described above to cause a break in the bump electrode or the lead, causing a conductive failure. It is considered this is because a larger difference exists between a coefficient of thermal expansion of the substrate and a coefficient of thermal expansion of the bump electrode for the vertical electrical conduction or between a coefficient of thermal expansion of the lead and a coefficient of thermal expansion of the substrate, and in addition, because larger bump electrode and larger lead that are thicker than the thickness of semiconductor chip are employed.

DISCLOSURE OF THE INVENTION

According to one aspect of the present invention, there is provided a semiconductor device, comprising: a first resin substrate on which a first semiconductor chip is mounted; a second resin substrate on which a second semiconductor chip is mounted; and a resin spacer, joined to a front surface of the first resin substrate and to a back surface of the second resin substrate, so that the front surface of the first resin substrate is electrically connected to the back surface of the second the resin substrate, wherein the resin spacer is disposed in a circumference of the first semiconductor chip on the surface of the first resin substrate, and wherein the first semiconductor chip is disposed in a space section provided among the first resin substrate, the second resin substrate and the resin spacer on the surface of the first resin substrate.

In the conventional configurations described above in terms of the background technology, the substrates are mutually coupled via electrodes such as bumps. Thus, when heat treatment processes after the assembly operations are conducted in the manufacturing process, the substrate is easy bent due to a larger difference between the coefficient of thermal expansion of the substrate and the coefficient of thermal expansion of bump. Thus, reliability in the coupling between the substrate and the electrode may be insufficient.

On the contrary, in the present invention, the resin spacer is provided between the first resin substrate and the second resin substrate, and the first semiconductor chip is disposed in the space section provided among the first resin substrate, the second resin substrate and the resin spacer. The resin spacer is provided between the resin substrates, in place of providing the bump electrode, so that a difference in the coefficient of thermal expansion between the upper and lower substrates and the spacer can be zero or reduced, leading to reducing a stress of a vertical connection with an electric conduction, and leading to a reduction in the bending of the substrate, thereby inhibiting a decrease in the joint reliability.

More specifically, in the region provided with the resin spacer, the whole member from the first resin substrate to the second resin substrate form a multiple-layered material, which leads to an increased thickness of the whole multiple-layered material, so that a bending of the resin substrate can be effectively inhibited even if a heat treatment process is conducted in the manufacturing process after the assembly process.

In addition, when a bump electrode is provided between the resin substrates as in the conventional technology, relatively larger difference in coefficient of thermal expansion between the resin substrate and the bump electrode which is composed of the metallic element is caused. On the contrary, the first resin substrate, the second resin substrate and the resin spacer are composed of resin materials in the present invention, a difference in coefficient of thermal expansion between the resin substrate and the resin spacer is relatively smaller. Thus, the bending created due to a difference in coefficient of thermal expansion between the components can be more effectively inhibited.

Since a bending of the resin substrate can be effectively inhibited in the present invention as described above, a local stress concentration on the semiconductor chip mounted on the resin substrate created by a warping of the resin substrate can be inhibited. Thus, failures in the semiconductor chip represented by, for example, a crack in the chip, delamination of the chip peeled off the substrate can be inhibited.

In addition, since the resin spacer is provided in circumference of the first resin substrate, and the first semiconductor chip is disposed in the space section provided among the first resin substrate, the second resin substrate and the resin spacer in the present invention, a space for mounting the first semiconductor chip between resin substrates can be stably ensured.

According to another aspect of the present invention, there is provided a semiconductor device, comprising: a first resin substrate on which a first semiconductor chip is mounted; a second resin substrate on which a second semiconductor chip is mounted; and a resin spacer, contacted with a front surface of the first resin substrate and to a back surface of the second the resin substrate, so that the front first resin substrate is electrically connected to the second resin substrate, wherein the resin spacer is disposed in a circumference of the first semiconductor chip on the surface of the first resin substrate, wherein the first semiconductor chip is disposed in a space section provided among the first resin substrate, the second resin substrate and the resin spacer on the surface of the first resin substrate, the first resin substrate includes a buildup layer, which is formed of insulating layers containing resin and conductor interconnect layers that are alternately stacked, each of the conductor interconnect layers being electrically mutually coupled via conductor layers formed in the via holes of the insulating layers, the second resin substrate includes a buildup layer, which is formed of insulating layers containing resin and conductor interconnect layers that are alternately stacked, each of the conductor interconnect layers being electrically mutually coupled via conductor layers formed in the via holes of the insulating layers, wherein, among insulating layers of the buildup layer of at least one of the first resin substrate and the second resin substrate, in at least one insulating layer, an average coefficient of thermal expansion along a substrate inplane direction for temperature range of from 25 degree C. to a glass transition point thereof is equal to or lower than 30 ppm/degree C., and an average coefficient of thermal expansion along a substrate thickness direction for temperature range of from 25 degree C. to a glass transition point thereof is equal to or lower than 30 ppm/degree C.

When a metallic bump electrode or a lead is disposed between the substrates as in the conventional technology, it is difficult to reduce a difference in coefficient of thermal expansion between the substrate containing a resin and the metallic bump electrode or a difference in coefficient of thermal expansion between the substrate containing a resin and the metallic lead. On the contrary, since the resin spacer is disposed between the first resin substrate and the second resin substrate, and all of the first resin substrate, the second resin substrate and the resin spacer may be configured to contain a resin in the present invention, a difference in coefficient of thermal expansion between the first resin substrate and the resin spacer and a difference in coefficient of thermal expansion between the second resin substrate and the resin spacer can be reduced. This can reduce a frequency of a generation of a conductive failure.

In addition, in the conventional POP structure, a larger warpage is generated in the substrate when a thermal history is encountered, and the semiconductor chip is eliminated from the substrate. On the contrary, the present invention is configured that, among insulating layers of the buildup layer of at least one of the first resin substrate and the second resin substrate, in at least one insulating layer, an average coefficient of thermal expansion along the substrate inplane direction for temperature range of from 25 degree C. to a glass transition point thereof is equal to or lower than 30 ppm/degree C., and an average coefficient of thermal expansion along a substrate thickness direction for temperature range of from 25 degree C. to a glass transition point thereof is equal to or lower than 30 ppm/degree C. Therefore, when the semiconductor device encounters a thermal history, at least a warpage of the first resin substrate or the second resin substrate is reduced. This allows reducing a generation of a conductive failure between the first resin substrate and the first semiconductor chip, or a generation of a conductive failure between the second resin substrate and the second semiconductor chip, providing the semiconductor device with an improved joint reliability.

In addition, the first resin substrate containing resin, the resin spacer, and the second resin substrate containing resin are stacked in the present invention, and the whole member from the first resin substrate to the second resin substrate forms a resin multiple-layered material having larger thickness. Therefore, a stiffness of the whole semiconductor device is improved, leading to a difficulty in causing a warpage in the whole semiconductor device, thereby providing the semiconductor device with lower possibility of causing a conductive failure. Further, since the resin spacer is provided in circumference of the first resin substrate, and the first semiconductor chip is disposed in the space section provided between the first resin substrate and the second resin substrate in the present invention, a space for mounting the first semiconductor chip between the first resin substrates and the second resin substrate can be stably ensured.

In such case, at least one layer of the insulating layer of the buildup layer may preferably contain a cyanate resin, and in particular, the cyanate resin may preferably be a novolac cyanate resin. According to such configuration, a coefficient of thermal expansion of the insulating layer along the substrate inplane direction and a coefficient of thermal expansion thereof along a substrate-thickness direction can be certainly reduced.

Further, it is preferable that at least one of the first resin substrate and the second resin substrate includes a core layer wherein a through hole provided with a conductor layer is formed in the inside of a insulating layer, and said conductor layer in the through hole is coupled to the conductor interconnect layer of the buildup layer is formed, and that an average coefficient of thermal expansion along a substrate inplane direction of the insulating layer of the core layer for temperature range of from 25 degree C. to a glass transition point thereof is equal to or lower than 12 ppm/degree C., and an average coefficient of thermal expansion along a substrate thickness direction of the insulating layer of the core layer for temperature range of from 25 degree C. to a glass transition point thereof is equal to or lower than 20 ppm/degree C. In such configuration, a resin in the insulating layer of the core layer contains a cyanate resin, and further, it is preferable that the cyanate resin is a novolac cyanate resin.

In addition, it is preferable that a pair of the buildup layers are disposed across the core layer, and coefficients of thermal expansion of the insulating layers of the buildup layers disposed in substantially symmetric locations across the core layer are mutually equivalent. As described above, coefficients of thermal expansion of the insulating layers disposed in the symmetric locations across the core layer are selected to be mutually equivalent, so that a warpage of the insulating layer disposed across the core layer is symmetrically generated. This allows inhibiting a generation of a warpage of the substrate. Here, the equivalent coefficient of thermal expansions of the insulating layers of the buildup layer includes that a difference in coefficient of thermal expansion between the insulating layers disposed in the symmetric locations across the core layer is zero or equal to or lower than 5 ppm/degree C.

It is preferable that the resin spacer includes a core layer having an insulating layer where a conductor layer is provided within a through hole, in the insulating layer of the core layer, an average coefficient of thermal expansion along an inplane direction for temperature range of from 25 degree C. to a glass transition point thereof is equal to or lower than 12 ppm/degree C., and an average coefficient of thermal expansion along a thickness direction for temperature range of from 25 degree C. to a glass transition point thereof is equal to or lower than 20 ppm/degree C. Having such configuration, a difference between a deformation volume of resin spacer and a deformation volume of at least one of the first resin substrate and the second resin substrate can be reduced. This allows reducing a generation of a conductive failure between the resin spacer and the first resin substrate, or between the resin spacer and the second resin substrate.

Further, in such configuration, it is preferable that the resin spacer includes a buildup layer which is formed on the core layer and which is formed of insulating layers containing resin and conductor interconnect layers that are alternately stacked, each of the conductor interconnect layers being electrically mutually coupled via conductor layers formed in the via holes of the insulating layers, and that, among insulating layers in the buildup layer of the resin spacer, in at least one insulating layer, an average coefficient of thermal expansion along an inplane direction for temperature range of from 25 degree C. to a glass transition point thereof is equal to or lower than 30 ppm/degree C., and an average coefficient of thermal expansion along a substrate thickness direction for temperature range of from 25 degree C. to a glass transition point thereof is equal to or lower than 30 ppm/degree C.

A resin of the insulating layer in the core layer of the resin spacer and a resin of the insulating layer in the buildup layer of the resin spacer preferably include a cyanate resin, respectively. In particular, it is preferable to contain a novolac cyanate resin as the cyanate resin.

In such configuration, it is preferable that the resin spacer is composed of a substrate material, which is similar to the substrate material of at least one of the first resin substrate and the second resin substrate. The resin spacer is composed of a substrate material, which is similar to the substrate material of at least one of the first resin substrate and the second resin substrate, so that a difference in coefficient of thermal expansion of the spacer with the first resin substrate or with the second resin substrate can be considerably reduced.

This allows reducing a generation of a conductive failure between the resin spacer and the first resin substrate, or between the resin spacer and the second resin substrate.

In addition, it is preferable that the first resin substrate has a planar geometry of substantially rectangular, and the resin spacer is provided along each side of the rectangular geometry of the first resin substrate. The resin spacer is provided along all sides of the first resin substrate, so that the second resin substrate can be stably supported, as compared with a configuration of providing the spacer in some side(s) of the first resin substrate.

Further, it is preferable that the first resin substrate is connected to first semiconductor chip via a bump and the second resin substrate is connected to the second semiconductor chip via a bump, and wherein an underfill filled therein is mounted in a periphery of each of the bumps, the underfill being composed of a resin material whose elastic modulus in atmosphere at 125 degrees centigrade is 150 MPa or more and 800 MPa or less. The underfill is selected to have an elastic modulus of within a range of from 150 MPa to 800 MPa, so that the peripheries of the bump are firmly fixed, preventing a crack in the bump.

According to further aspect of the present invention, there is provided a semiconductor device, comprising: a first resin substrate on which a first semiconductor chip is mounted; a second resin substrate on which a second semiconductor chip is mounted; and a resin spacer, disposed between a front surface of the first resin substrate and a back surface of the second resin substrate, so that the front surface of the first resin substrate is electrically connected to the back surface of the second the resin substrate, wherein the resin spacer is disposed in a circumference of the first semiconductor chip on the surface of the first resin substrate, and the first semiconductor chip is disposed in a space section provided among the first resin substrate, the second resin substrate and the resin spacer on the surface of the first resin substrate, wherein a first adhesive member, including an adhesive first resin layer that is capable of adhering the first resin substrate to the resin spacer and a first electric conductor disposed in the first resin layer, is provided between the first resin substrate and the resin spacer, wherein a second adhesive member, including an adhesive second resin layer that is capable of adhering the resin spacer to the second resin substrate and a second electric conductor disposed in the second resin layer, is provided between the resin spacer and the second resin substrate, wherein the first resin substrate is electrically connected to the resin spacer through the first electric conductor of the first adhesive member, and wherein the second resin substrate is electrically connected to the resin spacer through the second electric conductor of the second adhesive member.

When a metallic bump electrode or a lead is disposed between the substrates as in the conventional technology, it is difficult to reduce a difference in coefficient of thermal expansion between the substrate containing a resin and the metallic bump electrode or a difference in coefficient of thermal expansion between the substrate containing a resin and the metallic lead. On the contrary, since the resin spacer is disposed between the first resin substrate and the second resin substrate, and all of the first resin substrate, the second resin substrate and the resin spacer may be configured to contain a resin in the present invention, a difference in coefficient of thermal expansion between the first resin substrate and the resin spacer and a difference in coefficient of thermal expansion between the second resin substrate and the resin spacer can be reduced. This can reduce a frequency of a generation of a conductive failure between the first resin substrate and the second resin substrate. In addition to above, in the present invention, a first electric conductor and a second electric conductor are disposed between the first resin substrate and the resin spacer and between the second resin substrate and the resin spacer, respectively. At this time, it is concerned that differences in coefficient of thermal expansion between the first electric conductor and the first resin substrate and between the second electric conductor and the second resin substrate may be increased. Nevertheless, the first electric conductor and the second electric conductor serve as providing a coupling to the substrate and the resin spacer, respectively, and the thickness thereof is not thicker than the semiconductor chip unlike the bump electrode for coupling between the substrates, unlike the conventional technology. Therefore, a difference in deformation volume between the substrate and the electric conductor can be reduced when thermal history is encountered, inhibiting a generation of a conductive failure.

In addition, the first resin substrate containing resin, the resin spacer, and the second resin substrate containing resin are stacked in the present invention, and the whole member from the first resin substrate to the second resin substrate forms a resin multiple-layered material having larger thickness. Therefore, a stiffness of the whole semiconductor device is improved, leading to a difficulty in causing a warpage in the whole semiconductor device, thereby providing the semiconductor device with lower possibility of causing a conductive failure. Further, since the resin spacer is provided in circumference of the first resin substrate, and the first semiconductor chip is disposed in the space section provided between the first resin substrate and the second resin substrate in the present invention, a space for mounting the first semiconductor chip between the first resin substrates and the second resin substrate can be stably ensured.

In addition, it may be considered that only a metallic bump, for example, is provided as a member for coupling the first resin substrate to the resin spacer and a member for coupling the second resin substrate to the resin spacer. However, when only the metallic bump is provided, stress concentrates on the bump when the semiconductor device encounters a thermal history, and a certain possibility of generating a crack is considered. This possibly induces a conductive failure. On the contrary, in the present invention, the first adhesive member having the first electric conductor disposed in the first resin layer is provided between the first resin substrate and the resin spacer, and the second adhesive member having the second electric conductor disposed in the second resin layer is provided between the resin spacer and the second resin substrate. In the present invention, the first electric conductor and the second electric conductor are reinforced with the first resin layer and the second resin layer, respectively, and stresses exerted to the first electric conductor and the second electric conductor are distributed to the first resin layer and the second resin layer, respectively, so that a generation of a crack in the first electric conductor and in the second electric conductor can be certainly prevented, thereby inhibiting a generation of a conductive failure in the semiconductor device.

Further, when only an electric conductor is disposed between the first resin substrate and the resin spacer as in the present invention, a load of the resin spacer and the like is exerted on the electric conductor. On the contrary, in the present invention, the first electric conductor is disposed in the first resin layer, which serves as adhering the first resin substrate with the resin spacer. The load from the resin spacer and the like can be distributed to the first resin layer, in addition to the first electric conductor, thereby reducing the load exerted to the first electric conductor.

In addition to above, similar advantageous effect can be obtained by disposing the second adhesive member between the second resin substrate and the resin spacer.

In such configuration, it is preferable that the first resin substrate has a conductor interconnect layer in a front surface thereof, the second resin substrate has a conductor interconnect layer in a back surface thereof, the resin spacer has conductor interconnect layers in front and back surfaces, respectively, that the conductor interconnect layer of the first resin substrate is electrically connected to the conductor interconnect layer of the resin spacer through the first electric conductor, that the conductor interconnect layer of the second resin substrate is electrically connected to the conductor interconnect layer of the resin spacer through the second electric conductor, and that the first electric conductor and the second electric conductor are composed of solder.

According to this configuration, through solder, the conductor interconnect layer of the first resin substrate is coupled to the conductor interconnect layer of the resin spacer, and the conductor interconnect layer of the second resin substrate is coupled to the conductor interconnect layer of the resin spacer. Therefore, metallic junctions can be formed between solder and the conductor interconnect layer of the first resin substrate, between solder and the conductor interconnect layer of the resin spacer and between solder and the conductor interconnect layer of the second resin substrate. This allows providing the semiconductor device with an improved joint reliability.

In addition, it is preferable that a first resin layer of the first adhesive member and a second resin layer of the second adhesive member contain an epoxy resin and an acrylic rubber. The first resin layer and the second resin layer are composed of materials containing an acrylic rubber, so that a reduced elastic modulus is achieved and an enhanced adhesiveness to the first resin substrate, the resin spacer and the second resin substrate is achieved for the first adhesive member and the second adhesive member. Further, the first resin layer and the second resin layer are composed of materials containing epoxy resin, so that an enhanced heat resistance and an enhanced moisture resistance are achieved for the first adhesive member and the second adhesive member.

It is preferable that the solder is an alloy containing at least two or more elements selected from the group consisting of tin (Sn), silver (Ag), bismuth(Bi), indium (In), zinc (Zn) and copper (Cu). In addition, it is preferable that the first adhesive member is a cured product of an adhesive agent containing the first resin layer, a curing agent exhibiting the flux activity and solder, and that the second adhesive member is a cured product of an adhesive agent containing the second resin layer, a curing agent exhibiting the flux activity and solder.

Further, it is preferable that the curing agent exhibiting the flux activity is a chemical compound containing carboxyl group and a functional group that is capable of reacting with epoxy group. In such first adhesive member and second adhesive member, a curing agent exhibiting the flux activity present in the first resin layer and in the second resin layer moves to an interface between the conductor interconnect layer and solder with an improved efficiency during the cure process. This allows ensured junction between the conductor interconnect layer and solder, thereby providing an electric coupling therebetween.

In addition, the first electric conductor of the first adhesive member and the second electric conductor of the second adhesive member may be conductive particles, respectively, the first resin substrate may be electrically connected to the resin spacer, through the conductive particles of the first adhesive member, and the second resin substrate may be electrically connected to the resin spacer through the conductive particles of the second adhesive member.

According to such configuration, an anisotropic conductive film, for example, may be employed for the first adhesive member and the second adhesive member.

In addition, it is preferable that the first resin substrate has a conductor interconnect layer in the front surface and an insulating layer is provided on the conductor interconnect layer so as to expose at least a part of the conductor interconnect layer, that the second resin substrate has a conductor interconnect layer in the back surface and an insulating layer is provided on the conductor interconnect layer so as to expose at least a part of the conductor interconnect layer, that the resin spacer has conductor interconnect layers in front and back surfaces, respectively, that the conductive particles of the first adhesive member disposed between the resin spacer and the first resin substrate provides a coupling between the conductor interconnect layer of the first resin substrate exposed from the insulating layer and the conductor interconnect layer of the resin spacer, and that the conductive particles of the second adhesive member disposed between the resin spacer and the second resin substrate provides a coupling between the conductor interconnect layer of the second resin substrate exposed from the insulating layer and the conductor interconnect layer of the resin spacer.

Further, it is preferable that, among the conductive particles of the first adhesive member provided between the resin spacer and the first resin substrate, the conductive particles disposed between the resin spacer and the insulating layer provided on the first resin substrate are disposed so as to be wedged into the insulating layer, and that, among the conductive particles of the second adhesive member provided between the resin spacer and the second resin substrate, the conductive particles disposed between the resin spacer and the insulating layer provided on the second resin substrate are disposed so as to be wedged into the insulating layer. The conductive particles disposed between the resin spacer and the insulating layer provided on the first resin substrate are disposed so as to be wedged into the insulating layer, so that the conductor interconnect layer of the first resin substrate exposed from the insulating layer can be certainly coupled to the conductor interconnect layer of the resin spacer via the conductive particles. Similarly, the conductive particles disposed between the resin spacer and the insulating layer provided on the first resin substrate are disposed so as to be wedged into the insulating layer, so that the conductor interconnect layer of the second resin substrate exposed from the insulating layer can be certainly coupled to the conductor interconnect layer of the resin spacer via the conductive particles.

Further, it is preferable that the conductive particle is formed of a core material of resin, which is coated with a metallic film.

In addition, it is preferable that the resin spacer is composed of a substrate material, which is similar to the substrate material of at least one of the first resin substrate and second resin substrate. The resin spacer is composed of a substrate material, which is similar to that of at least one of the first resin substrate and the second resin substrate, so that a difference in coefficient of thermal expansion of the resin spacer with the first resin substrate or with the second resin substrate can be considerably reduced. This allows surely reducing a frequency of causing a conductive failure between the resin spacer and the first resin substrate or between the resin spacer and the second resin substrate.

According to further aspect of the present invention, there is provided a semiconductor device, comprising: a first resin substrate on which a first semiconductor chip is mounted; a second resin substrate on which a second semiconductor chip is mounted; and a resin spacer, disposed between a front surface of the first resin substrate and a back surface of the second resin substrate, so that the front surface of the first resin substrate is electrically connected to the back surface of the second the resin substrate, wherein the resin spacer is disposed in a circumference of the first semiconductor chip on the surface of the first resin substrate, and the first semiconductor chip is disposed in a space section provided among the first resin substrate, the second resin substrate and the resin spacer on the surface of the first resin substrate, wherein a metallic first bump is provided between the first resin substrate and the resin spacer, the metallic first bump being capable of coupling the first resin substrate to the resin spacer, and wherein a metallic second bump is provided between the resin spacer and the second resin substrate, the metallic second bump being capable of coupling the second resin substrate to the resin spacer.

In the present invention, the resin spacer is provided between the first resin substrate and the second resin substrate, and the first semiconductor chip is disposed in the space section provided among the first resin substrate, the second resin substrate and the resin spacer. While the first bump for coupling the first resin substrate to the resin spacer and the second bump for coupling the second resin substrate to the resin spacer are provided in the present invention, the space for disposing the first semiconductor chip is formed with the resin spacer, such that it is not required to form the bump to be thicker and larger than the first semiconductor chip, unlike the conventional configuration. This allows achieving a reduced difference in deformation volume between the substrate and the bump when a thermal history is encountered, thereby inhibiting a generation of a conductive failure in the semiconductor device.

It is preferable that a dimensional height of the resin spacer is higher than that of the first semiconductor chip.

Here, the first bumps may be provided in the first resin substrate and in the resin spacer, respectively, and the second bumps may be provided in the second resin substrate and in the resin spacer, respectively. Having such configuration, a stable coupling can be provided between the first resin substrate and the resin spacer and between the second resin substrate and the resin spacer.

The semiconductor device described above can be manufactured according to the following procedure.

(1) A method for manufacturing a semiconductor device, which is formed by depositing a second resin substrate on a first resin substrate on which a first semiconductor element is mounted, the second resin substrate being deposited on a side of the first resin substrate that the first the semiconductor element is mounted, and the second resin substrate on which a second semiconductor element is mounted, wherein a resin spacer is disposed between the first resin substrate and the second resin substrate, the resin spacer having a conductor extending through an interior thereof along a thickness direction, and then a thermo-compression bonding thereof are carried out to provide an electrically coupling between the first resin substrate and the second resin substrate via the conductor.

(2) The method for manufacturing the semiconductor device as set forth in the above (1), in which the resin spacer is disposed in the periphery of the first semiconductor element.

(3) The method for manufacturing the semiconductor device as set forth in the above (1) or (2), in which a resin substrate, serving as the resin spacer, is employed.

(4) The method for manufacturing the semiconductor device as set forth in the above (3), in which the resin substrate includes a space section that can house the first semiconductor element therein.

(5) The method for manufacturing the semiconductor device as set forth in any of the above (1) to (4), in which the first resin substrate is joined to the resin spacer through an adhesive film that exhibits an electro-conductivity.

(6) The method for manufacturing the semiconductor device as set forth in any of in any of the above (1) to (5), in which the second resin substrate is joined to the resin spacer through an adhesive film that exhibits an electro-conductivity.

(7) The method for manufacturing the semiconductor device as set forth in the above (6), in which the adhesive film contains a resin component and an conductive component.

(8) The method for manufacturing the semiconductor device as set forth in the above (7), in which the conductive component contains solder powder.

(9) The method for manufacturing the semiconductor device as set forth in the above (8), in which the adhesive film is capable of forming a conductor portion through an aggregation of the solder powder by heating thereof.

(10) The method for manufacturing the semiconductor device as set forth in the above (9), in which the solder powder is aggregated by a heating through the thermo-compression bonding.

(11) The method for manufacturing the semiconductor device as set forth in any of the above (1) to (10), in which the thermo-compression bonding is carried out by heating and pressurizing at 0.01 to 10 MPa and 150 to 250 degree C. for 10 to 600 seconds.

(12) The method for manufacturing the semiconductor device as set forth in any of the above (1) to (11), in which the thermo-compression bonding is conducted via a pin-laminate process.

(13) A method for manufacturing a semiconductor device, which is formed by depositing a second resin substrate on a first resin substrate on which a first semiconductor chip is mounted, the second resin substrate being deposited on a side of the first resin substrate that the first the semiconductor chip is mounted, and the second resin substrate on which a second semiconductor chip is mounted, wherein a resin spacer is disposed between the first resin substrate and the second resin substrate, the resin spacer having a conductor extending through an interior thereof along a thickness direction, and wherein the method comprises: disposing a metallic first bump between the first resin substrate and the resin spacer and disposing a metallic second bump between the second resin substrate and the resin spacer; and thermo-compression bonding the first resin substrate, the resin spacer and the second resin substrate.

(14) The method for manufacturing the semiconductor device as set forth in the above (13), in which the first bumps are provided on the first resin substrate and the resin spacer, respectively, and the second bumps are provided on the second resin substrate and the resin spacer, respectively.

(15) The method for manufacturing the semiconductor device as set forth in the above (13) or (14), in which, in the disposing the metallic first bump between the first resin substrate and the resin spacer and disposing the metallic second bump between the second resin substrate and the resin spacer, adhesion tapes having an adhesive resin layer is disposed between the first resin substrate and the resin spacer and between the second resin substrate and the resin spacer, and wherein, in the thermo-compression bonding the first resin substrate, the resin spacer and the second resin substrate, the first bump extends through the adhesion tape disposed between the first resin substrate and the resin spacer, and the second bump extends through the adhesion tape disposed between the second resin substrate and the resin spacer.

(16) The method for manufacturing the semiconductor device as set forth in the above (15), in which each of the adhesion tapes includes a chemical compound exhibiting a flux activity and having carboxylic group and/or phenolic hydroxyl group, a thermosetting resin and a thermoplastic resin.

(17) The method for manufacturing the semiconductor device as set forth in the above (16), in which the thermoplastic resin is a phenoxy resin.

(18) The method for manufacturing the semiconductor device as set forth in any of the above (15) to (17), in which the adhesion tape is that, when the adhesion tape is attached on a surface of an oxidization-processed copper sheet and a reduction-processing is carried out at 230 degree C. for one minute in an atmospheric air, a copper oxide-reduction rate of the copper sheet represented by the following formula (I) is equal to or higher than 65%:

copper oxide-reduction rate (%)=[1−(atomic concentration of oxygen (O) after reduction process)/ (atomic concentration of oxygen (O) after oxidizing process)]×100    (Formula 1).

BRIEF DESCRIPTION OF THE DRAWINGS

The above and other objects, advantages and features of the present invention will be more apparent from the following description of certain preferred embodiments taken in conjunction with the accompanying drawings.

FIG. 5 is a cross-sectional view for describing a configuration of the semiconductor device in second embodiment.

FIG. 34 contains diagrams, illustrating a two-dimensional geometry of resin substrate and a resin base material of a semiconductor device in an example.

BEST MODE FOR CARRYING OUT THE INVENTION

Preferable exemplary implementations according to the present invention will be described in reference to the annexed figures. In all figures, identical numeral is assigned to an element commonly appeared in the description of the present invention in reference to the figures, and the detailed description thereof will not be repeated.

First Embodiment

Figure 1:
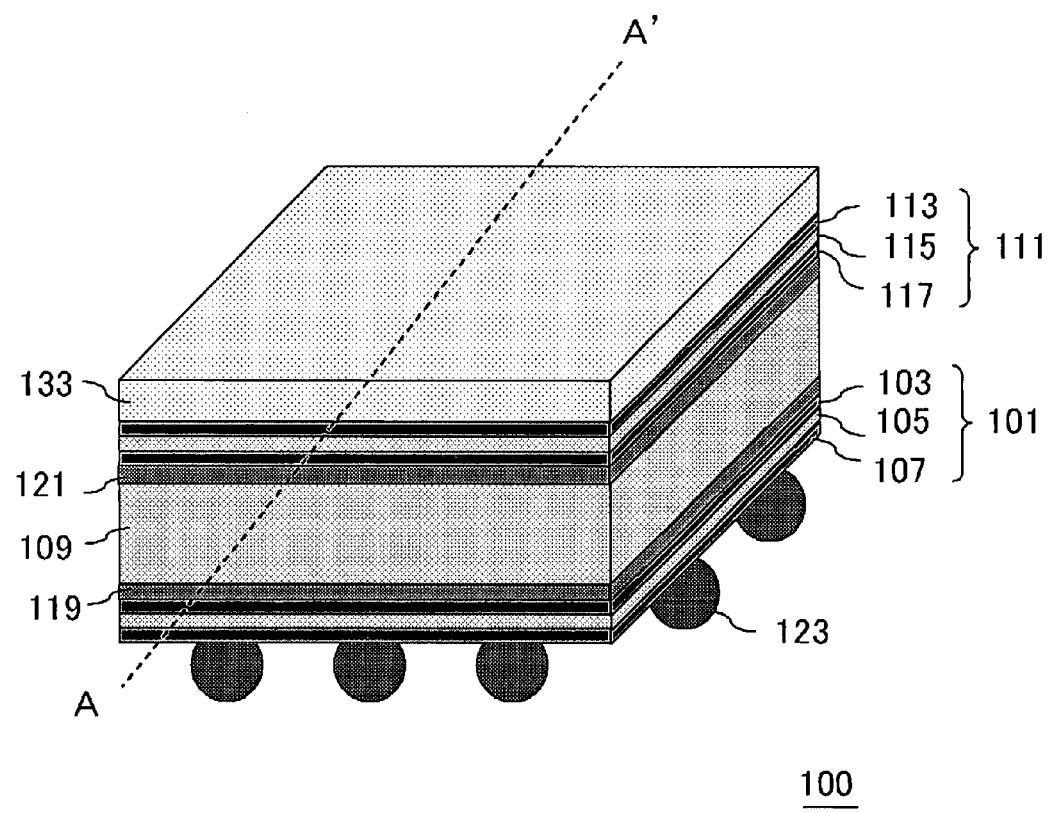
FIG. 1 is a perspective view, illustrating a configuration of a semiconductor device in first embodiment.
Figure 2:
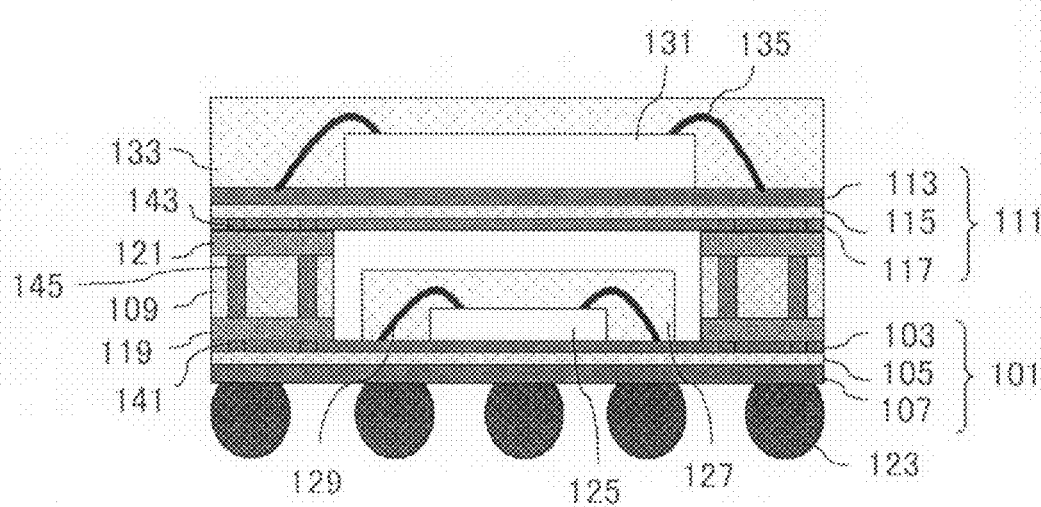
FIG. 2 is a cross-sectional view of FIG. 1 along line A-A'.

FIG. 1 is a perspective view, illustrating a configuration of a semiconductor device of the present embodiment. FIG. 2 is a cross-sectional view of FIG. 1 along line A-A'. In a semiconductor device 100 shown in FIG. 1 and FIG. 2, a first resin substrate 101, an adhesive layer 119, a resin spacer (resin base material 109), an adhesive layer 121 and a second resin substrate 111 are stacked in this sequence from underneath.

This semiconductor device 100 has a POP structure, and a first semiconductor chip 125 is mounted on a surface of the first resin substrate 101, and a second semiconductor chip 131 is mounted on a surface of the second resin substrate 111.

The first semiconductor chip 125 and the second semiconductor chip 131 are semiconductor chips, having certain elements such as transistor and the like formed on a device-forming surface of a semiconductor substrate such as silicon substrate and the like, respectively. The first semiconductor chip 125 may be configured to have a logic circuit, and the second semiconductor chip 131 may be configured to have a memory element.

The first semiconductor chip 125 is disposed in a space section, which is provided among the first resin substrate 101, the second resin substrate 111 and the resin base material 109 on the surface of the first resin substrate 101. A thickness of the resin base material 109 is larger than a thickness from the surface of the first resin substrate 101 to an upper surface (back surface) of the first semiconductor chip 125, and thus a thickness required for carrying the first semiconductor chip 125 between resin substrates is ensured by having the thickness of the resin base material 109.

The first resin substrate 101 is a resin substrate provided with a built-up 103 and a built-up 107 on a front surface and a back surface of a core 105, respectively. The first semiconductor chip 125 is mounted on the built-up 103, and an electrode (not shown) on the first semiconductor chip 125 is electrically connected to an electrode (not shown) on the built-up 103 via a wire 129. In addition, the first semiconductor chip 125 and the wire 129 are encapsulated with an encapsulating resin 127. A plurality of bump electrodes 123 functioning as external coupling terminals are joined to back surface side of the built-up 107.

The second resin substrate 111 is a resin substrate provided with a built-up 113 and a built-up 117 on a front surface and a back surface of a core 115, respectively. The second semiconductor chip 131 is mounted on the built-up 113, and an electrode (not shown) on the second semiconductor chip 131 is electrically connected to an electrode (not shown) on the built-up 113 via a wire 135. In addition, the second semiconductor chip 131 and the wire 135 are encapsulated with an encapsulating resin 133. In the semiconductor device 100, an encapsulating resin 133 covers the entire front surface of the second resin substrate 111.

In the semiconductor device 100, the first resin substrate 101 and the second resin substrate 111 have substantially rectangular two-dimensional geometries, and more specifically square or rectangle. In the following embodiments, exemplary implementations of employing the first resin substrate 101 and the second resin substrate 111 having square geometries will be described. In addition, two-dimensional geometries of the first resin substrate 101 and the second resin substrate 111 are substantially same.

In these resin substrates, materials of the core 105 and the core 115 are not particularly limited, but may be thermosetting resins such as for example, an epoxy resin, a cyanate resin and the like. In addition, in order to reduce a chip crack caused by a mismatching of coefficients of thermal expansion between these cores and the semiconductor chip and to inhibit a delamination of the semiconductor chip from the resin substrate, it is preferable to select a coefficient of thermal expansion of the resin substrate to be 10 ppm/degree C. or more and 30 ppm/degree C. or less.

The resin base material 109 is joined to the front surface of the first resin substrate 101 and the back surface of the second resin substrate 111 to electrically coupling the front surface of the first resin substrate 101 to the back surface of the second resin substrate 111. In addition, an adhesive layer 119 and an adhesive layer 121 are provided between the first resin substrate 101 and the resin base material 109 and between the resin base material 109 and the second resin substrate 111, respectively, and the first resin substrate 101 is electrically connected to the resin base material 109 through the adhesive layer 119 and the second resin substrate 111 is electrically connected to the resin base material 109 through the adhesive layer 121. In this configuration, the adhesive layer 119 and the adhesive layer 121 are, for example, adhesion tapes.

The resin base material 109 is disposed in the circumference of the first semiconductor chip 125 on the surface of the first resin substrate 101. In the present embodiment, the resin base material 109 is a framing member surrounding the circumference of the first semiconductor chip 125 on the surface of the first resin substrate 101. In addition, a cross-sectional geometry of the resin base material 109 is an annular rectangle, in which the center is hollowed out. The resin base material 109 may be a member formed by processing a resin substrate into a predetermined geometry by employing a processing method such as, for example, punching processing, hollowing processing and the like. In addition, it may alternatively be configured of having no junction in one resin base material 109.

A through-hole electrode 145 extending through the resin base material 109 is provided in the resin base material 109. The through-hole electrode 145 is, for example, an electrically conducting film covering an interior wall of the through hole extended through the resin base material 109. The electrically conducting film is, for example, a through-hole plated metallic layer. In addition to above, the through-hole electrode 145 is not limited to a member having a hollow structure such as a through-hole plating metallic layer, and alternatively, may be, for example, a solid electrode composed of a conductive material filled in the whole interior of the through hole extending through the resin base material 109.

A first electrode 141 coupled to the through-hole electrode 145 is provided on the front surface of the first resin substrate 101, and a second electrode 143 coupled to the through-hole electrode 145 is provided on the back surface of the second resin substrate 111.

A resin constituting the resin base material 109 may be, for example, an organic resin, and more specifically, may be a thermosetting resin such as epoxy resin and the like. In addition, the resin base material 109 is composed of a material that is similar to, for example, the first resin substrate 101 and the second resin substrate 111. More specifically, it is preferable that a material of resin base material 109 is selected to be the same as the material of the core 105 and the core 115, and in particular, to be a cyanate resin.

Having such configuration, creations of warpages in the first resin substrate 101 and the second resin substrate 111 by heat treatment processes carried out after the assembly operation in the manufacturing process can be more effectively inhibited. Thus, a connection failure created between the resin base material 109 and the resin substrate can be inhibited. Thus, an improved joint reliability between the first resin substrate 101 and the second resin substrate 111 can be achieved. In addition, the use of the cyanate resin provides the coefficients of thermal expansion of the respective resin substrates and the resin base material 109 more close to a coefficient of thermal expansion of the semiconductor chip, resulting in more considerably exhibiting these advantageous effects.

In addition, a local stress concentration on the semiconductor chip due to the warpage of the resin substrates can be reduced. Thus, a deterioration of the semiconductor chip is inhibited, thereby providing an improved production yield.

The adhesive layer 119 is provided with an electrically conducting region extending through the adhesive layer 119 formed in a region where the through-hole electrode 145 faces to the first electrode 141. The first electrode 141 is electrically connected to the through-hole electrode 145 through the adhesive layer 119. In addition, the adhesive layer 121 is provided with an electrically conducting region extending through the adhesive layer 121 formed in a region where the through-hole electrode 145 faces to the second electrode 143. The through-hole electrode 145 is electrically connected to the second electrode 143 through the adhesive layer 121.

The adhesive layer 119 and the adhesive layer 121 may be formed of materials, which would provide an ensured conduction path along the stacking direction in region where the first electrode 141 and the second electrode 143 are faced, and would provide an insulation between the resin base material 109 and the resin substrate in other region, and typically may be formed of, for example, an anisotropic conductive film (ACF). In addition, typical adhesives layer for these materials may include an adhesive tape containing conductive particles, formed by coating a polymer core material with a metallic thin film, dispersed in a resin layer, and a self alignment type-adhesive tape containing solder powder and a curing agent exhibiting the flux activity in a resin.

Since the conduction path extending from the adhesive layer 119 through the through-hole electrode 145 to the adhesive layer 121 is provided in the semiconductor device 100, a conductive member (not shown) provided in the first semiconductor chip 125 is electrically connected to a conductive member (not shown) provided in the second semiconductor chip 131 via the wire 129, the first resin substrate 101, the adhesive layer 119, the through-hole electrode 145, the adhesive layer 121, the second resin substrate 111 and the wire 135.

Next, a method for manufacturing the semiconductor device 100 will be described. First of all, the first semiconductor chip 125 and the second semiconductor chip 131 are prepared, and these chips are mounted on the first resin substrate 101 and the second resin substrate 111, respectively, and then a wire bonding and a encapsulating with a resin are conducted.

Further, a resin is processed into a predetermined geometry to manufacture the resin base material 109. For example, a resin substrate having a predetermined thickness is punched out into a rectangular shape having a predetermined dimension, and then further punched out to remove a rectangular center portion, thereby obtaining the annular resin base material 109. Alternatively, the resin base material 109 may be processed into a predetermined geometry by employing other processing methods such as a cutout processing and the like. A through hole is formed in a predetermined region of the obtained resin base material 109. Typical method for forming the through hole includes, for example, a laser processing, a drilling and the like. Alternatively, a through hole may be formed by employing an etching technology. Then, a metallic layer covering the interior wall of the through hole is formed via a plating process, for example to obtain the hollow-shaped through-hole electrode 145.

Then, the first resin substrate 101, the adhesive layer 119, the resin base material 109, the adhesive layer 121 and the second resin substrate 111 are stacked, and then the stacked layers are heated at a predetermined temperature to provide an adhesion between the resin substrate and the resin base material 109. At this time, the first resin substrate 101 and the second resin substrate 111 may be compressively bonded with a predetermined pressure.

Alternatively, bump electrodes 123 are joined onto a back surface side of the first resin substrate 101 of the obtained multiple-layered material. As described above, the semiconductor device 100 shown in FIG. 1 and FIG. 2 is obtained.

Next, advantageous effects for the products of the present embodiment will be described. In the present embodiment, the opposite electrodes (the first electrode 141 and the second electrode 143) are electrically connected via the through-hole electrode 145 in the resin base material 109. The resin substrates are mutually coupled through the resin base material 109, so that more improved joint reliability between the resin substrates can be achieved as compared with the conventional configuration that involves coupling through a bump electrode, even if a spacing between the resin substrates is larger. This is achieved by the following reasons.

In a case of mutually coupling resin substrates via a bump electrode, a warpage is easy to be generated in the resin substrate during the manufacturing process, as described above. Further, a generation of a warpage causes a stress concentration on a juncture region of the bump electrode, resulting in an easy deterioration in the juncture of the bump electrode. Thus, there a room for being improved in the joint reliability between the resin substrates.

On the contrary, the configuration of the present embodiment has no bump electrode joined to the electrode on the surfaces of each of the opposed resin substrates. Thus, a deterioration in the joint reliability caused when the bump electrode is provided can be reduced.

In addition, in the present embodiment, the multiple-layered structure including the first resin substrate 101, the resin base material 109 and the second resin substrate 111 is provided in the circumference of the first resin substrate 101. While thinner semiconductor chip and thinner resin substrate promotes more considerable warpage created in the resin substrate, the configuration of the present embodiment can provide thicker whole resin layers composed from the first resin substrate 101 to the second resin substrate 111, when thinner individual resin substrates are employed. Thus, an increased stiffness of the multiple-layered structure can be achieved, thereby effectively inhibiting a generation of a warpage in the first resin substrate 101 and the second resin substrate 111. When thinner the resin substrates are employed, a warpage in the resin substrate can be inhibited by providing the resin base material 109. In addition to above, such advantageous effect is more considerably exhibited when the first resin substrate 101, the resin base material 109 and the second resin substrate 111 are composed of the same type of material.

In addition, since the substrate and the resin base material 109 are composed of resins in the semiconductor device 100, the device is configured to exhibit a reduced difference in the coefficient of thermal expansion between the resin substrate and the resin base material 109. Having such configuration, a warpage in the resin substrate can be effectively inhibited in the heat treatment operations conducted after the assembly operations in the manufacturing process. Thus, a conductive failure between the resin substrate and the resin base material 109 created by the warpage of the resin substrate can be inhibited. In addition, a local stress concentration on the semiconductor chip on the resin substrate can be reduced by reducing the warping of the resin substrate. Thus, according to the present embodiment, an improved joint reliability between the resin substrates can be achieved, and an improved production yield can also be achieved.

In addition, in the present embodiment, since the through-hole electrode 145 is provided in the resin base material 109, and the adhesions of the resin base material 109 with the first resin substrate 101 and with the second resin substrate 111 are provided by the adhesive layer 119 and the adhesive layer 121, respectively, a path for providing an electrical conduction between the resin substrates along the stacking direction can be formed with a simple and easy manner.

Further, since the frame-shaped resin base material 109 surrounding the whole circumference of the first resin substrate 101 is provided in the semiconductor device 100, the resin base material 109 can more stably support the resin substrate, as compared with the configuration, in which the resin base material is provided in a portion of the circumference of the first resin substrate 101. Thus, the warpage in the first resin substrate 101 and the second resin substrate 111 can be inhibited.

In addition, since the resin base material 109 is provided along the circumference of the first resin substrate 101 in the semiconductor device 100, the peripheral region in the chip-mounting surface of the first resin substrate 101 having no first semiconductor chip 125 mounted thereon can be effectively utilized for providing an electrical coupling between substrates.

In addition, since the suitable clearance between the resin substrates can easily be selected by adjusting the thickness of the resin base material 109 in the present embodiment, a space for wire-bonding the first semiconductor chip 125 can be provide between the resin substrates with a certainty.

While the exemplary implementations of the resin base material 109 and the second resin substrate 111 having the substantially same rectangular two-dimensional geometries and the resin base material 109 having the continuous cross-sectional geometry having a hollowed out-rectangular inner portion have been described in the present embodiment, the two-dimensional geometry and the arrangement of the resin base material 109 are not limited thereto in the present and the following embodiments.

FIG. 6 to FIG. 11, are cross-sectional views, illustrating alternative two-dimensional geometries and arrangements of the resin base materials 109. In these diagrams, the built-up 103, the resin base material 109 on the built-up 103 and the first semiconductor chip 125 are only illustrated, and other members are not shown.

Figure 6:
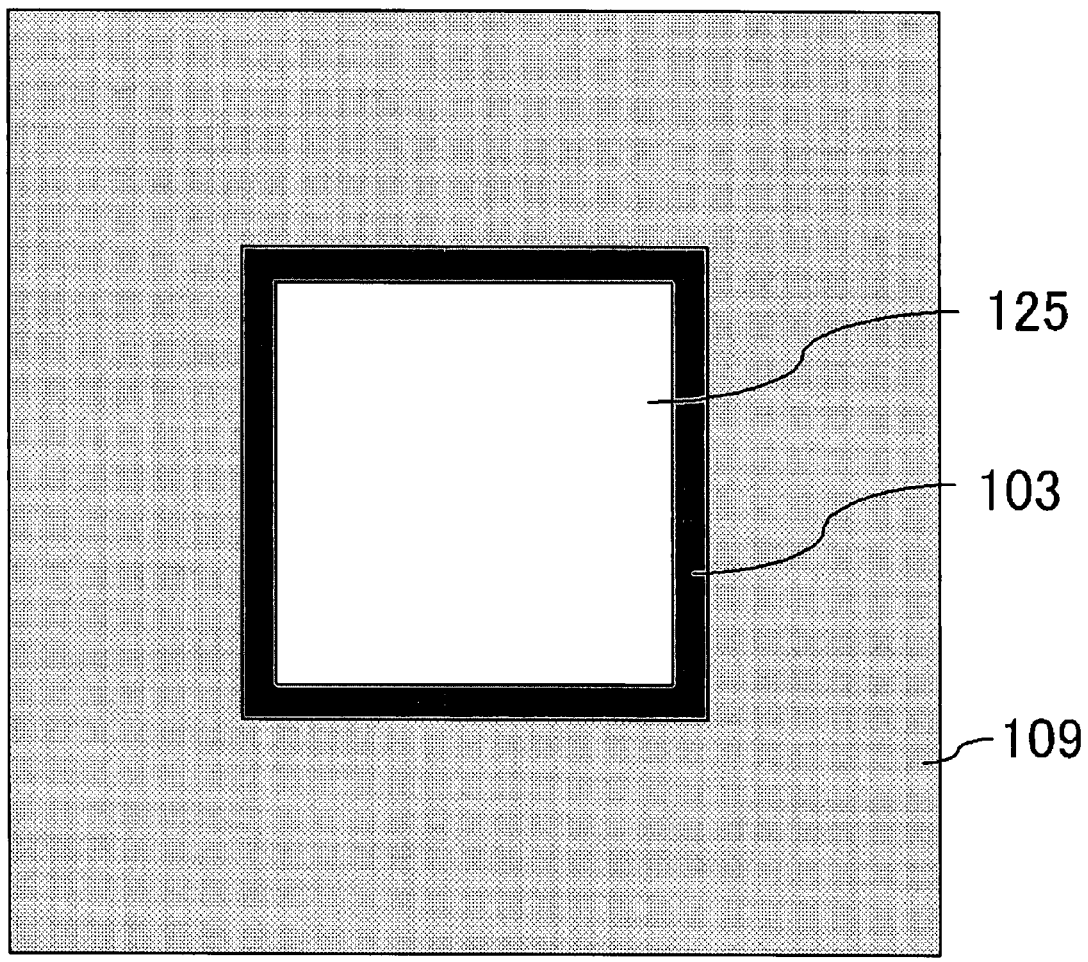
FIG. 6 is a plan view, illustrating a two-dimensional geometry of a resin base material of the semiconductor device in first embodiment.

FIG. 6 corresponds to the configuration of the present embodiment. In FIG. 6, the resin base material 109 having an annular cross section is provided along the circumference of the built-up 103 of the rectangular first resin substrate.

In addition, the two-dimensional geometry of the resin base material 109 is a rectangular, and the resin base material 109 may be provided along sides of the first resin substrate 101. For example, FIG. 7 and FIG. 8 illustrate exemplary implementations, where the resin base material 109 is provided along two sides of the first resin substrate 101.

Figure 7:
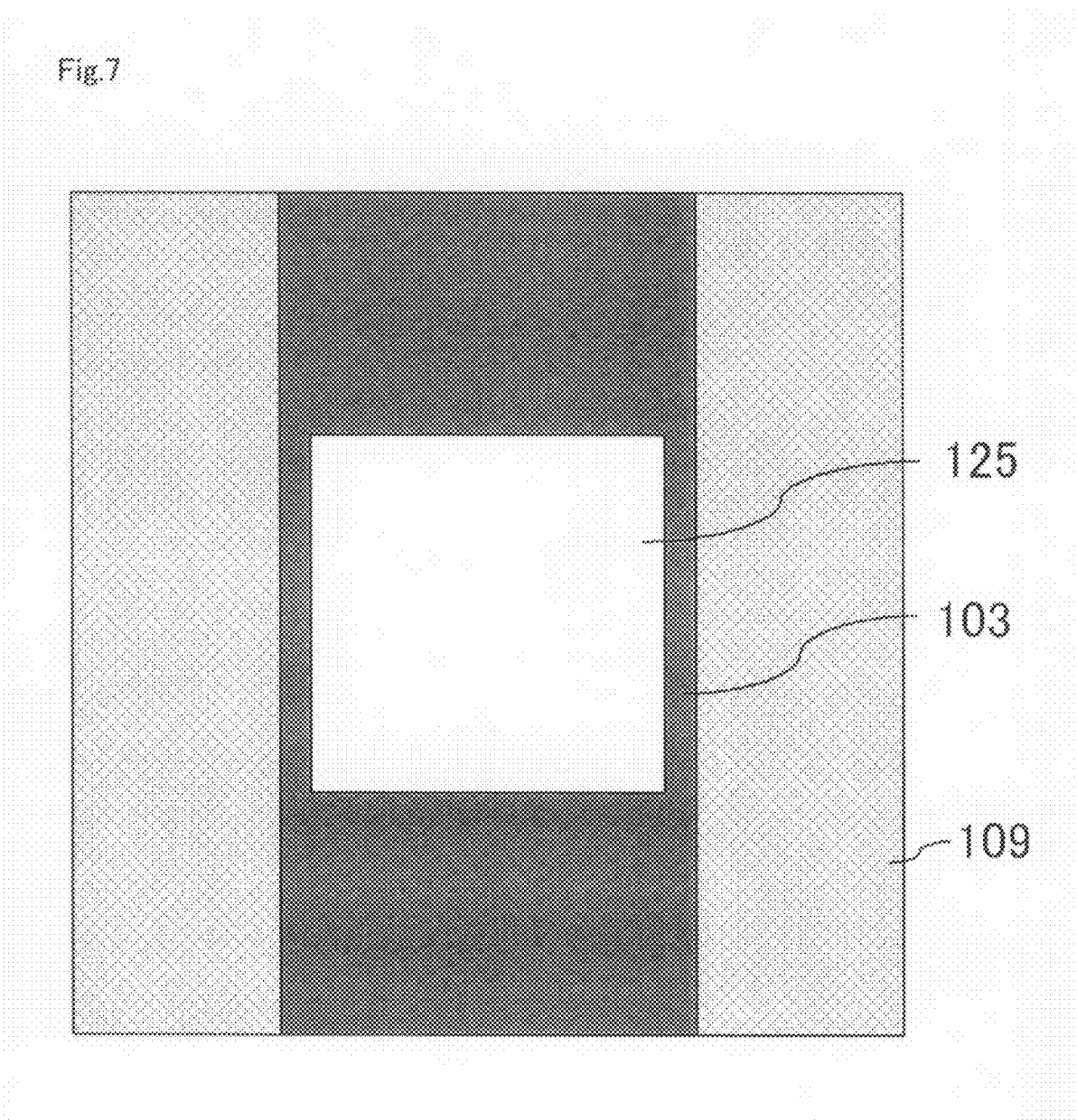
FIG. 7 is a plan view, illustrating a two-dimensional geometry of a resin base material of the semiconductor device in first embodiment.

In FIG. 7, the strip-shaped resin base materials 109 are disposed in parallel along the opposed two sides of the built-up 103 of rectangular the first resin substrate 101. The first semiconductor chip 125 is disposed in a region sandwiched between two resin base materials 109.

Figure 8:
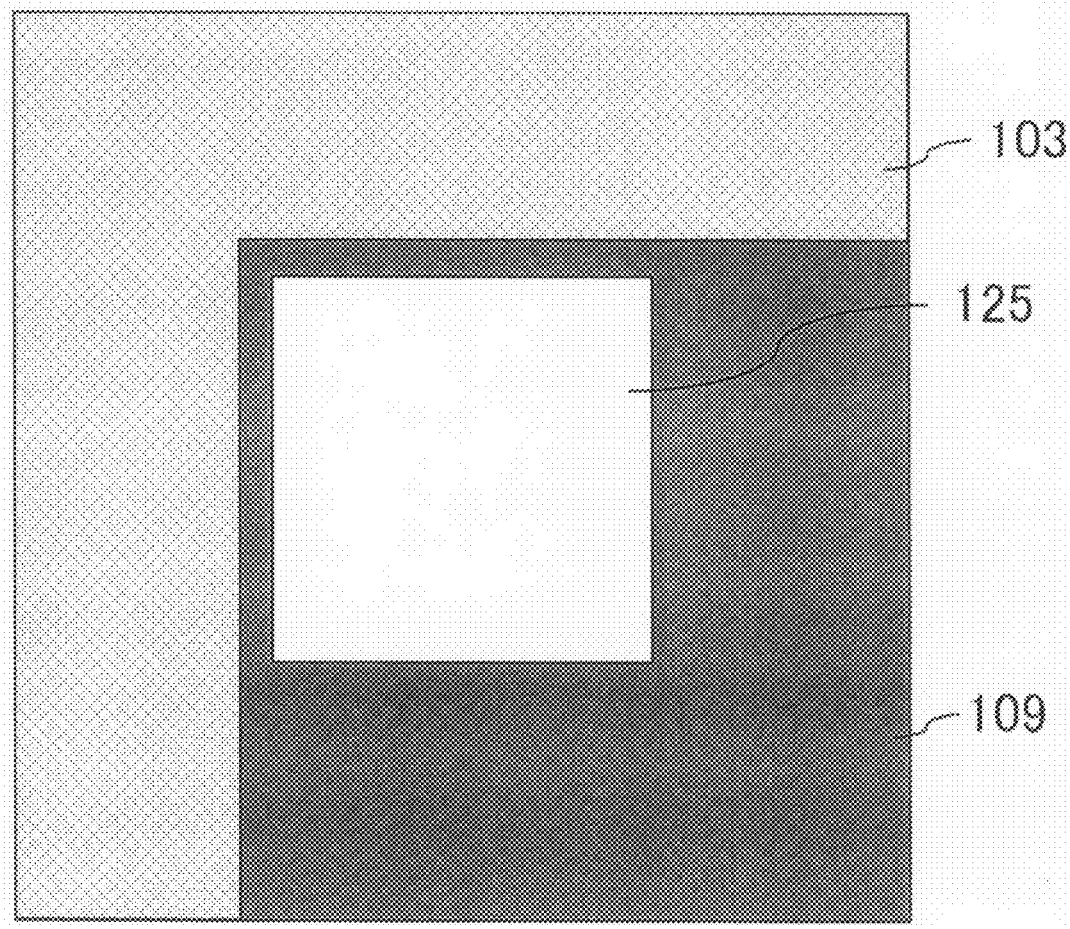
FIG. 8 is a plan view, illustrating a two-dimensional geometry of a resin base material of the semiconductor device in first embodiment.

On the contrary, in FIG. 8, the strip-shaped resin base materials 109 are arranged along the adjacent two sides of the built-up 103 of the rectangular first resin substrate 101 to be orthogonal to each another.

Figure 9:
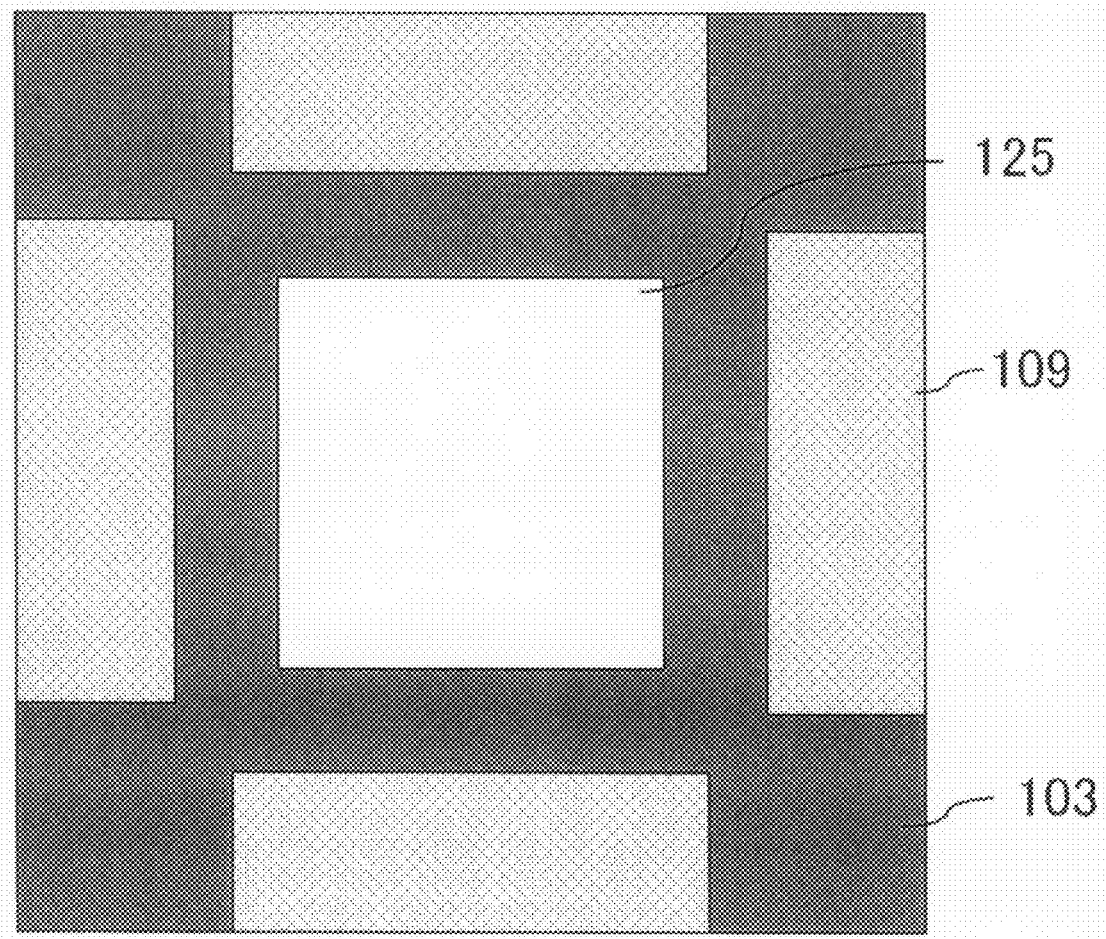
FIG. 9 is a plan view, illustrating a two-dimensional geometry of a resin base material of the semiconductor device in first embodiment.

FIG. 9 illustrates an example of the resin base materials 109 disposed along four sides of the first resin substrate 101. In FIG. 9, the strip-shaped resin base materials 109 are disposed are arranged along all four sides of the built-up 103 of the rectangular first resin substrate. The first semiconductor chip 125 is disposed in a region surrounded by these resin base materials 109.

Figure 10:
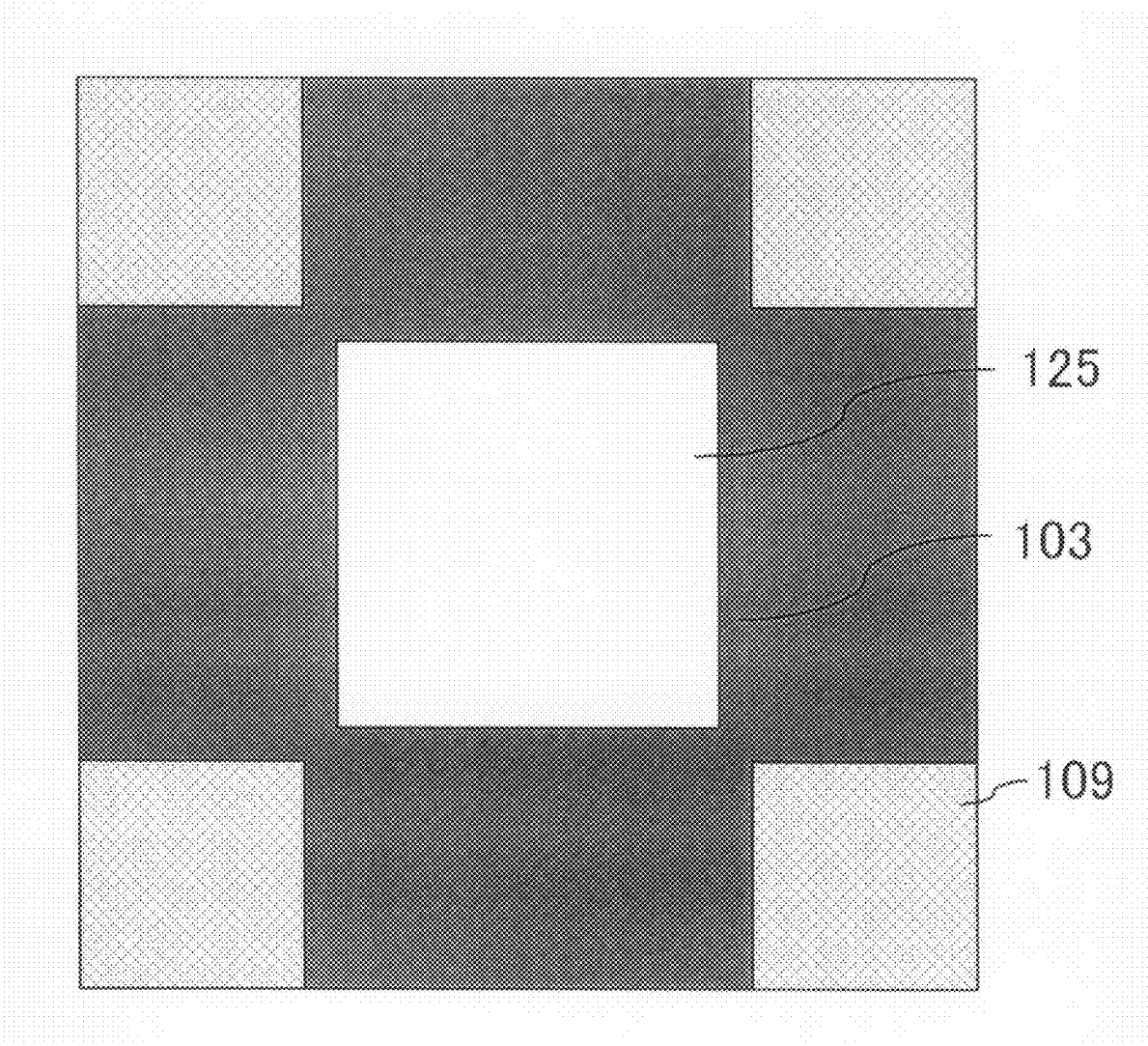
FIG. 10 is a plan view, illustrating a two-dimensional geometry of a resin base material of the semiconductor device in first embodiment.

FIG. 10 illustrates an example of the resin base materials 109 arranged in the four corners of the first resin substrate 101. In FIG. 10, the square pillar-shaped resin base materials 109 having a square cross section are disposed in the four corners of the built-up 103 of the rectangular first resin substrate, respectively. While the resin base materials 109 are disposed in all four corners in FIG. 10, all corners needed not to be provided with the resin base materials 109, and, for example, diagonally disposed two corners may be provided with the resin base materials 109, and such two resin base materials 109 may face across the first semiconductor chip 125.

Figure 11:
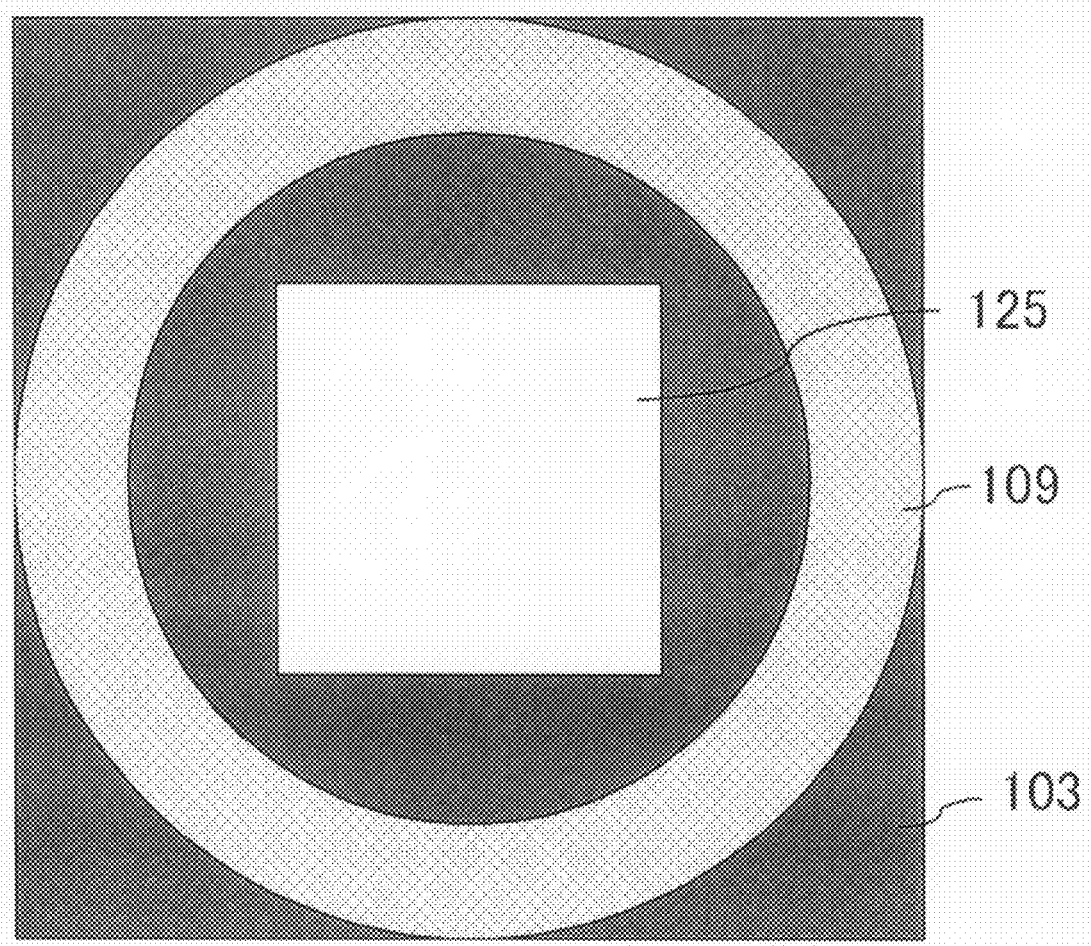
FIG. 11 is a plan view, illustrating a two-dimensional geometry of a resin base material of the semiconductor device in first embodiment.

In addition, FIG. 11 illustrates an example of the resin base material 109 having an annular two-dimensional geometry. In FIG. 11, the annular-shaped resin base material 109 is provided on the built-up 103 of the rectangular first resin substrate, and the inside of an annulus of the resin base material 109 is provided with the first semiconductor chip 125 disposed therein.

In the following embodiments, differences from the first embodiment will be mainly described.

Second Embodiment

While the configuration having the semiconductor chip wire-bonded onto the resin substrate has been illustrated in relation to the semiconductor device described in first embodiment, the semiconductor chip may be flip-connected to the resin substrate via the bump electrode. The present embodiment will describe such configuration.

Figure 3:
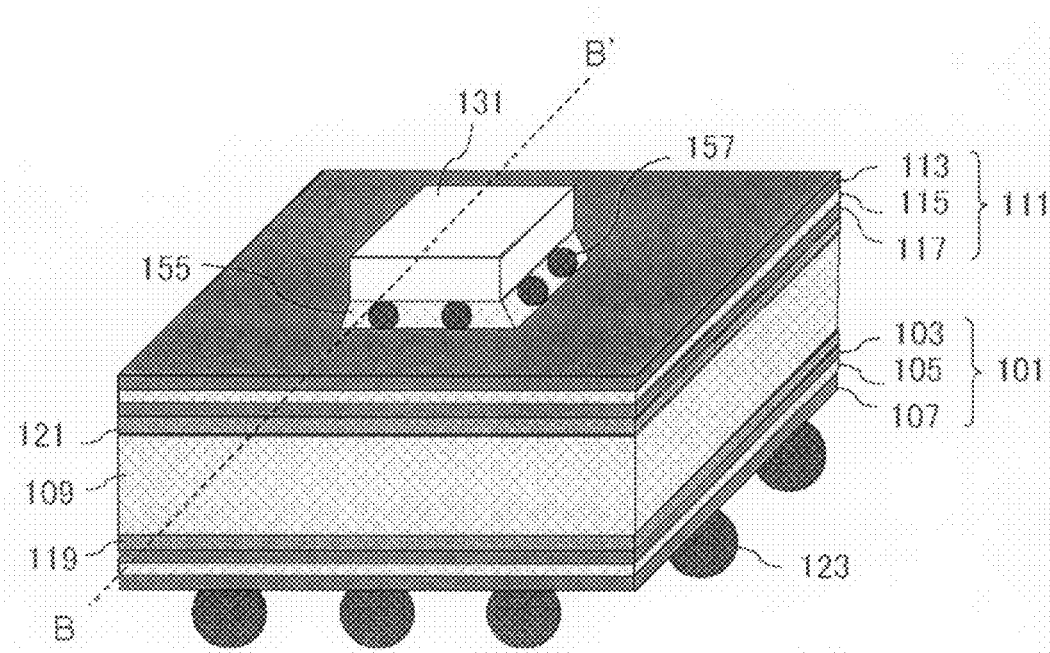
FIG. 3 is a perspective view, illustrating a configuration of a semiconductor device in second embodiment.
Figure 4:
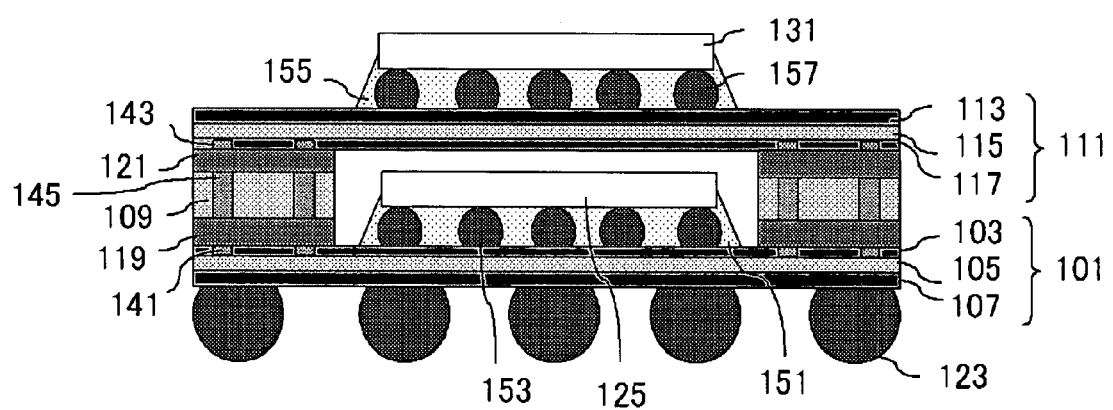
FIG. 4 is a cross-sectional view of FIG. 3 along line B-B'.

FIG. 3 is a perspective view, illustrating a configuration of a semiconductor device in the present embodiment. FIG. 4 is a cross-sectional view along line B-B' of FIG. 3. The fundamental configurations of semiconductor devices 110 shown in FIG. 3 and FIG. 4 are similar to that of the semiconductor device 100 (FIG. 1, FIG. 2), except that the method of mounting the semiconductor chip onto the resin substrate is different therefrom.

In the semiconductor device 110, an electrode (not shown) provided on the element mounting surface of the first semiconductor chip 125 is joined to the electrode (not shown) provided on the built-up 103 of the first resin substrate 101 via bump electrodes 153, and these elements are electrically connected.

In addition, an electrode (not shown) provided on the element mounting surface of the second semiconductor chip 131 is joined to the electrode (not shown) provided on the built-up 113 of the second resin substrate 111 via bump electrodes 157, and these elements are electrically connected.

The space between the first semiconductor chip 125 and the first resin substrate 101 are filled with an underfill resin 151. In addition, spaces between the second semiconductor chip 131 and the second resin substrate 111 are filled with an underfill resin 155.

Since the resin base material 109 is also provided between the first resin substrate 101 and the second resin substrate 111 in the present embodiment, similar advantageous effects as obtained in first embodiment are also obtained.

In addition, since the semiconductor chip is flip-connected to the resin substrate via the bump electrode in the present embodiment, the device is configured to easily cause a stress concentration on a juncture in the semiconductor chip with the bump electrode. In case of such configuration, an use of the resin base material 109 for providing a coupling between the resin substrates preferably inhibits a warpage in the resin substrates, so that a deterioration of the semiconductor chip can be inhibited and an improved production yield can also be achieved.

Further description will be made as follows, focusing on such aspects in reference to FIG. 5 (*a*) and FIG. 5 (*b*).

FIG. 5 (*a*) is a cross-sectional view, illustrating a configuration of a semiconductor device, in which substrates to which the semiconductor chips are flip-connected are mutually coupled via bump electrodes having larger dimensions. In FIG. 5 (*a*), first electrodes 241 provided on the surface of the first substrate 201 are coupled to second electrodes 243 provided on the surface of the second substrate 211 via bump electrodes 245.

A first semiconductor chip 225 is provided on the chip-mounting surface of the first substrate 201, and electrodes (not shown) provided on the element-mounting surface of the first semiconductor chip 225 are coupled to electrodes (not shown) of the first substrate 201 via bump electrodes 253. On the chip-mounting surface of the first substrate 201, a plurality of bump electrodes 245 are disposed in the periphery of the region where the first semiconductor chip 225 is disposed.

A second semiconductor chip 231 is provided over the chip-mounting surface of the second substrate 211, and an electrode (not shown) provided on element mounting surface of the second semiconductor chip 231 is coupled to an electrode (not shown) of the second substrate 211 through bump electrodes 257.

Spaces between the first semiconductor chip 225 and the resin substrate 201 are filled with an underfill resin 251. In addition, spaces between the second semiconductor chip 231 and the second substrate 211 are filled with an underfill resin 255.

In addition, FIG. 5 (*b*) corresponds to the cross-sectional configuration of the semiconductor device 110 of the present embodiment.

Here, in FIG. 5 (*a*), the larger bump electrodes 245 achieve a coupling between the first substrate 201 and the second substrate 211. Since a contact area between the bump electrodes and the substrate is relatively smaller in this case, a warpage generated in the first substrate 201 or in the second substrate 211 in heating operations after the assembly easily causes a stress concentration in the juncture region between the bump electrode 245 and the first electrode 241 in the first substrate 201. In addition, in the second substrate 211, a stress concentration is easily generated in the juncture region between the bump electrodes 245 and the second electrode 243. Further, such stress relatively easily causes a coupling failure between the bump electrodes 245 and the first electrode 241 or the second electrode 243.

Further, since the first semiconductor chip 225 and the second semiconductor chip 231 are coupled to the resin substrates via the bump electrodes in FIG. 5 (*a*), a stress concentration is easily caused in the juncture region between the electrodes of the semiconductor chips and the bump electrodes. Since the electrodes joined to the bump electrode are provided in the device-forming surface in the first semiconductor chip 225 and the second semiconductor chip 231, there is the concern that a stress concentration on the electrodes due to a warpage of the resin substrate causes a deterioration in these electrodes, of course, and further in other elements on the device-forming surface except these electrodes.

On the contrary, since no bump electrode that causes a connection failure is employed for providing a coupling between resin substrates in FIG. 5 (*b*), an improved joint reliability can be achieved. In addition, further improved joint reliability between the electrodes can be achieved by providing the resin base material 109 to reduce a warpage of the resin substrate. Further, a reduced warpage of the resin substrate achieves an improved joint reliability between the semiconductor chip and the resin substrate, when the semiconductor chip is flip-bonded to the resin substrate.

Third Embodiment

Figure 12:
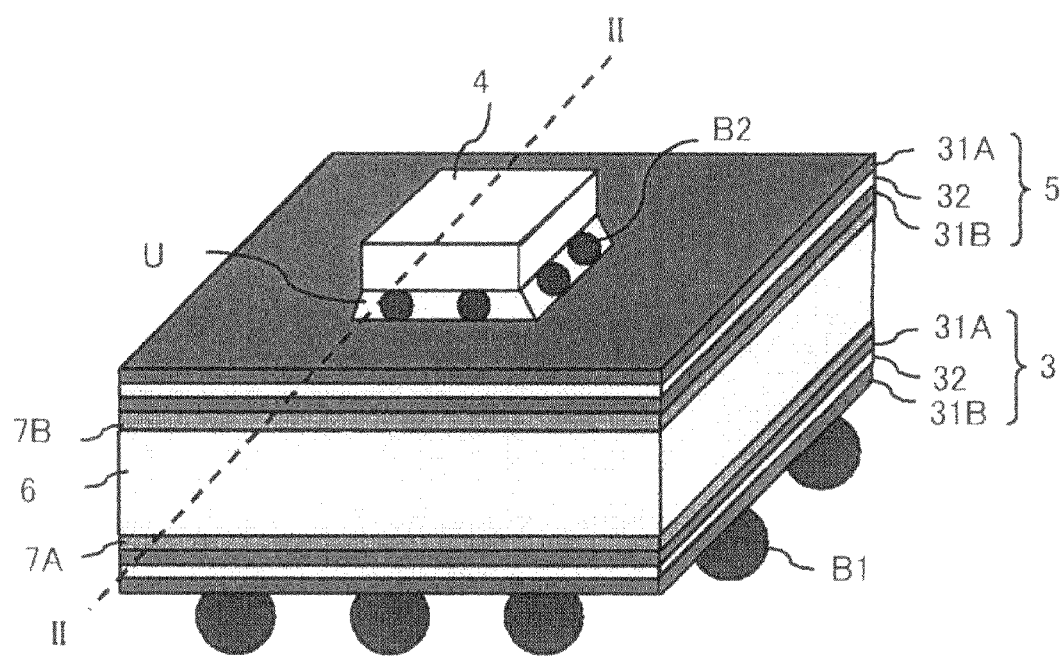
FIG. 12 is a perspective view, illustrating a semiconductor device according to third embodiment.
Figure 13:
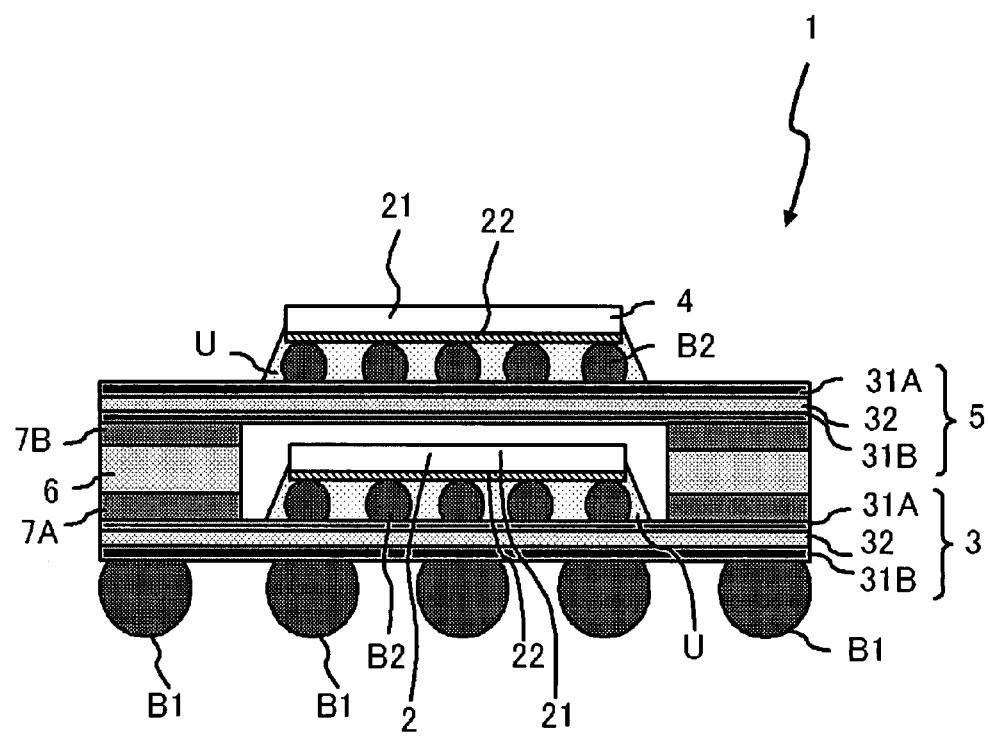
FIG. 13 is a cross-sectional view of FIG. 12 along line II-II.

An embodiment of the present invention will be described as follows, on the basis of the annexed figures. First of all, an outline of a semiconductor device 1 according to the present embodiment will be described in reference to FIG. 12 to FIG. 17. The semiconductor device 1 includes, as shown in FIG. 12 and FIG. 13, a first resin substrate 3 on which a first semiconductor chip 2 is mounted, a second resin substrate 5 on which a second semiconductor chip 4 is mounted, and a resin spacer 6, which is in contact with a front surface of the first resin substrate 3 and a back surface of the second resin substrate 5, and provides an electrical juncture between the first resin substrate 3 and the second resin substrate 5. FIG. 13 is a cross-sectional view along II-II direction of FIG. 12. The resin spacer 6 is disposed in a circumference of the first semiconductor chip 2 on the front surface of the first resin substrate 3, and, on the front surface of the first resin substrate 3, the first semiconductor chip 2 is disposed in a space section provided among the first resin substrate 3, the second resin substrate 5 and the resin spacer 6. Further, a first adhesive member 7A having a first electric conductor 72A disposed in a first resin layer 71A is provided between the first resin substrate 3 and the resin spacer 6 (see FIG. 17). Further, a second adhesive member 7B having a second electric conductor 72B disposed in a second resin layer 71B is provided between the resin spacer 6 and the second resin substrate 5 (see FIG. 17). Then, the first resin substrate 3 is electrically connected to the resin spacer 6, through the first electric conductor 72A in the first adhesive member 7A, and the second resin substrate 5 is electrically connected to the resin spacer 6 through the second electric conductor 72B in the second adhesive member 7B.

Figure 14:
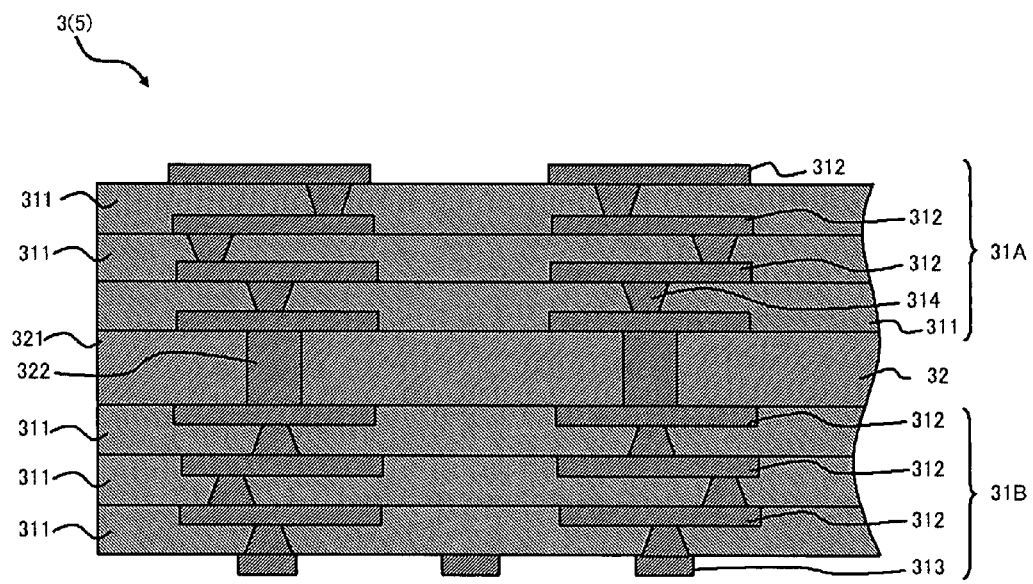
FIG. 14 is a cross-sectional view of a first resin substrate.
Figure 15:
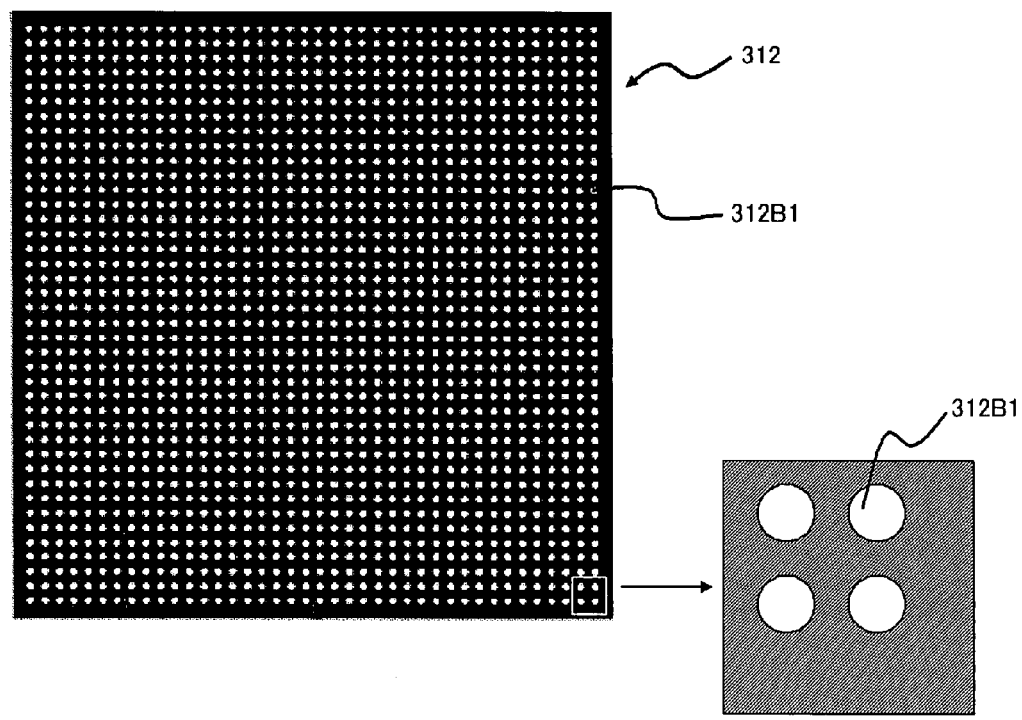
FIG. 15 is a plan view, illustrating a conductor interconnect layer.

Further, as shown in FIG. 14 and FIG. 15, the first resin substrate 3 includes buildup layers 31A and 31B composed of insulating layers 311 containing a resin and conductor interconnect layers 312, both of which are alternately stacked, where the respective conductor interconnect layers 312 are mutually coupled through the conductor layers 314 formed in via holes of the insulating layers 311. Further, the second resin substrate 5 also includes buildup layers 31A and 31B composed of insulating layers 311 containing a resin and conductor interconnect layers 312, both of which are alternately stacked, where the respective conductor interconnect layers 312 are mutually coupled through the conductor layers 314 formed in via holes of the insulating layers 311. Among the insulating layers 311 in the buildup layers 31A and 31B of at least one of the first resin substrate 3 and the second resin substrate 5, wherein at least one insulating layer 311, an average coefficient of thermal expansion along a substrate inplane direction for temperature range from 25 degree C. to a glass transition point thereof is equal to or lower than 30 ppm/degree C., and an average coefficient of thermal expansion along a substrate thickness direction for temperature range of from 25 degree C. to a glass transition point thereof is equal to or lower than 30 ppm/degree C.

The configuration of the semiconductor device 1 will be described in detail as follows.

[First Resin Substrate]

First of all, the first resin substrate 3 will be described. The first resin substrate 3 is a member that the first semiconductor chip 2 is mounted on the surface thereof.

This first resin substrate 3 has a surface of substantially rectangular geometry. As shown in FIG. 14, the first resin substrate 3 has a core layer 32 and a pair of buildup layers 31A and 31B, which are opposed across a core layer 32. The buildup layer 31A is disposed in the side of the front surface of the core layer 32, and has a configuration including insulating layers 311 containing a resin and conductor interconnect layers 312, which are alternately stacked. In the present embodiment, the buildup layer 31A is composed of a plurality of (for example, three) insulating layers 311 and a plurality of (for example, four) conductor interconnect layers 312, which are alternately stacked.

The insulating layer 311 is not a prepreg of carbon fiber cloth, glass fiber cloth or aligned fibers along a direction, which are immersed with various types of resins, but is composed of only a resin composition. More specifically, the insulating layer 311 is not reinforced with fibers such as carbon fiber, glass fiber or the like. Here, the resin constituting the insulating layer 311 preferably contains a thermosetting resin such as, for example, epoxy resins, bismaleimide triazine (BT) resin, cyanate resins. Among these resins, it is preferable to employ a cyanate resin. Typical cyanate resins include novolac cyanate resin, bisphenol-A type cyanate resin, bisphenol-E type cyanate resin, tetramethyl bisphenol-F type cyanate resin and the like. Among these, it is preferable to employ a novolac type cyanate resin. Novolac cyanate resins available here include resins having the following chemical formula. In formula, "n" is a positive integer number.

[FORMULA 1]

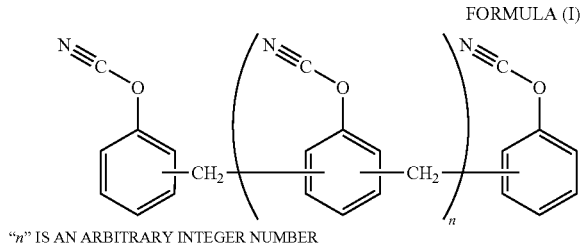

FORMULA (I)

"n" IS AN ARBITRARY INTEGER NUMBER

Number of repeating unit "n" in a novolac cyanate resin presented by the aforementioned formula (I) is not particularly limited, but 1 to 10 is preferable, and 2 to 7 is particularly preferable. Repeating unit number "n" under the aforementioned lower limit provides a tendency of easily crystallizing of novolac cyanate resin, which may lead to relatively reducing a solubility for a general-purpose solvent, resulting in causing a difficulty in handling. On the other hand, repeating unit number "n" over the aforementioned upper limit provides an excessively higher cross linking density, which may lead to a decreased water resistance, a fragility of a cured material or the like.

Such novolac cyanate resins may be obtained via a reaction of, for example, a novolac phenol and a compound such as cyanogen chloride, cyanogen bromide and the like. Further, a weight-average molecular weight of a novolac cyanate resin is preferably, for example, within a range of from 500 to 4,500. Further, it is preferable to be within a range of from 600 to 3,000. A weight-average molecular weight of less than 500 may lead to a reduced mechanical strength. Further, a weight-average molecular weight of larger than 4,500 may lead to faster cure rate of the resin composition, resulting in a reduced shelf life.

Further, a prepolymer of a cyanate resin may be employed for the above-described cyanate resin. A cyanate resin or a prepolymer may be employed alone, or a combination of a cyanate resin and a prepolymer may be employed. Here, a "prepolymer" typically means a compound obtained by, for example, trimerizing a monomer of a cyanate resin via a thermal reaction. Available prepolymer is not particularly limited, but, for example, a prepolymer containing trimer at a ratio of 20 to 50% wt. may be employed. The trimerization ratio can be obtained by employing, for example, an infrared spectrophotometer.

Further, an epoxy resin, a phenoxy resin or the like may be added to a cyanate resin. Preferable epoxy resin includes one having a biphenyl alkylene backbone. Further, an inorganic filler may be added to a cyanate resin.

In the present embodiment, the respective insulating layers 311 are composed of similar materials, and an average coefficient of thermal expansion of each of the insulating layers 311 along an inplane direction for temperature range of from 25 degree C. to a glass transition point thereof is equal to or lower than 30 ppm/degree C., and an average coefficient of thermal expansion of each of the insulating layers 311 along a substrate thickness direction is equal to or lower than 30 ppm/degree C. Here, an average coefficient of thermal expansion of the insulating layer 311 along a substrate inplane direction for temperature range of from 25 degree C. to a glass transition point thereof is preferably equal to or lower than 20 ppm/degree C., and an average coefficient of thermal expansion of the insulating layer 311 along a substrate thickness direction is preferably equal to or lower than 20 ppm/degree C. In addition, an average coefficient of thermal expansion of the insulating layer 311 along a substrate inplane direction for temperature range of from 25 degree C. to a glass transition point thereof is preferably equal to or higher than 3 ppm/degree C., and an average coefficient of thermal expansion of the insulating layer 311 along a substrate thickness direction is preferably equal to or higher than 3 ppm/degree C. In the present embodiment, an average coefficient of thermal expansion along a substrate inplane direction of each the insulating layer 311 is substantially equal, and an average coefficient of thermal expansion along a substrate thickness direction of each the insulating layer 311 is substantially equal. In addition to above, an average coefficient of thermal expansion of the insulating layer 311 can be measured by the following manner. A sample specimen of 5 mm-square is cut out from the insulating layer 311, and while a sample specimen is heated to elevate the temperature from a room temperature (25 degree C.) at an elevating rate of 5 degree C./minute employing a thermal mechanical analyzer (TMA) (commercially available from TA Instrument), quantities of deformations of the sample specimen along a thickness direction and along an inplane direction are measured, and then coefficients of thermal expansion along the thickness direction and along the surface direction are calculated. Then, coefficient of thermal expansions along the thickness direction and along the surface direction for temperature range of from 25 degree C. to a glass transition point thereof are calculated.

In addition, the insulating layer 311 preferably has a higher glass transition point. For example, the glass transition point of the insulating layer 311 is preferably equal to or higher than 120 degree C., and further is preferably equal to or higher than 150 degree C. The glass transition point (Tg) of the insulating layer 311 is measured in conformity with ISO-11359-2. A sample specimen of 5 mm-square is cut out from the insulating layer 311, and a probe of a TMA apparatus (commercially available from TA Instrument) is put on the sample specimen, and a quantity of a deformation of the sample specimen along a thickness direction is measured while the sample specimen is heated to elevate temperature from a room temperature (25 degree C.) at an elevating rate of 5 degree C./minute. Then, a tangent line to a curve representing a relationship of a change in the thickness of the sample specimen over the temperature is obtained around the glass transition point, and then a glass transition point is calculated from an intersection of this tangent.

A via hole is formed in such insulating layer 311, and a conductor layer 314 is provided in the via hole. The conductor layer 314 provides an electrical coupling between two conductor interconnect layers 312, which are disposed over and under the insulating layer 311, respectively.

The conductor interconnect layer 312 is a metallic layer, and for example, an interconnect layer composed of copper. A two-dimensional geometry of such conductor interconnect layer 312 is a geometry shown in FIG. 15, in which a plurality of substantially circular openings 312B1 are formed. Note that an enlarged view of the conductor interconnect layer 312 is also attached in the right-under location of FIG. 15. A diameter of the opening portion 312B1 is, for example, 500 μm. In addition, copper-containing ratio in such conductor interconnect layer 312 is within a range of from 60 to 90%, and preferably within a range of from 75 to 85%. Here, a pair of conductor interconnect layers 312 disposed over and under the insulating layer 311 are mutually coupled via the metallic (for example, copper) conductor layer 314 provided in the via hole of the insulating layer 311.

Figure 16:
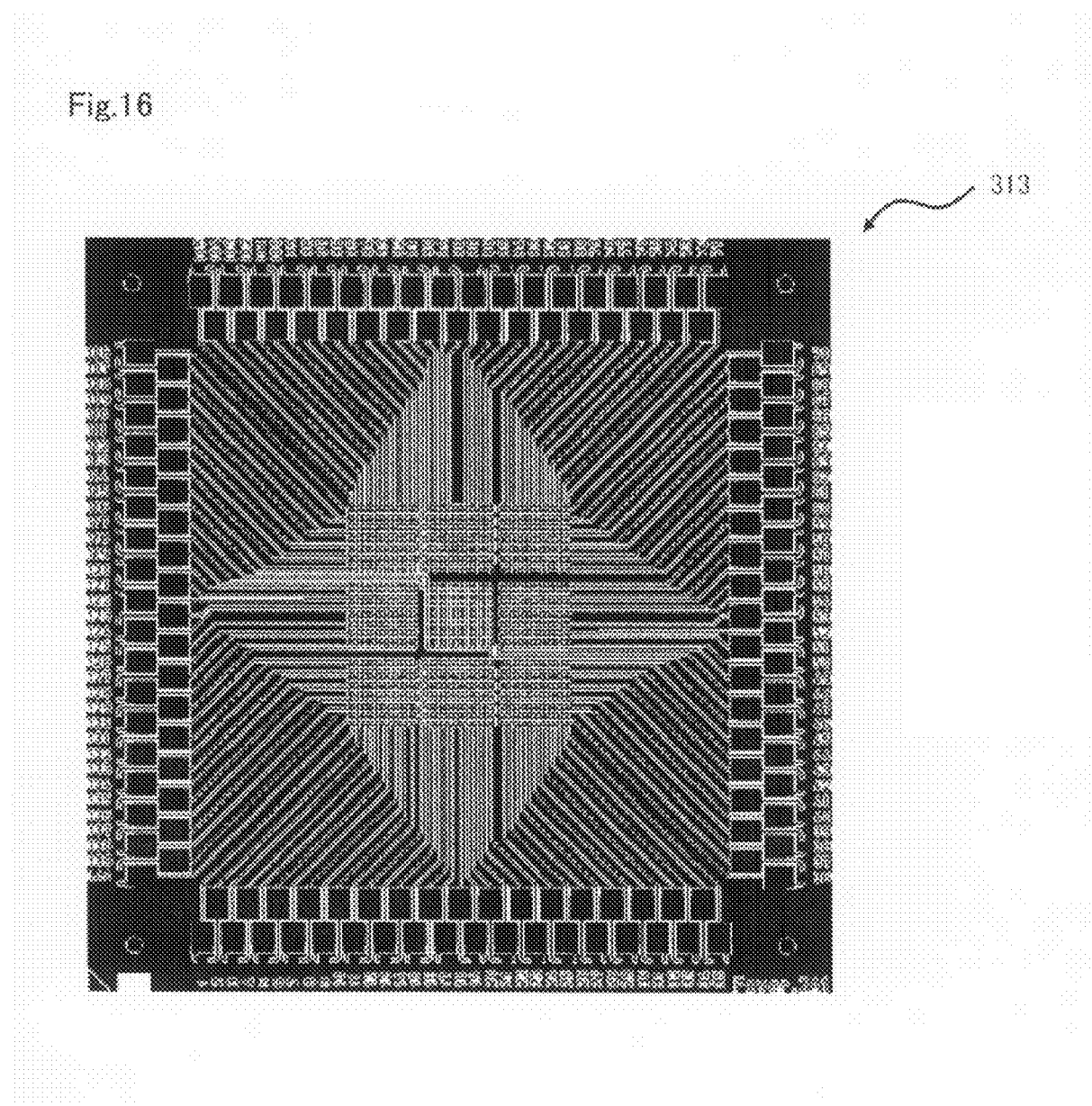
FIG. 16 is a plan view, illustrating a conductor interconnect layer.

As shown in FIG. 14, the buildup layer 31B is disposed in the side of the back surface of the core layer 32, and includes the insulating layers 311, the conductor layers 314 and the conductor interconnect layers 312, which are similar to that in the buildup layer 31A, and further includes the conductor interconnect layers 313. The insulating layers 311 and the conductor interconnect layers (312 and 313) are alternately disposed. Here, a plurality of (for example, three) insulating layers 311 are provided, and a plurality of (for example, three) conductor interconnect layers 312 are also provided. In addition to above, a single conductor interconnect layer 313 is provided, and is disposed in the lowermost layer of the buildup layer 31B. The conductor interconnect layer 313 is, for example, is a copper interconnect layer, and has a structure shown in FIG. 16. In FIG. 16, dark sections indicate copper interconnects. Copper-containing ratio in such conductor interconnect layer 313 (ratio of the conductor interconnect layers 313 occupying in the insulating layer) is 80%.

As shown in FIG. 14, the core layer 32 has an insulating layer 321. The insulating layer 321 is obtained by piling a predetermined number of prepregs and then forming the piled prepreg while heating and pressuring. The prepreg is a fiber such as a glass cloth impregnated with a resin varnish. The resin material employed for constituting the insulating layer 321 may be the same resin material as employed for constituting the insulating layer 311 of the buildup layer. The insulating layer 321 preferably contains a cyanate resin, in particular a novolac cyanate resin. In addition, an average coefficient of thermal expansion along a substrate inplane direction of the insulating layer 321 for temperature range of from 25 degree C. to a glass transition point thereof is equal to or lower than 12 ppm/degree C., and an average coefficient of thermal expansion along a substrate thickness direction of the insulating layer 321 for temperature range of from 25 degree C. to a glass transition point thereof is preferably equal to or lower than 20 ppm/degree C. More preferably, an average coefficient of thermal expansion along a substrate inplane direction of the insulating layer 321 for temperature range of from 25 degree C. to a glass transition point thereof may be equal to or lower than 11 ppm/degree C., and an average coefficient of thermal expansion along a substrate thickness direction of the insulating layer 321 for temperature range of from 25 degree C. to a glass transition point thereof may be equal to or lower than 16 ppm/degree C. In addition, an average coefficient of thermal expansion along a substrate inplane direction of the insulating layer 321 for temperature range of from 25 degree C. to a glass transition point thereof is equal to or higher than 3 ppm/degree C., and an average coefficient of thermal expansion along a substrate thickness direction of the insulating layer 321 is preferably equal to or higher than 3 ppm/degree C. The average coefficient of thermal expansion of the insulating layer 321 can be measured via the manner same as the measurement procedure for the average coefficient of thermal expansion of the insulating layer 311.

A through hole is formed in such insulating layer 321 of the core layer 32, and a conductor layer 322 is provided within the through hole. The conductor layer 322 is a metallic layer (for example, copper layer), and is coupled to the conductor interconnect layer 312 of the buildup layer 31A and is also coupled to the conductor interconnect layer 312 of the buildup layer 31B.

A back surface of such first resin substrate 3 is provided with a solder bump B1 (see FIGS. 12 and 13). Such solder bump B1 is coupled to the conductor interconnect layer 313 in the buildup layer 31B of the first resin substrate 3.

[First Semiconductor Chip]

As shown in FIG. 13, the first semiconductor chip 2 includes the interconnect layer 22 composed of a so-called Low-K layer on the silicon substrate 21. The function thereof is not particularly limited, and a logic device, a memory device or a mixture thereof may be employed. The Low-K layer is provided as the interlayer insulating layer. Here, the Low-K layer means a film exhibiting a specific dielectric constant of equal to or lower than 3.3. Typical Low-K layers include, for example, organic layers such as silicon oxycarbide (SiOC), methyl silsesquioxane (MSQ), benzo cyclobutene and the like, and inorganic layers such as hydroxy silsesquioxane (HSQ) and the like, and a porosified film of such materials may also be preferably employed.

Such first semiconductor chip 2 is disposed substantially central portion in the front surface of first resin substrate 3. A plurality of solder bumps B2 are disposed between the first semiconductor chip 2 and the first resin substrate 3, and the first semiconductor chip 2 is coupled to the first resin substrate 3 via the solder bumps B2. Typical materials available for the solder bump B2 may include, for example, tin-bismuth alloy, tin-zinc alloy, tin-lead alloy (Sn/95Pb, Sn/63Pb) and the like. The materials available for the solder bump B2 may be for example, a material having a coefficient of thermal expansion within a range of from 10 ppm/degree C. to 25 ppm/degree C. The peripheries of such solder bumps B2 are filled with an underfill U.

[Underfill]

The underfill U fills the peripheries of the solder bumps B2 that join the first resin substrate 3 with the first semiconductor chip 2, and also fills the peripheries of the solder bumps B2 that join the second resin substrate 5 with the second semiconductor chip 4. Available component materials of the underfill U include a liquid thermosetting resin and a film thermosetting resin. Among these, a liquid thermosetting resin is preferable. This is because a gap between the first resin substrate 3 and the first semiconductor chip 2 and a gap between the second resin substrate and the second semiconductor chip 4 can be filled with an improved efficiency. In the present embodiment, the underfill U is composed of a resin material, whose coefficient of elasticity in atmosphere at 125 degrees centigrade is 150 MPa or more and 800 MPa or less. The elastic modulus may be obtained by the following procedure: a paste of the underfill U is formed to have a dimension of 10 mm-wide, about 150 mm-long and 4 mm-thick; the paste is cured in an oven for 30 minutes at 200 degree C.; and then, measurements are carried out by a TENSILON testing machine within an atmosphere at a temperature of 125 degree C. and at a rate of 1 mm/minute; and an elastic modulus is eventually calculated by utilizing an initial gradient of the obtained stress-distortion curve. The elastic modulus of the underfill U may be 150 MPa or more and 800 MPa or less, so that the peripheries of the bumps B2 are firmly fixed, thereby preventing a crack in the bumps B2. In addition to above, when the solder bumps B2 are of lead-free solder, the material may preferably have an elastic modulus of equal to or higher than 150 MPa, and more preferably equal to or higher than 200 MPa. In addition, when the solder bumps B2 are of solder having higher melting point, the material may preferably have an elastic modulus of equal to or higher than 30 MPa, and more preferably equal to or higher than 45 MPa, for the underfill U.

Various materials may be employed for the resin material employed in the underfill U. For example, an epoxy resin, a BT resin, a cyanate resin or the like may be employed. A novolac cyanate resin, formerly described in the description for the substrate material, is preferably employed for the cyanate resin.

It is preferable that the resin material constituting the underfill U contains a poly-functional epoxy resin. This allows providing an improved cross linking density of the cured resin, thereby achieving higher elastic modulus.

The underfill U may contain an inorganic filler such as silica particles. Such configuration provides a reduced coefficient of thermal expansion, so that damages on the semiconductor chips 2 and 4, between the first semiconductor chip 2 and the first resin substrate 3, and between the second semiconductor chip 4 and the second resin substrate 5 can be more effectively reduced.

The underfill U may contain a coupling agent. Having such configuration, an improved adhesiveness between the bump or the inorganic filler and the underfill and a reduced coefficient of thermal expansion can be achieved, so that damages on the semiconductor chips and between the semiconductor chip and the substrate can be more effectively reduced. Available coupling agents include a silane coupling agent such as epoxysilane, aminosilane and the like, and a titanate-coupling agent and the like. A combination thereof may also be employed. The coupling agent may be in a form of being dispersed in the binder component of the underfill, or may be in a form of being coated onto the surfaces of the inorganic filler such as silica particles. Alternatively, these forms may be simultaneously exhibited. When, for example, silica particles are blended, the silica surface processed with a coupling agent may be employed.

An average coefficient of thermal expansion of the underfill U for temperature range of from 25 degree C. to a glass transition point thereof is preferably equal to or lower than 40 ppm/degree C., and more preferably equal to or lower than 30 ppm/degree C. This more effectively allows an inhibition of a damage on the Low-K layer, and an inhibition of a damage on the peripheral section of the bumps B2. In addition to above, average coefficient of thermal expansion of the underfill U for temperature range of from 25 degree C. to a glass transition point thereof may be measured by the following manner. A liquid injection-encapsulating underfill material is cured at 150 degree C. for 120 minutes, and then is cut out to obtain a test specimen of 5×5×10 mm. The measurement for such test specimen is carried out by employing "TMA/SS120", commercially available from SEIKO Co. Ltd., with a compressive load of 5 g and at a temperature elevating rate of 10 degree C./minute.

[Second Resin Substrate]

A second resin substrate 5, in the present embodiment, is composed of the substrate material which is same as that of the first resin substrate 3, and has the layer-structure same as that of the first resin substrate 3. More specifically, the second resin substrate 5 includes buildup layers 31A and 31B and a core layer 32, which are similar to that of the first resin substrate 3. The second resin substrate 5 also has a surface of substantially rectangular geometry, similarly as in the first resin substrate 3. Although the second resin substrate 5 is the same member as the first resin substrate 3 in the present embodiment, the second resin substrate will be indicated with a numeral "5", for the purpose of distinguishing thereof from the first resin substrate 3.

[Second Semiconductor Chip]

The second semiconductor chip 4 is mounted on a front surface of the second resin substrate 5. The second semiconductor chip 4 includes the interconnect layer 22 composed of a so-called Low-K layer on the silicon substrate 21, similarly as the first semiconductor chip 2. In addition to above, it may be configured that the first semiconductor chip 2 has a logic circuit, and the second semiconductor chip 4 has a memory device. Solder bumps B2 are provided between the second semiconductor chip 4 and the second resin substrate 5, similarly as the solder bumps for coupling the first semiconductor chip 2 to the first resin substrate 3. The solder bumps B2 provide an electrical coupling between the conductor interconnect layer 312 of the buildup layer 31A of the second resin substrate 5 and the second semiconductor chip 4.

[Resin Spacer]

Figure 17:
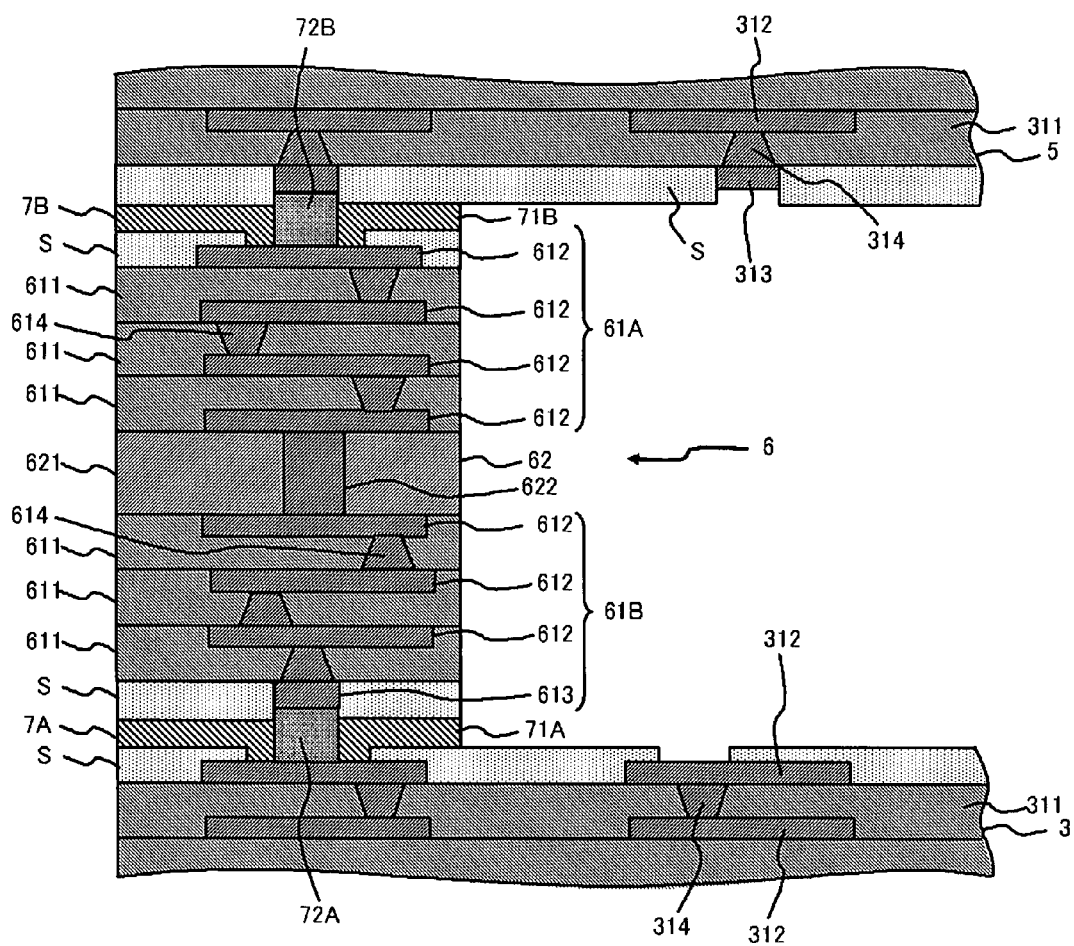
FIG. 17 is a cross-sectional view, illustrating a substantial part of a semiconductor device.

The resin spacer 6 is a rectangular frame-shaped member, which is disposed along each side of the first resin substrate 3 and the second resin substrate 5, both having rectangular surface geometries. The resin spacer 6 has conductor sections (conductor interconnect layer 612, conductor layer 614) extending through an interior thereof along the thickness direction. This resin spacer 6 includes, as shown in FIG. 17, rectangular frame-shaped core layer 62, a pair of rectangular frame-shaped buildup layers 61A and 61B, which are opposed across the core layer 62. The buildup layer 61A is disposed in the side of the front surface of the core layer 62, and has a configuration including insulating layers 611 containing a resin and conductor interconnect layers 612, which are alternately stacked. In the present embodiment, the buildup layer 61A is composed of a plurality of (for example, three) insulating layers 611 and a plurality of (for example, four) conductor interconnect layers 612, which are alternately stacked. Here, the resin constituting the insulating layer 611 is the same as the resin constituting the insulating layer 311, and a glass transition point, a coefficient of thermal expansion along the thickness direction and a coefficient of thermal expansion along the inplane direction of the insulating layer 611 are the same as those of the insulating layer 311. More specifically, in the insulating layers 611, an average coefficient of thermal expansion along an inplane direction for temperature range of from 25 degree C. to a glass transition point thereof is equal to or lower than 30 ppm/degree C., and an average coefficient of thermal expansion along a thickness direction is equal to or lower than 30 ppm/degree C. Here, in the insulating layers 611, an average coefficient of thermal expansion along the inplane direction for temperature range of from 25 degree C. to a glass transition point thereof is preferably equal to or lower than 20 ppm/degree C., and an average coefficient of thermal expansion along the thickness direction is preferably equal to or lower than 20 ppm/degree C. Further, in the insulating layers 611, an average coefficient of thermal expansion along a substrate inplane direction for temperature range of from 25 degree C. to a glass transition point thereof is preferably equal to or higher than 3 ppm/degree C., and an average coefficient of thermal expansion along a substrate thickness direction is preferably equal to or higher than 3 ppm/degree C. In addition, a via hole is formed in the insulating layer 611, and a conductor layer 614 is provided in the via hole. The conductor layer 614 is composed of the material same as that of the conductor layer 314. Further, the conductor interconnect layer 612 is composed of the material same as that for the conductor interconnect layer 312.

The buildup layer 61B is disposed in the side of the back surface of the core layer 62, and similar layer-structure and similar substrate material as the buildup layer 31B employs are also employed. More specifically, the buildup layer 61B includes the insulating layers 611, the conductor layers 614, the conductor interconnect layers 612 and conductor interconnect layers 613 composed of the material same as that for the conductor interconnect layer 313. The insulating layers 611 and the conductor interconnect layers (612 and 613) are alternately disposed. The conductor interconnect layer 613 is disposed in the lowermost layer of the buildup layer 61B, similarly as the conductor interconnect layer 313. The core layer 62 is also composed of with the resin material same as that for the core layer 32, and has the insulating layer 321 that is similar to the insulating layer 621. More specifically, an average coefficient of thermal expansion along a substrate inplane direction of the insulating layer 621 for temperature range of from 25 degree C. to a glass transition point thereof is equal to or lower than 12 ppm/degree C., and an average coefficient of thermal expansion along a substrate thickness direction of the insulating layer 621 for temperature range of from 25 degree C. to a glass transition point thereof is preferably equal to or lower than 20 ppm/degree C. More preferably, an average coefficient of thermal expansion along a substrate inplane direction of the insulating layer 621 may be equal to or lower than 11 ppm/degree C., and an average coefficient of thermal expansion along a substrate thickness direction of the insulating layer 621 may be equal to or lower than 16 ppm/degree C. Further, an average coefficient of thermal expansion along a substrate inplane direction of the insulating layer 621 for temperature range of from 25 degree C. to a glass transition point thereof is equal to or higher than 3 ppm/degree C., and an average coefficient of thermal expansion along a substrate thickness direction of the insulating layer 621 is preferably equal to or higher than 3 ppm/degree C. A through hole is formed in such insulating layer 621 of the core layer 62, and a conductor layer 622 is provided within the through hole. The conductor layer 622 is a metallic layer (for example, copper layer), and is coupled to the conductor interconnect layer 612 of the buildup layer 61A and is also coupled to the conductor interconnect layer 612 of the buildup layer 61B. The resin spacer 6 as described above may be obtained by punching out a central section from a substrate composed of the layer-structure with the substrate material, both of which are similar as those for the first resin substrate and the second resin substrate.

A dimensional height of such resin spacer 6 is larger than a sum of a dimensional thickness of first semiconductor chip 2 and a dimensional thickness of the solder bump B2, so that a spacing is formed between the front surface of the first semiconductor chip 2 and the back surfaces of the second resin substrate 5.

[First Adhesive Member, Second Adhesive Member]

As shown in FIG. 17, the first adhesive member 7A is disposed between the resin spacer 6 and the first resin substrate 3, and serves as electrically coupling the resin spacer 6 to the first resin substrate 3. Such first adhesive member 7A is, in the present embodiment, a cured product of an adhesive tape in a film form (adhesive agent). In addition to above, the first adhesive member 7A is not limited to the cured film-form adhesive tape (adhesive agent), and may be a cured product of a liquid adhesive agent. The first adhesive member 7A is disposed along respective sides of the first resin substrate 3. The first adhesive member 7A includes a first resin layer 71A having an adhesive property and a solder region 72A provided in the first resin layer 71A and serving as a first electric conductor. As discussed later in detail, the adhesive tape constituting the first adhesive member 7A contains a resin constituting the first resin layer 71A, solder powder constituting the solder region 72A and a curing agent exhibiting the flux activity. The solder region 72A is provided to have a columnar shape so as to extend through the first resin layer 71A along the thickness direction. Through such solder region 72A, the conductor interconnect layer 613 in the buildup layer 61B of the resin spacer 6 is coupled to the conductor interconnect layer 312 in the uppermost surface of the buildup layer 31A of the first resin substrate 3. More specifically, in FIG. 17, a sign "S" indicates a solder resist of a resin (insulating layer) provided on the front and the back surface of the first resin substrate 3, on the front and the back surface of the resin spacer 6, and on the front and the back surface of the second resin substrate 5. The solder region 72A forms a metalized connection with the conductor interconnect layer 613 of the resin spacer 6 exposed from the solder resist S, and also forms a metalized connection with the conductor interconnect layer 312 of an uppermost surface of the first resin substrate 3 exposed from the solder resist S. The first resin layer 71A having an adhesive property is a layer serving as providing an adhesion between the resin spacer 6 and the first resin substrate 3. In the present embodiment, the first resin layer 71A indirectly contacts with the resin spacer 6 and the first resin substrate 3 via the solder resist S.

The second adhesive member 7B is disposed between the resin spacer 6 and the second resin substrate 5, and serves as electrically coupling the resin spacer 6 to the second resin substrate 5. Such second adhesive member 7B includes a second resin layer 71B having an adhesive property and a solder region 72B provided in the second resin layer 71B and serving as a second electric conductor. In the present embodiment, the first adhesive member 7A and the second adhesive member 7B are similar cured products of adhesive tapes in film form (adhesive agent). More specifically, the second resin layer 71B and the first resin layer 71A are composed of similar materials, and the solder region 72B and the solder region 72A are composed of similar materials. The second adhesive member 7B serves as electrically coupling the resin spacer 6 to the second resin substrate 5, and the conductor interconnect layer 612 in the buildup layer 61A of the resin spacer 6 is coupled to the conductor interconnect layer 313 in the lowermost layer of the buildup layer 31B of the second resin substrate 5 via the pillar-shaped solder region 72B, which is provided so as to extend through the second resin layer 71B. In addition, the solder region 72B of the second adhesive member 7B forms a metalized connection with the conductor interconnect layer 612 of the resin spacer 6 exposed from the solder resist S, and also forms a metalized connection with the conductor interconnect layer 313 of a bottom surface of the second resin substrate 5 exposed from the solder resist S. Further, the second adhesive member 7B is disposed along respective sides of the second resin substrate 5. The second resin layer 71B having an adhesive property is a layer serving as providing an adhesion between the resin spacer 6 and the second resin substrate 5. In the present embodiment, the second resin layer 71B indirectly contacts with the resin spacer 6 and the second resin substrate 5 via the solder resist S.

Next, a method for manufacturing of the above-mentioned semiconductor device 1 will be described. First of all, the first resin substrate 3 and the second resin substrate 5 are prepared. A method for manufacturing the first resin substrate 3 will be described. In addition to above, a method for manufacturing the second resin substrate 5 is similar to the method for manufacturing the first resin substrate 3. First of all, a double-Sided copper clad laminate is prepared (board having copper layers formed on the front and the back surface of the insulating layer 321 of the core layer 32), then through holes are formed in predetermined locations, and further, the conductor layer 322 is formed. Next, the conductor interconnect layers 312 are formed on the front and the back surface of the insulating layer 321, respectively, by a subtractive process. Thereafter, the surfaces of a pair of conductor interconnect layers 312 are roughened by employing a chemical solution, and these insulating layers 311 are laminated. Thereafter, via holes are formed in the insulating layer 311 via a laser processing or the like. Thereafter, by employing a semi-additive process, the conductor layer 314 is formed in the via hole and further the conductor interconnect layer 312 is formed on each of the insulating layer 311. Such processes are repeated to allow obtaining the first resin substrate 3. In addition to above, the conductor interconnect layer in the lowermost layer of the first resin substrate 3 is the conductor interconnect layer 313.

Next, the solder resist S is applied onto the front and the back surface of thus obtained first resin substrate 3 and second resin substrate 5, respectively. Thereafter, the first semiconductor chip 2 and the second semiconductor chip 4 are mounted on the first resin substrate 3 and the second resin substrate 5, respectively. The solder bumps B2 are provided on the back surfaces of the first semiconductor chip 2 and the second semiconductor chip 4, the first semiconductor chip 2 and the second semiconductor chip 4 are mounted on the first resin substrate 3 and the second resin substrate 5, respectively, and the solder bumps B2 are melted in a reflow furnaces, so that the first semiconductor chip 2 and the second semiconductor chip 4 are fixed to the first resin substrate 3 and the second resin substrate 5, respectively. Thereafter, the periphery of the solder bumps B2 that provides a juncture between the first semiconductor chip 2 and the first resin substrate 3 and the periphery of the solder bumps B2 that provides a juncture between the second semiconductor chip 4 and the second resin substrate 5 are filled with the underfill U, respectively. Next, the resin spacer 6 is prepared. More specifically, in the present embodiment, the solder resist S is applied onto the front and the back surfaces of a substrate is composed of the layer-structure with the substrate material, both of which are similar as those for the first resin substrate 3 and the second resin substrate 5, and then the central section of the coated substrate is punched out. Thereafter, the first resin substrate 3, an adhesive tape constituting the above-described first adhesive member 7A, the resin spacer 6, an adhesive tape constituting the second adhesive member 7B and the second resin substrate 5 are deposited in this sequence, and such multiple-layered material is heated at a predetermined temperature. A heating temperature (adhesion temperature) can be selected according to the material of the solder powder and the material of the resin in the adhesive tape. The adhesive temperature is selected to be higher than the melting temperature of the solder powder and to be equivalent to a temperature, at which the resin is melted. At this point of view, adhesive temperature may be selected to be higher than, for example, 100 degree C., preferably equal to or higher than 120 degree C., and more preferably equal to or higher than 150 degree C. In addition, it is preferable that the melt viscosity of the resin is lower at the adhesion temperature, and at this point of view, the adhesion temperature may be selected to be, for example, equal to or lower than 250 degree C., and preferably equal to or lower than 200 degree C. In addition, in view of increasing the area exhibiting lower melt viscosity of the resin, lower adhesion temperature is preferable. In addition to above, a pressurizing at a predetermined pressure during the adhesion process may also be conducted. A pressure for the pressurizing operation may be, for example, equal to or higher than 1 MPa, in view of forming the solder regions 72A and 72B with further certainty. In addition, the pressure may be, for example, equal to or lower than 20 MPa, and preferably equal to or lower than 10 MPa, in view of further improving the joint reliability. Further, a thermo-compression bonding time may be preferably within a range of from 10 to 600 seconds.

Here, the adhesive tape will be described. The adhesive tape contains the resin constituting the above-described resin layers 71A and 71B, the solder powder constituting the above-described solder regions 72A and 72B, and the curing agent exhibiting the flux activity (chemical compound exhibiting the flux activity). Among these, the solder powder and the curing agent exhibiting the flux activity are present in the resin. When the adhesive tape is heated while being disposed between the first resin substrate 3 and the resin spacer 6 and between the second resin substrate 5 and the resin spacer 6, the solder powder in the resin melts, migrating in a self-aligning manner onto the surface of the conductor interconnect layer 613 in the buildup layer 61B the resin spacer 6 and the surface of the conductor interconnect layer 312 in the an uppermost surface of the buildup layer 31A of the first resin substrate 3, and further onto the surface of the conductor interconnect layer 612 in the buildup layer 61A of the resin spacer 6 and the surface of the conductor interconnect layer 313 in the lowermost layer of the buildup layer 31B of the second resin substrate 5, thereby forming metallic junctions (in other words, solder regions). In addition, the curing agent (not shown) exhibiting the flux activity existed in the resin migrates to interfaces of the solder powder with the respective conductor interconnect layers 312, 613, 313 and 612 with an improved efficiency, and, in order to remove oxide films from the surface of the solder powder, direct metalized connections are formed between the solder region 72A and the respective conductor interconnect layers 312 and 613 and between the solder region 72B and the respective conductor interconnect layers 313 and 612, providing electrical couplings. The use of such adhesive tape in this manner allows the adhesion by simply heating at a single temperature, thereby easily achieving an adhesion between the substrate and the resin spacer. However, the heating process for the adhesion is not limited to the processing at a single temperature, and, for example, a step-cure process including heating at 150 degree C. for 100 seconds and then heating at 200 degree C. for 100 seconds, or a post cure process including thermo-compression bonding at 180 degree C. for 10 seconds and then cure in an oven at 200 degree C. for ten minutes, may alternatively be conducted. In addition, the metalized connection of the solder particles constituting the solder powder provides the couplings of solder in the adhesive tape with the respective conductor interconnect layers 312, 613, 313 and 612, so that lower conductive resistance and higher joint reliability are achieved.

Here, the resin available for the adhesive tape is not particularly limited to any specific resins, and typically, a thermoplastic resin, a thermosetting resins, or a mixtures of a thermoplastic resin and a thermosetting resin may be employed. Among these, in view of a film-formability and a melt viscosity of the resin, a mixture of a thermoplastic resin and a thermosetting resin is preferable.

Available thermoplastic resin is not particularly limited to any specific resins, and typically, for example, phenoxy resin, polyester resin, polyurethane resin, polyimide resin, siloxane conversion polyimide resin, polybutadiene, polypropylene, styrene-butadiene-styrene copolymer, styrene-ethylene-butylene-styrene copolymer, polyacetal resin, polyvinylbutyral resin, polyvinylacetal resin, isobutylene-isoprene rubber, chloroprene rubber, polyamide resin, acrylonitrile-butadiene copolymer, acrylonitrile-butadiene-acrylic acid copolymer, acrylonitrile-butadiene-styrene copolymer, poly vinyl acetate, nylon, acrylic rubber may be employed. These may be employed alone, or a combination of two or more of these polymers may be employed. Among these, a phenoxy resin is preferably employed.

In addition, the above-described thermoplastic resin may have nitrile group, epoxy group, hydroxyl group and carboxylic group, for the purpose of providing an improved adhesive property and an improved compatibility with other resins, and typical example of such resin may be an acrylic rubber, for example. This allows providing an improved film-forming stability for the adhesive tape. Further, a reduced elastic modulus of the adhesive tape can be provided, thereby providing an improved adhesiveness with objects.

The content of the aforementioned thermoplastic resin, is not particularly limited to any specific value, and is preferable to be 10 to 50% wt of the whole resin compositions except the solder powder, and is particularly preferable to be 15 to 45% wt. The content within the aforementioned range allows particularly improving the film form-ability.

The thermosetting resin here is not particularly limited to any specific resins, and typically, epoxy resins, oxetane resins, phenolic resins, (meta) acrylate resins, unsaturated polyester resins, diallylphthalate resins, maleimide resins or the like may be employed. Among these, epoxy resins, which exhibits better cure-ability and better shelf life, and the cured material of which exhibits better thermal resistance, better moisture resistance and better chemical resistance, are preferably employed.

Any of epoxy resins that are in solid state at a room temperature and epoxy resins that are in liquid state at a room temperature may be employed for the epoxy resins here. In addition, the resin may contain an epoxy resin that is in solid state at a room temperature and another epoxy resin that is in liquid state at a room temperature. This allows further enhancing the flexibility in the design of the melting behavior of the resin.

The epoxy resin that is in solid state at a room temperature is not particularly limited to any specific resins, and typically, bisphenol A epoxy resin, bisphenol S epoxy resin, phenolic novolac epoxy resin, creosol novolac epoxy resin, glycidyl amine epoxy resin, glycidyl ester epoxy resin, tri-functional epoxy resin, quadri-functional epoxy resin or the like may be employed. More specifically, a solid tri-functional epoxy resin and a creosol novolac epoxy resin may be contained. This allows improving the thermal resistance of the cured material, so that better results can be obtained in a temperature cycling test or in a pressure cooker test (PCT).

In addition, the epoxy resin that is in liquid state at a room temperature may be a bisphenol A epoxy resin or a bisphenol F epoxy resin. In addition, the combination thereof may be employed.

The content of the aforementioned thermosetting resin is not particularly limited to any specific value, and may be preferably 20 to 80% wt. of the whole resin composition except the solder powder, and in particular, preferably 30 to 70% wt. The content within the above range ensures sufficient elastic modulus after the adhesion, thereby providing an improved joint reliability. In addition, since higher melt viscosity of the adhesive tape can be achieved, thereby preventing the solder powder from getting out from the adhesion object.

In addition, the configuration of the resin containing acrylic rubber allows an improved deposition stability in the manufacture of the film-shaped adhesive tape. In addition, since such configuration provides a decreased elastic modulus of the adhesive tape, which leads to providing a reduced residual stress between the adhesion object and the adhesive tape, an improved adhesiveness for the adhesion object can be achieved.

Compounding ratio of a resin in the adhesive tape may be that, for example, an acrylic rubber is contained at a ratio within a range of from 10% wt. to 50% wt. over the total of the constituents of the adhesive tape except the solder powder. The compounding ratio of the acrylic rubber of 10% wt. or higher allows inhibiting a decrease in the film-formability and further inhibiting an increase in the elastic modulus of the cured adhesive tape, thereby further improving the adhesiveness with the adhesion object. In addition, the compounding ratio of the acrylic rubber of 50% wt. or lower inhibits an increase in the melt viscosity of the resin, allowing the solder powder moving to the surface of the conductive member with further certainty.

In addition, the compounding ratio of the epoxy resin over the total of the constituents of the adhesive tape except the solder powder may be, for example, within a range of from 20% wt. to 80% wt. The compounding ratio of the of 20% wt. or higher ensures the sufficient elastic modulus of the adhered tape, thereby improving the joint reliability. In addition, the compounding ratio of the epoxy resin of 80% wt. or lower further enhance the melt viscosity prevents the solder powder from getting out from the adhesion object, thereby inhibiting a decrease in the joint reliability.

In addition, in view of allowing the solder powder moving within the resin with a certainty, it is sufficient to configure that the curing temperature of the resin is higher than the melting temperature of the solder powder as discussed later. More specifically, the curing temperature of the resin may be higher than the melting point of solder by 10 degree C. or more, and preferably by 20 degree C. or more. In addition, a configuration of exhibiting lower melt viscosity of resin at an adhesion temperature may be preferable.

Here, a curing temperature of a resin may be determine as, for example, an exothermic peak temperature of an adhesive tape measured under a condition of a temperature ramp rate of 10 degree of C/minute by employing a differential scanning calorimeter (DSC).

Lead free solder, for example, may be employed for solder constituting the solder powder in the adhesive tape. Lead free solder is not particularly limited to any specific type, and is preferably an alloy containing at least two or more elements selected from the group consisting of tin (Sn), silver (Ag), bismuth(Bi), indium (In), zinc (Zn) and copper (Cu). Among these, in consideration of the melting temperature and the mechanical properties, it is preferable to employ an alloy containing Sn such as an alloy of Sn—Bi, an alloy of Sn—Ag—Cu, an alloy of Sn—In or the like.

The melting temperature of the solder powder may be, for example, equal to or higher than 100 degree C., and preferably equal to or higher than 130 degree C., in view of sufficiently ensuring the flowability of the resin during the adhesion of the adhesive tape. In addition, the melting temperature of solder powder may be, for example, equal to or lower than 250 degree C., and preferably equal to or lower than 230 degree C., in view of inhibiting a deterioration of elements provided on an adhesion object such as substrate, chip and the like during the adhesion operation.

Here, the melting temperature of solder may be determine as, for example, an endotherm peak temperature of the solder powder itself measured under a condition of a temperature ramp rate of 10 degree C./minute by employing a DSC.

In addition, in view of allowing the solder powder moving to the surface of the conductor interconnect layers 312, 613, 313 and 612 with further certainty, it is sufficient to configure that the melting temperature of the solder powder is lower than the curing temperature of resin.

In addition, a particle diameter of the solder powder may be selected in accordance with surface areas of the conductor interconnect layers 312, 613, 313 and 612 and distances between the conductor interconnect layers 312, 613, 313 and 612. The mean particle diameter of the solder powder may be, for example, equal to or larger than 5 μm, and preferably equal to or larger than 10 μm, in view of aggregating the solder powder with a certainty on the surface of the conductor interconnect layers 312, 613, 313 and 612. In addition, the mean particle diameter of the solder powder may be, for example, equal to or smaller than 100 μm, and preferably equal to or smaller than 50 μm, in view of selectively forming the solder region in the surfaces of the conductor interconnect layers 312, 613, 313 and 612, and ensuring an insulating performance of the adhesive tape in regions except the conducting regions thereof. Here, the mean particle diameter of the solder powder may be measured by, for example, a laser diffraction scattering process.

In addition, the compounding ratio of the solder powder in the adhesive tape may be equal to or larger than 20 parts by weight, provided that the total components of the tape except the solder powder is assumed to be 100 parts by weight, in view of providing an improved joint reliability, and preferably equal to or larger than 40 parts by weight. On the other hand, in view of improving the film-formability of the adhesive tape, the ratio may be equal to or smaller than 250 parts by weight, provided that the total components of the tape except the solder powder is assumed to be 100 parts by weight, and preferably equal to or smaller than 230 parts by weight.

The curing agent exhibiting the flux activity is a chemical compound having functional group, which is capable of inducing a reduction of an oxide film of the solder powder surface so as to be electrically joined to the conductor interconnect layers 312, 613, 313 and 612, and is also capable of binding with a resin. Further, the curing agent exhibiting the flux activity preferably has a reducing power for inducing a reduction of an oxide film on the conductor interconnect layer surface to remove such oxide film. For example, when the resin contains an epoxy resin, the curing agent exhibiting the flux activity may have carboxylic group and functional group that is capable of reacting with epoxy group. Typical functional group that is capable of reacting with epoxy group include, for example, carboxylic group, hydroxyl group, amino group and the like.

A suitably selected chemical compound employed for the curing agent exhibiting the flux activity according to the type of the solder powder, in view of removing the oxide film on the surface of the solder powder during the adhesion process. Typical curing agent includes: for example, chemical compounds having one phenolic hydroxyl group in the molecular such as benzoic acid, formic acid, acetic acid, phenol, alkylphenol, naphthol and the like; polyphenol compounds such as biphenol, hydroquinone, resorcinol, catechol, methylidene diphenol, ethylidene diphenol, isopropylidene diphenol, pyrogallol, hydroxyhydroquinone, phloroglucinol and the like. Among these, polyphenol compounds are preferable, in view of providing better flux activity.

In addition, the chemical compound exhibiting the flux activity is preferably a curing agent exhibiting the flux activity, which exhibits a flux activity and also serves as a curing agent for a thermosetting resin. This eliminates a need for a cleaning process of a flux agent after the solder-juncture process. Further, since the curing agent exhibiting the flux activity has a reactivity with thermosetting resins, so that outgassing is reduced, thereby reducing a contamination of electronic components, and/or an action as an ionic impurity is prevented, thereby preventing a corrosion of conductive members.

Typical curing agent exhibiting the flux activity includes, for example, a chemical compound having carboxylic group. Typical chemical compound having carboxylic group includes, for example, straight-chain or branched alkylcarboxylic acid, carboxylic acids such as aromatic carboxylic acid or the like.

Typical alkylcarboxylic acid includes, more specifically, chemical compounds represented by the following formula (II)

$$\text{HOOC—(CH}_2\text{)N—COOH} \qquad (II)$$

In the above-described formula (II), "n" is an integer number from 0 to 20. In addition, in view of balancing among the flux activity, the outgassing during the adhesion and the elastic modulus and the glass transition temperature of the cured adhesive tape, "n" in the above-described formula (II) is preferably from 4 to 10. "n" of equal to or higher than 4 can reduce an increase in the elastic modulus of the cured adhesive tape due to an excessively shorter distance across the cross link in molecular of epoxy resin, thereby improving the adhesive property with the adhesion object. On the other hand, "n" of equal to or lower than 10 can inhibit a decrease in the elastic modulus of the cured adhesive tape due to an excessively longer distance across the cross link in molecular of epoxy resin, thereby further improving the joint reliability.

Typical chemical compounds represented by the above-described formula (II) include, for example, adipic acid when n=4[(HOOC—(CH$_2$)$_4$—COOH)], sebacic acid when n=8[(HOOC—(CH$_2$)$_8$—COOH)], and a compound when n=10[(HOOC—(CH$_2$)$_{10}$—COOH)].

Typical aromatic carboxylic acid include, more specifically, chemical compounds having at least two phenolic hydroxyl group in one molecular and having at least one carboxylic group that is directly bound to aromatic group in one molecular. Such chemical compounds include, for example: benzoic acid derivatives such as 2,3-dihydroxybenzoic acid, 2,4-dihydroxybenzoic acid, gentisic acid (2,5-dihydroxybenzoic acid), 2,6-dihydroxybenzoic acid, 3,4-dihydroxybenzoic acid, gallic acid (3,4,5-trihydroxybenzoic acid) and the like; naphthoic acid derivatives such as 1,4-dihydroxy-2-naphthoic acid, 3,5-dihydroxy-2-naphthoic acid, 3,7-dihydroxy-2-naphthoic acid and the like; phenolphthalin; and diphenol acid or the like.

Typical curing agent exhibiting the flux activity may include, more specifically, sebacic acid and gentisic acid described above, one of or both of which may be contained therein. In addition, it is more preferable that the curing agent exhibiting the flux activity is a chemical compound having carboxylic group and the above-described phenolic hydroxyl group. In addition to above, the compound may alternatively have only one of carboxylic group and phenolic hydroxyl group.

It is sufficient that the curing agent exhibiting the flux activity is present in the exterior of the solder powder, and for example, the solder powder and the curing agent exhibiting the flux activity may be separately dispersed in the resin, or the curing agent may be adhered to the surface of the solder powder dispersing in the resin. Since the curing agent exhibiting the flux activity exists in the exterior of the solder powder, the curing agent exhibiting the flux activity moves to interfaces between solder and the conductor interconnect layers 312, 613, 313 and 612 with an improved efficiency during the adhesion process, thereby achieving direct contacts between solder and the conductor interconnect layers 312, 613, 313 and 612. This allows improving the joint reliability. In addition, since the curing agent exhibiting the flux activity is present in the resin, the curing agent can be adhered to the resin with an improved efficiency to enhance the elastic modulus or the glass transition temperature (Tg) of the resin.

In addition, in view of improving the flux activity, the compounding ratio of the curing agent exhibiting the flux activity for the total constituents of the adhesive tape except the solder powder may be, for example equal to or higher than 0.1% wt., and preferably equal to or higher than 1% wt. In addition, in view of decreasing the melt viscosity of the resin during the adhesion process, the compounding ratio of the curing agent exhibiting the flux activity for the total constituents of the adhesive tape except the solder powder may be, for example equal to or lower than 30% wt., and preferably equal to or lower than 10% wt.

More specifically, when the adhesive tape contains an epoxy resin, the compounding ratio of the curing agent exhibiting the flux activity for the epoxy resin contained in the adhesive tape may be, for example equal to or lower than 50% wt., and preferably equal to or lower than 30% wt. Having such configuration, an overloading of the curing agent is eliminated, providing an improved cure-ability.

In addition to above, the adhesive tape may further contain other curing agent, which is different from the curing agent exhibiting the flux activity, in the resin, or other resin functioning as a curing agent may be contained.

The curing agent is not particularly limited to any specific compound, and typically phenolics, amines, thiols may be available, and in consideration of the reactivity with the epoxy resin and the physical properties of the cured product, phenolics may be preferably employed.

Phenolics is not particularly limited to any specific compounds, and in view of physical properties of the cured adhesive tape, bi-functional or more is preferable. Typical phenolics include, for example, bisphenol A, tetramethyl bisphenol A, diallyl bisphenol A, biphenol, bisphenol F, diallyl bisphenol F, tris phenol, tetrakis phenol, phenol novolac phenols, creosol novolac phenols and the like, and in view of the melt viscosity, the reactivity with the epoxy resin and the physical properties of the cured product, phenol novolac phenols and creosol novolac phenols may be preferably employed.

In addition, in view of ensuring the cure of the resin, the blending ratio of the curing agent may be for example equal to or higher than 5% wt., provided that the total components of the tape except the solder powder is assumed to be 100, and preferably equal to or higher than 10% wt. In addition, in view of improving the flowability of the resin during the adhesion, the blending ratio of the curing agent may be for example equal to or lower than 40% wt., provided that the total components of the tape except the solder powder is assumed to be 100, and preferably equal to or lower than 30% wt.

In addition, the adhesive tape may further contain a curing catalyst. The configuration of containing the curing catalyst allows further ensuring the cure of the resin during the manufacture of the adhesive tape.

Suitable curing catalyst may be selected according to the type of the resin, and for example, an imidazole compound having a melting point of 150 degree C. or higher may be employed. Excessively lower melting point of such imidazole compound may induce earlier cure of the resin in the adhesive tape before the solder powder moves to the surfaces of the conductor interconnect layers 312, 613, 313 and 612, so that it is concerned that unstable coupling or shorter shelf life of the adhesive tape is caused. Therefore, the imidazole compound having the melting point of equal to or higher than 150 degree C. is preferable. Typical imidazole compound having a melting point of 150 degree C. or higher includes 2-phenyl hydroxy imidazole, 2-phenyl-4-methyl hydroxy imidazole and the like. In addition to above, the upper limit of the melting point of such imidazole compound is not particularly limited, and may be suitably selected according to, for example, an adhesion temperature of the adhesive tape.

In addition, the compounding ratio of the curing catalyst may be, for example, within a range of from 0.01% wt. to 5% wt., provided that the total components of the tape except the solder powder is assumed to be 100. The compounding ratio of the curing catalyst of equal to or higher than 0.01% wt. provides further effectively exhibiting the functions as the curing catalyst for the epoxy resin, thereby presenting a further improved curability of the adhesive tape. In addition, the compounding ratio of the curing catalyst of equal to or lower than 5% wt. provides further improved shelf life of the adhesive tape.

In addition, the adhesive tape may also contain a silane coupling agent. The configuration of containing the silane coupling agent allows further enhanced adhesiveness of the adhesive tape to the adhesion object. Typical silane coupling agent include epoxysilane coupling agents and aromatic-containing aminosilane coupling agents and the like, and it is sufficient to contain at least one of these. Alternatively, for example, both of these may be contained. The compounding ratio of the silane coupling agent may be, for example, within a range of from about 0.01% wt. to 5% wt., provided that the total components of the tape except the solder powder is assumed to be 100.

Next, the multiple-layered material having the first resin substrate 3, the adhesive tape, the resin spacer 6, the adhesive tape and the second resin substrate 5 is cooled. This allows a cure of the resin in the adhesive tape, thereby maintaining the conditions, in which the solder regions 72A and 72B join between the first resin substrate 3 and the resin spacer 6, and between the second resin substrate 5 and the resin spacer 6, respectively. Thereafter, the solder bumps B1 are provided on the back surface of the first resin substrate 3 to obtain the semiconductor device 1. Such semiconductor device 1 is mounted on the circuit board via the solder bumps B1 on the back surface of the first resin substrate 3.

Next, advantageous effects for the products of the present embodiment will be described. According to the present embodiment, the following advantageous effects can be obtained, in addition to the advantageous effects similar as in the aforementioned embodiments. In the present embodiment, an average coefficient of thermal expansion along a substrate inplane direction of the insulating layers 311 in the buildup layers 31A and 31B of the first resin substrate 3 and the second resin substrate 5 in the semiconductor device 1 for temperature range of from 25 degree C. to a glass transition point thereof is equal to or lower than 30 ppm/degree C., and an average coefficient of thermal expansion along a substrate thickness direction of the insulating layers 311 in the buildup layers 31A and 31B of the first resin substrate 3 and the second resin substrate 5 in the semiconductor device 1 for temperature range of from 25 degree C. to a glass transition point thereof is equal to or lower than 30 ppm/degree C. This allows achieving a reduced level of deformations of the buildup layers 31A and 31B along the substrate inplane direction and along the direction of the substrate thickness, when a thermal history is encountered for the semiconductor device 1. Therefore, warpages of the first resin substrate 3 and the second resin substrate 5 are reduced. Thus, a generation of a conductive failure between the first resin substrate 3 and the first semiconductor chip 2 and a generation of a conductive failure between the second resin substrate 5 and the second semiconductor chip 4 are reduced, providing the semiconductor device 1 with an improved joint reliability. Further, the insulating layer 311 of the buildup layer 31A of the first resin substrate 3 and the insulating layer 311 of the buildup layer 31A of the second resin substrate 5 are very closer to the solder bumps B2, and therefore are easily affected by a heat when the solder bumps B2 are melted. Therefore, warpages of the substrate 3 and 5 to be generated during the melting of the solder bumps B2 can be reduced, providing the semiconductor device 1 with an improved joint reliability.

When a metallic bump electrode or a lead is disposed between substrates as in the conventional technologies, it is difficult to reduce a difference in the coefficient of thermal expansion between the substrate containing a resin and the metallic bump electrode or a difference in the coefficient of thermal expansion between the substrate containing a resin and the metallic lead. On the contrary, in the present embodiment, the resin spacer 6 is disposed between the first resin substrate 3 and the second resin substrate 5, such that the first resin substrate 3, the second resin substrate 5 and the resin spacer 6 can be configured to contain resins. This allows reducing the difference in the coefficient of thermal expansion between the first resin substrate 3 and the resin spacer 6 and the difference in the coefficient of thermal expansion between the second resin substrate 5 and the resin spacer 6. Therefore, a generation of a conductive failure between the first resin substrate 3 and the second resin substrate 5 can be reduced. In particular, in the present embodiment, both of the first resin substrate 3 and the second resin substrate 5 are composed to have similar layer-structure and composed of similar substrate material, and further, the resin spacer 6 is composed of similar substrate as employed for the first resin substrate 3 and the second resin substrate 5. More specifically, the coefficient of thermal expansion of the first resin substrate 3 along the substrate inplane direction and along the direction of the substrate thickness, the coefficient of thermal expansion of the second resin substrate 5 along the substrate inplane direction and along the direction of the substrate thickness, and the coefficient of thermal expansion of the resin spacer 6 along the substrate inplane direction and along the direction of the substrate thickness can be provided to be substantially equivalent, so that a generation of a conductive failure can be prevented with a certainty, when a thermal history is encountered for the semiconductor device 1.

Further, in the present embodiment, the insulating layers 311, 321, 611 and 621 of the first resin substrate 3, the second resin substrate 5 and the resin spacer 6 are configured to contain a cyanate resin, in particular a novolac cyanate resin, so that generations of warpages in the first resin substrate 3, the second resin substrate 5 and the resin spacer 6 can be reduced with further certainty.

Further, the first resin substrate 3 containing the resin, the resin spacer 6 and the second resin substrate 5 to containing the resin are stacked to form a multiple-layered material of the resins having a certain thickness and starting from the first resin substrate 3 and ending to the second resin substrate 5. Therefore, even if the first resin substrate 3 and the second resin substrate 5 are designed to be thinner, the stiffness of the whole semiconductor device 1 is improved, and thus a generation of a warpage for the whole semiconductor device 1 is inhibited, thereby presenting the semiconductor device 1, in which a generation of the conductive failure is inhibited. Further, in the present embodiment, the resin spacer 6 is disposed in the circumference of the first resin substrate 3, and the first semiconductor chip 2 is mounted in the space section provided between the first resin substrate 3 and the second resin substrate 5, so that a space for mounting the first semiconductor chip 2 between the first resin substrates 3 and the second resin substrate 5 can be stably ensured.

Further, in the present embodiment, in the insulating layers 321 of the respective core layers 32 of the first resin substrate 3 and the second resin substrate 5, an average coefficient of thermal expansion along a substrate inplane direction for temperature range of from 25 degree C. to a glass transition point thereof is equal to or lower than 12 ppm/degree C., and an average coefficient of thermal expansion along a substrate thickness direction for temperature range of from 25 degree C. to a glass transition point thereof is preferably equal to or lower than 20 ppm/degree C. This allows reducing deformations of the core layers 32 along the substrate inplane direction and along the direction of the substrate thickness, when a thermal history is encountered for the first resin substrate 3 and the second resin substrate 5. This allows reducing the generations of warpages in the first resin substrate 3 and the second resin substrate 5 with further certainty.

Further, the resin spacer 6 is designed to have the buildup layers 61A and 61B and further, in the insulating layers 611 of the buildup layers 61A and 61B, an average coefficient of thermal expansion along an inplane direction for temperature range of from 25 degree C. to a glass transition point thereof is designed to be equal to or lower than 30 ppm/degree C., and an average coefficient of thermal expansion along a thickness direction for temperature range of from 25 degree C. to a glass transition point thereof is designed to be equal to or lower than 30 ppm/degree C., so that a reduced level of deformations of the resin spacer 6 can be achieved, when a thermal history is encountered for the semiconductor device 1. Further, in the insulating layer 621 in the core layer 62 of the resin spacer 6, an average coefficient of thermal expansion along an inplane direction for temperature range of from 25 degree C. to a glass transition point thereof is designed to be equal to or lower than 12 ppm/degree C., and an average coefficient of thermal expansion along a thickness direction for temperature range of from 25 degree C. to a glass transition point thereof is designed to be equal to or lower than 20 ppm/degree C. This allows a reduced level of deformations of the resin spacer 6, when a thermal history is encountered for the semiconductor device 1.

In addition, it may be considered that only a metallic bump, for example, is provided as a member for coupling the first resin substrate 3 to the resin spacer 6 and a member for coupling the second resin substrate 5 to the resin spacer 6. However, when only the metallic bump is provided, stress concentrates on the bump when the semiconductor device encounters a thermal history, resulting in generating a crack. This induces a conductive failure. On the contrary, in the present invention, the first adhesive member 7A having the first electric conductor 72A disposed in the first resin layer 71A is provided between the first resin substrate 3 and the resin spacer 6, and the second adhesive member 7B having the second electric conductor 72B disposed in the second resin layer 71B is provided between the resin spacer 6 and the second resin substrate 5. The first electric conductor 72A is provided to extend through the first resin layer 71A, and the periphery thereof is covered with the first resin layer 71A. Similarly, the second the second electric conductor 72B is provided to extend through the resin layer 71B, and the periphery thereof is covered with the second resin layer 71B. Therefore, the first electric conductor 72A and the second electric conductor 72B are reinforced with the first resin layer 71A and the second resin layer 71B, respectively, and stresses exerted to the first electric conductor 72A and the second electric conductor 72B are distributed to the first resin layer 71A and the second resin layer 71B, respectively, so that a generation of a crack in the first electric conductor 72A and in the second electric conductor 72B can be certainly prevented, thereby inhibiting a generation of a conductive failure in the semiconductor device 1.

Further, when only an electric conductor is disposed between the first resin substrate 3 and the resin spacer 6, a load of the resin spacer 6 is exerted on the electric conductor. On the contrary, in the present embodiment, the first electric conductor 72A is disposed in the first resin layer 71A, which serves as adhering the first resin substrate a with the resin spacer 6. The load from the resin spacer 6 can be distributed to the first resin layer 71A, in addition to the first electric conductor 72A, thereby reducing the load exerted to the first electric conductor 72A. In addition to above, similar advantageous effect can be obtained by disposing the second adhesive member 7B between the second resin substrate 5 and the resin spacer 6.

Further, in the present embodiment, the conductor interconnect layer 613 in the buildup layer 61B of the resin spacer 6 is coupled to the conductor interconnect layer 312 in the uppermost surface of the buildup layer 31A of the first resin substrate 3 through such solder region 72A. Further, the conductor interconnect layer 612 in the buildup layer 61A of the resin spacer 6 is coupled to the conductor interconnect layer 313 in the uppermost surface of the buildup layer 31B of the second resin substrate 5 through such solder region 72B. Therefore, metallic junctions may be formed between the solder region 72A and the conductor interconnect layer 312 of the first resin substrate 3 and between the solder region 72A and the conductor interconnect layer 613 of the resin spacer 6, and metallic junctions may be formed between the solder region 72B and the conductor interconnect layer 612 of the resin spacer 6 and between the solder region 72B and the conductor interconnect layer 313 of the second resin substrate 5. Therefore, a generation of a conductive failure between the resin spacer 6 and the first resin substrate 3 and a generation of a conductive failure between the resin spacer 6 and the second resin substrate 5 can be reduced, providing the semiconductor device 1 with an improved joint reliability.

Further, since the solder regions 72A and 72B are formed to have column-shape in the present embodiment, the regions can have relatively larger contact areas with the conductor interconnect layer 312 of the first resin substrate 3, with the conductor interconnect layers 612 and 613 of the resin spacer 6 and with the conductor interconnect layer 313 of the second resin substrate 5, thereby reducing the conductive resistance.

Further, since the adhesive tape containing a resin, solder powder and a curing agent exhibiting the flux activity is employed in the present embodiment, when the adhesive tape is heated while being disposed between the first resin substrate 3 and the resin spacer 6 and between the second resin substrate 5 and the resin spacer 6, the solder powder in the resin melts, migrating in a self-aligning manner onto the surface of the conductor interconnect layer 613 in the buildup layer 61B of the resin spacer 6 and the surface of the conductor interconnect layer 312 in the an uppermost surface of the buildup layer 31A of the first resin substrate 3, and further onto the surface of the conductor interconnect layer 612 in the buildup layer 61A of the resin spacer 6 and the surface of the conductor interconnect layer 313 in the lowermost layer of the buildup layer 31B of the second resin substrate 5, thereby forming metallic junctions. Therefore, even if portions of the surface of the conductor interconnect layers 613, 612, 313 and 312 are covered with the solder resist S, the conductor interconnect layers can be mutually coupled with a certainty.

Further, since the resin spacer 6 is formed to have a rectangular frame-shape and is disposed along all sides of the first resin substrate 3 in the present embodiment, the second resin substrate 5 can be stably supported, as compared with a configuration of providing the spacer in some side(s) of the first resin substrate 3.

Further, since the underfill U is selected to have an elastic modulus of within a range of from 150 MPa to 800 MPa in the present embodiment, the peripheries of the bumps B2 are firmly fixed, preventing a crack in the bumps B2.

Further, low dielectric constant films (Low-K layer) serving as interlayer dielectrics are used for the first semiconductor chip 2 and the second semiconductor chip 4. An average coefficient of thermal expansion of the underfill U for temperature range of from 25 degree C. to a glass transition point thereof is designed to be equal to or lower than 40 ppm/degree C., so that a reduced level of deformations of the underfill U can be achieved when a thermal history is encountered, thereby reducing a damage on the Low-K layers of the first semiconductor chip 2 and the second semiconductor chip 4.

Fourth Embodiment

Figure 18:
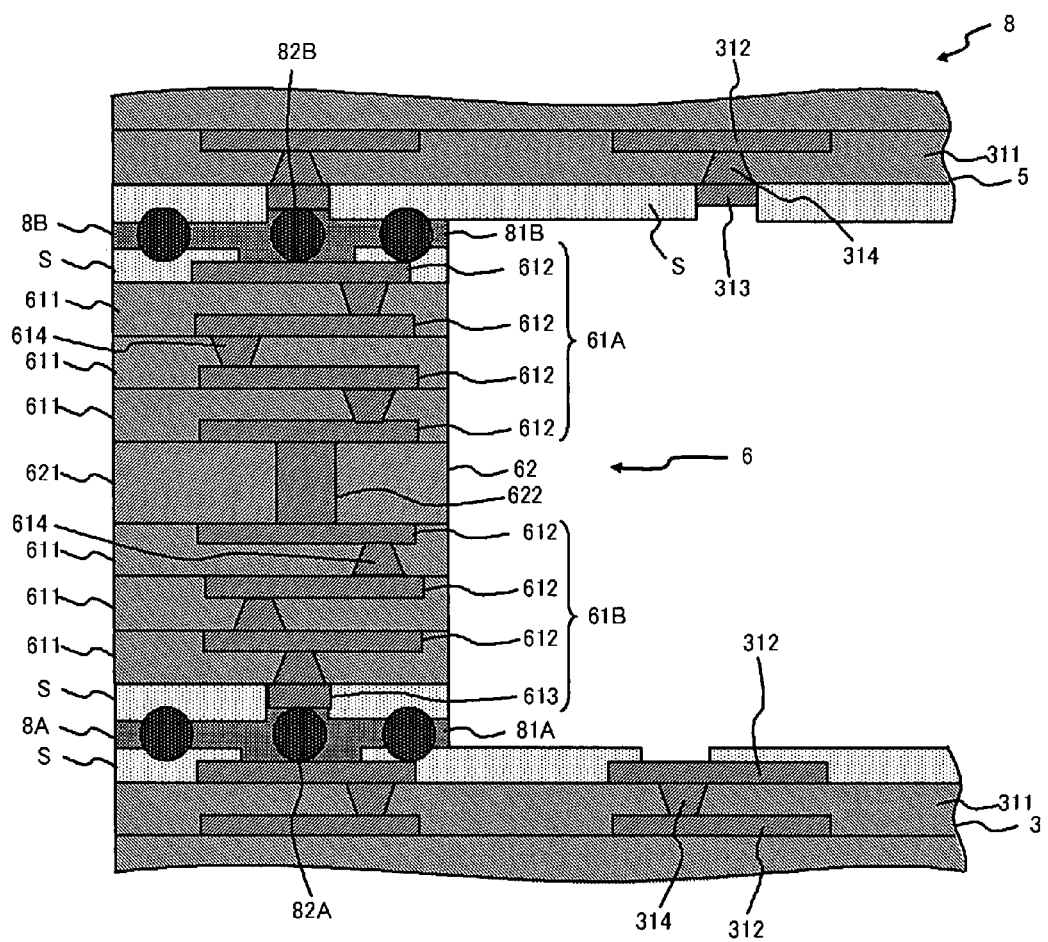
FIG. 18 is a cross-sectional view of a semiconductor device according to fourth embodiment of the present invention.

A semiconductor device 8 of the present embodiment will be described in reference to FIG. 18. Third embodiment is configured that the first adhesive member 7A and the second adhesive member 7B include the solder regions 72A and 72B, respectively. On the contrary, a semiconductor device 8 of the present embodiment includes a first adhesive member 8A, which has a first resin layer 81A, and conductive particles 82A, which are disposed in the first resin layer 81A and serve as a first electric conductor. The semiconductor device 8 of the present embodiment also includes a second adhesive member 8B, which has a second resin layer 81B, and conductive particles 82B, which are disposed in the second resin layer 81B and serve as a second electric conductor. The semiconductor device 8 has a configuration similar as for the semiconductor device 1, except that configurations of the respective adhesive members are different. The first adhesive member 8A serves as electrically coupling the resin spacer 6 to the first resin substrate 3. Adhesive tapes produced by dispersing conductive particles 82A in the first resin layer 81A or adhering the conductive particles 82A onto the surface of the first resin layer 81A or a liquid adhesive agent produced by dispersing the conductive particles 82A in the first resin layer 81A may be employed for the first adhesive member 8A. The first resin layer 81A is an insulating layer having an adhesive property, and provides an adhesion between the first resin substrate 3 and the resin spacer 6. The first resin layer 81A indirectly contacts with the first resin substrate 3 and the resin spacer 6 via the solder resist S. Here, the component of such first resin layer 81A is not particularly limited to any specific compound, and typically, a thermoplastic resin, a thermosetting resin, or a mixture of a thermoplastic resin and a thermosetting resin may be employed. For example, in consideration of the conductive resistance stability in the coupling between the resin spacer 6 and the first resin substrate 3 after experiencing a heat stress or a moisture absorption, a thermosetting resin, or a mixture of a thermoplastic resin and a thermosetting resin may be preferably employed. Further, taking the film-formability into account, a mixture of a thermoplastic resin and a thermosetting resin may be more preferably employed. Here, the thermosetting resin employed for the first resin layer 81A is not particularly limited to any specific resins, and typically epoxy resins, oxetane resins, phenolic resins, (meta) acrylate resins, unsaturated polyester resins, diallylphthalate resins, maleimide resins and the like are employed. Among these, epoxy resins and (meta) acrylate resins, which exhibits better cure-ability and better shelf life, and the cured material of which exhibits better thermal resistance, better moisture resistance and better chemical resistance, is preferably employed. Further, when a thermosetting resin is employed, a curing agent may be added. Such curing agent is not particularly limited to any specific compound, and typically an addition-polymerization type, an anionic-polymerization type, a cationic-polymerization type curing agents may be employed, when an epoxy resin or an oxetane resin is employed for the thermosetting resin. Among these, in consideration of a balance of cure-ability and shelf life, an anionic-polymerization type, a cationic-polymerization type curing agents may be preferably employed. Typically available anionic-polymerization type curing agent may be tertiary amines, and typically available cationic-polymerization type curing agent may be Lewis acids. Further, imidazole curing agents encapsulated in microcapsules, which is a latent curing agent exhibiting better adhesive property, cure-ability and shelf life, may be more preferably employed. For example, a microencapsulated imidazole-derived epoxy compound may be employed. Besides, when a (meta) acrylate resin, a maleimide resin or a diallylphthalate resin is employed, a heat radical initiator may be employed, though it is not particularly limited thereto. Among these, peroxide-based compounds or azo-based compounds, which exhibit better balance of cure-ability and shelf life, may be preferably employed.

Further, though it is not particularly limited to any specific compounds, the thermoplastic resin employed for the first resin layer 81A may be elastomers. For example, reactive elastomers such as phenoxy resins, polyester resins, polyurethane resins, polyimide resins, siloxane-modified polyimide resins, polybutadiene, polypropylene, styrene-butadiene-styrene copolymers, styrene-ethylene-butylene-styrene copolymers, polyacetal resins, polyvinylbutyral resins, polyvinylacetal resins, isobutylene-isoprene rubbers, chloroprene rubbers, polyamide resins, acrylonitrile-butadiene-copolymers, acrylonitrile-butadiene-acrylic acid copolymers, acrylonitrile-butadiene-styrene copolymers, poly vinylacetate, nylons, styrene-isoprene copolymer acrylic rubbers and the like may be employed alone, or a combination of two or more of the above elastomers may also be employed. In addition, the above-described thermoplastic resins may have nitrile group, epoxy group, hydroxyl group and/or carboxylic group, for the purpose of improving an adhesive property or a compatibility with other resin. An acrylic rubber, for example, may be employed for such resin.

In addition, an adhesiveness applying agent may be added to the first resin layer 81A, for the purpose of enhancing an adhesive property for an adherent object. The available adhesiveness-applying agent is not particularly limited to any specific compound, and typically, silane coupling agents, titanate-containing coupling agents, phosphate ester and the like may be employed. In addition, in order to improve the curability, the flowability during heating, and the workability of the first resin layer 81A, a reactive diluent may be employed for an insulating adhesive tape. The available reactive diluent, is not particularly limited to any specific compound, and typically an epoxy-based reactive diluent may be employed, when an epoxy resin or an oxetane resin is employed. On the other hand, when a (meta) acrylate resin, a maleimide resin or a diallylphthalate resin is employed, a (meta) acrylate resin-containing reactivity diluent may be employed. Further, for the purpose of enhancing a thermal resistance of the first resin layer 81A is to improve the joint reliability, an inorganic filler may be added. The inorganic filler is not particularly limited to any specific material, and typically, silica, Aerosil™ (fumed silica), calcium carbonate, zinc oxide, titanium oxide, barium sulfate, alumina and the like may be employed.

The conductive particles 82A serve as electrically coupling the resin spacer 6 to the first resin substrate 3. Such conductive particles 82A are not particularly limited to any specific material, and typically, a metallic particle, a resin core material, or a glass or ceramic core material, which is coated with an electroconductive material, may be employed. Typical metallic particles available here may be composed of various types of metallic materials such as nickel, iron, aluminum, tin, lead, chromium, cobalt, gold, silver and the like, metal alloys, metal oxides, carbon, graphite and the like. A polymer selected from a group consisting of epoxy resins, urethane resins, melamine resins, phenolic resins, acrylic resins, polyester resins, polystyrene resins, styrene-butadiene copolymers and the like may be employed for the resin core material. In addition, a combination of two or more of these polymers may also be employed. In addition, a metallic thin film coating may be exemplified as the available electroconductive material covering the core material, and typically, for example, a single element or a combination selected from gold, nickel, silver, copper, zinc, tin, indium, palladium, aluminum or the like may be employed. The thickness of the metallic thin film coating is not particularly limited, and for example, may be within a range of from 0.01 μm to 1 μm. Excessively thinner metallic thin film coating causes an unstable coupling with terminals, and excessively thicker coating easily causes an aggregation. In addition, the metallic thin film coating may be preferably applied uniformly onto the surface of the core material. Uniform coating eliminates an unevenness or a chipping of the coating, thereby achieving an improved electrical coupling.

The second adhesive member 8B serves as electrically coupling the resin spacer 6 to the second resin substrate 5. The similar configuration as employed for the first adhesive member 8A may also be employed for the second adhesive member 8B. More specifically, the similar material as employed for the first adhesive member 8A may also be employed for the material for the second resin layer 81B, and the similar particles as employed for the conductive particles 82A may also be employed for the conductive particles 82B serving as the second electric conductor. The second resin layer 81B is an insulating layer having an adhesive property, and provides an adhesion between the second resin substrate 5 and the resin spacer 6. The second resin layer 81B indirectly contacts with the second resin substrate 5 and the resin spacer 6 via the solder resist S. The second adhesive member 81B provides an electrical coupling between the resin spacer 6 and the second resin substrate 5.

Here, some of the conductive particles 82A of the first adhesive member 8A disposed between the resin spacer 6 and the first resin substrate 3 are disposed between the surface of the conductor interconnect layer 613 in the buildup layer 61B of the resin spacer 6 and the surface of the conductor interconnect layer 312 located in the uppermost surface of the buildup layer 31A of the first resin substrate 3. The surfaces of the conductive particles 82A directly contact with the surface of the conductor interconnect layer 613 of the resin spacer 6 and with the surface of the conductor interconnect layer 312 in the buildup layer 31A of the first resin substrate 3, so that the first resin substrate 3 is electrically connected to the resin spacer 6. In addition, other conductive particles 82A of the first adhesive member 8A disposed between the resin spacer 6 and the first resin substrate 3 are disposed between the solder resist S provided on the surface of the resin spacer 6 and the solder resist S provided on the surface of the first resin substrate 3. Further, the other conductive particles 82A are wedged into the solder resist S provided on the surface of the resin spacer 6b and the solder resist S provided on the surface of first resin substrate 3.

Similarly, some of the conductive particles 82B of the second adhesive member 8B disposed between the resin spacer 6 and the second resin substrate 5 are disposed between the surface of the conductor interconnect layer 612 in the buildup layer 61A of the resin spacer 6 and the surface of the conductor interconnect layer 313 located in the lowermost surface of the buildup layer 31B of the second resin substrate 5, and are in direct contact with the conductor interconnect layers 612 and 313. In addition, other conductive particles 82B of the second adhesive member 8B disposed between the resin spacer 6 and the second resin substrate 5 are disposed between the solder resist S provided on the surface of the resin spacer 6 and the solder resist S provided on the surface of the second resin substrate 5. Further, the other conductive particles 82B are wedged into the solder resist S provided on the surface of the resin spacer 6b and the solder resist S provided on the surface of second resin substrate 5.

Here, the mean particle diameter of the conductive particles 82A may be sufficient to be not smaller than a distance between the surface of the conductor interconnect layer 613 in the buildup layer 61B of the resin spacer 6 and the surface of the conductor interconnect layer 312 on the uppermost surface of the buildup layer 31A of the first resin substrate 3. Similarly, the mean particle diameter of the conductive particles 82B may be sufficient to be not smaller than a distance between the surface of the conductor interconnect layer 612 in the buildup layer 61A of the resin spacer 6 and the surface of the conductor interconnect layer 313 on the lowermost surface of the buildup layer 31B of the second resin substrate 5. Mean particle diameters of the conductive particles 82A and 82B may be measured by employing a wet particle size analyzer or a laser particle size analyzer and the like. Alternatively, the conductive particle 82A, 82B may be visibly observed via an electron microscope and the like, and then a mean particle diameter may be calculated. In addition to above, the conductive particles 82A and 82B are not limited to primary particles, and may be secondary aggregated particles.

Next, a method for manufacturing the semiconductor device 8 employing such first adhesive member 8A and the second adhesive member 8B will be described. The first resin substrate 3 on which the first semiconductor chip 2 is mounted, the second resin substrate 5 on which the second semiconductor chip 4 is mounted and the resin spacer 6 are manufactured by the methods similar as employed in the previous embodiments. Next, the first resin substrate 3, an adhesive tape constituting the first adhesive member 8A, the resin spacer 6, an adhesive tape constituting the second adhesive member 8B and the second resin substrate 5 are deposited in this sequence. Then, such multiple-layered material is subjected at a predetermined pressure, and is heated at a predetermined temperature. Heating of such multiple-layered material causes the resins in the resin layers 81A and 81B being melted, and pressurizing of such multiple-layered material causes the conductive particles 82A and 82B being depressed into the solder resist S. Further pressurizing of the multiple-layered material causes the conductive particles 82A and 82B being sandwiched between the conductor interconnect layers 312 and 613 and between the conductor interconnect layer 313 and 612. In addition to above, at the temperature for heating the multiple-layered material, it is preferable that the elastic modulus of the conductive particles 82A and 82B are higher than the elastic modulus of the solder resist S. Such configuration allows the conductive particles 82A and 82B being wedged into the solder resist S. Further, the glass transition point of the solder resist S may be preferably equal to or lower than the temperature for heating the multiple-layered material. If the glass transition point of the solder resist S is equal to or lower than the temperature for heating the multiple-layered material, it can be ensured that the conductive particles 82A and 82B be wedged into the solder resist S.

According to the present embodiment as described above, the following advantageous effects can be obtained, in addition to the advantageous effects substantially similar as in the aforementioned embodiments. In the present embodiment, the conductive particles 82A in the first adhesive member 8A are disposed to be wedged into the solder resist S provided on the surface of the resin spacer 6 and the solder resist S provided on the surface of the first resin substrate 3. Similarly, the conductive particles 82B in the second adhesive member 8B are disposed to be wedged into the solder resist S provided on the surface of the resin spacer 6 and the solder resist S provided on the surface of the second resin substrate 5. Therefore, a disturbance caused by the conductive particles 82A and 82B disposed between the solder resists S against the contacts of the conductive particles 82A and 82B disposed between the conductor interconnect layers 312 and 613 and between the conductor interconnect layers 313 and 612 with the conductor interconnect layers 312, 613, 313 and 612 can be prevented. This allows providing the semiconductor device 8 with an improved joint reliability.

Further, in the present embodiment, the conductor interconnect layers 312, 613, 313 and 612 are in contact with the conductive particles 82A and 82B to provide electrical conductions among the first resin substrate 3, the resin spacer 6 and the second resin substrate 5, and thus no metalized connection is formed between the conductor interconnect layers 312, 613, 313 and 612 and the conductive particles 82A and 82B, so that a rework can be conducted.

Fifth Embodiment

Figure 19:
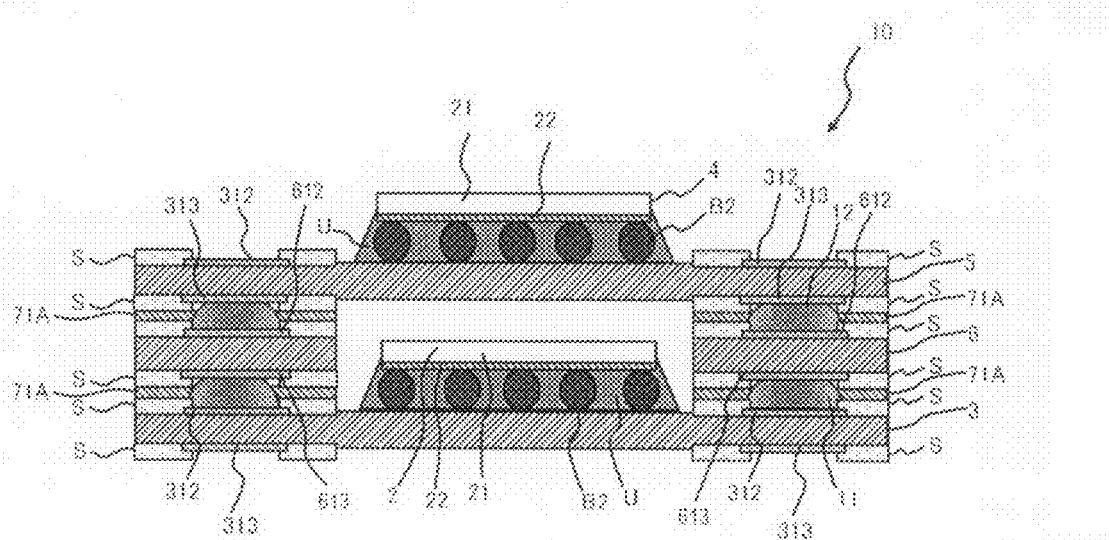
FIG. 19 is a cross-sectional view of a semiconductor device according to fifth embodiment.
Figure 20:
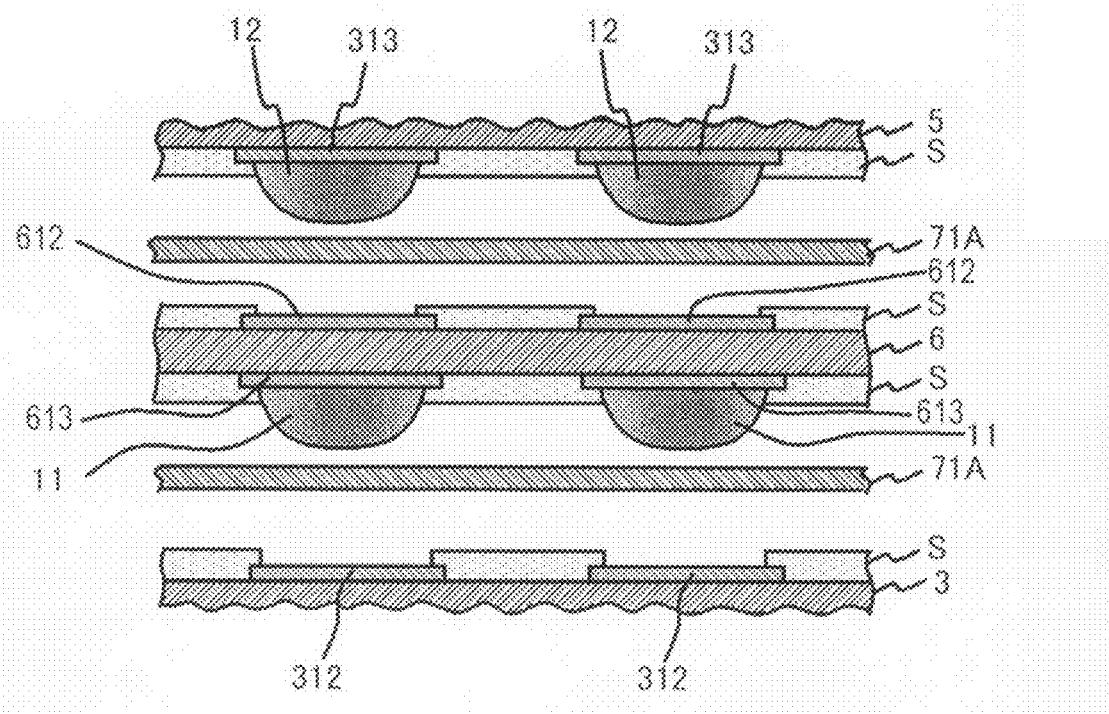
FIG. 20 is a diagram, illustrating a process for manufacturing a semiconductor device according to fifth embodiment.

A semiconductor device 10 of the present embodiment will be described, in reference to FIGS. 19 and 20. The adhesive tape containing the solder powder and the conductive particles 82A and 82B disposed within the resin layers 71A, 71B, 81A and 81B is employed for the adhesion between the resin spacer 6 and the first resin substrate 3 and the adhesion between the resin spacer 6 and the second resin substrate 5 in third embodiment and fourth embodiment. On the contrary, in the present embodiment, the resin spacer 6 is coupled to the first resin substrate 3 and the resin spacer 6 is coupled to the second resin substrate 5 via metallic bumps. Other aspects are similar to that of the aforementioned embodiments. As shown in FIG. 19, the conductor interconnect layer 613 of the resin spacer 6 is coupled to the conductor interconnect layer 312 of the first resin substrate 3 via a first metallic bump 11. Such multiple first bumps 11 are disposed along respective sides of the first resin substrate 3 and the resin spacer 6. Lead free solder, for example, may be employed for the first bump 11. Lead free solder is not particularly limited to any specific type, and is preferably an alloy containing at least two or more elements selected from the group consisting of tin (Sn), silver (Ag), bismuth(Bi), indium (In), zinc (Zn) and copper (Cu). Among these, in consideration of the melting temperature and the mechanical properties, it is preferable to employ an alloy containing Sn such as an alloy of Sn—Bi, an alloy of Sn—Ag—Cu, an alloy of Sn—In or the like. Alternatively, a solder-plated copper post may also be employed for the first bump 11. The periphery of such first bumps 11 are provided with the resin layer 71A so as to surround the first bump 11. More specifically, a condition that the first bumps 11 extend through the resin layer 71A is provided.

Further, the conductor interconnect layer 612 of the resin spacer 6 is coupled to the conductor interconnect layer 313 of the second resin substrate 5 via a second metallic bump 12. The second bumps 12 are disposed along respective sides of the resin spacer 6 and the second resin substrate 5. Such second bump 12 may be composed of the material similar to that for the first bump 11. The periphery of such second bumps 12 are provided with the resin layer 71A so as to surround the second bump 12. More specifically, a condition that the second bumps 12 extend through the resin layer 71A is provided.

Next, a method for manufacturing such semiconductor device 10 will be described. As shown in FIG. 20, the second bump 12 is provided in the conductor interconnect layer 313 of the second resin substrate 5. Next, the first bump 11 is provided in the conductor interconnect layer 613 of the resin spacer 6. Heights of the first bump 11 and the second bump 12 may be preferably, for example, within a range of from 3 μm to 300 μm. The thickness of equal to or smaller than 300 μm can provide an inhibition of a generation of a conductive failure with a certainty, when a thermal history is encountered for the semiconductor device 10. On the contrary, the thickness of equal to or larger than 3 μm can provide ensured coupling between the resin spacer 6 and the first resin substrate 3 and between the resin spacer 6 and the second resin substrate 5. Among these, the heights of the first bump 11 and the second bump 12 may preferably be equal to or larger than 45 μm. On the contrary, a distance between the first bump 11 and the second bump 12 is, for example, 300 μm.

Thereafter, an adhesive tape constituting the resin layer 71A is prepared. Such adhesive tape is similar as the adhesive tape of the aforementioned embodiments, except that no solder powder is contained. More specifically, it is preferable to contain a flux activity-compound having carboxylic group and/or phenolic hydroxyl group (curing agent exhibiting the flux activity), a thermosetting resin and a thermoplastic resin. Further, the aforementioned thermoplastic resin is preferably a phenoxy resin. The first resin substrate 3, the adhesive tape constituting the resin layer 71A, the resin spacer 6, the adhesive tape constituting the resin layer 71A and the second resin substrate 5 are stacked in this sequence, and then a thermocompression bonding is conducted. This allows the first bump 11 extending through the adhesive tape disposed between the first resin substrate 3 and the resin spacer 6, and also allows the second bump 12 extending through the aforementioned adhesive tape disposed between the second resin substrate 5 and the resin spacer 6. The semiconductor device 10 is obtained by such process.

In addition to above, the adhesive tape employed in the present embodiment is that when the adhesion tape is attached on a surface of an oxidization-processed copper sheet and a reduction-processing is carried out at 230 degree C. for one minute in an atmospheric air, a copper oxide-reduction rate of the copper sheet represented by the following formula (1) is equal to or higher than 70%. The flux activity compound has a reducing power for inducing a reduction of an oxide film on the conductor interconnect layer surface to remove such oxide film. The copper oxide-reduction rate, which is sufficient for removing the oxide film to prevent a generation of a coupling failure, is equal to or higher than 65%. Further, in consideration of enhancing a junction probability and a junction reliability in various environments after creating junction, it is preferable that the copper oxide-reduction rate is equal to or higher than 75%, and more preferably equal to or higher than 80%. On the contrary, it is preferable that a copper oxide-reduction rate is equal to or lower than 95%.

Here, the condition for the copper oxide reduction process (at 230 degree C. for one minute) will be described. Since a reduction effect of the compound exhibiting the flux activity for copper oxide exhibits at a temperature higher than a melting point of the compound exhibiting the flux activity, the copper oxide reduction temperature can be suitably changed by the chemical compound exhibiting the flux activity. On the contrary, it is preferable to employ lead free solder such as Sn/3.5Pb (221 degree C.), Sn-3.0Ag-0.5Cu (217 degree C.), Sn-58Bi (139 degree C.) and the like for the first bump 11 and the second bump 12. The melting points of most of these alloy are equal to or lower than 230 degree C. Therefore, in the present embodiment, the copper oxide reduction temperature of 230 degree C. is employed. Besides, the reduction time is selected to be one minute, in consideration of time required for melting the compound exhibiting the flux activity to wettability with a surface of copper oxide and then exhibiting a reduction effect, and also in consideration of a variation in the reduction effect.

A copper oxide (CuO) reduction rate is represented by the following formula (1), and can be acquired by the following manner:

(Definition)

copper oxide-reduction rate (%)=[1−(atomic concentration of oxygen (O) after reduction process)/(atomic concentration of oxygen (O) after oxidizing process)]×100   (Formula 1).

(Measurement Method)

(1) A copper sheet of having a thickness of 70 μm (commercially available from Mitsui Mining & Smelting Co., Ltd., 3EC-3, 2-3 μm thick) is soft-etched with a commercially available etchant solution.

(2) The soft-etched copper sheet is oxidizing-processed within an oven of an atmospheric air at 220 degree C. for 30 minutes.

(3) An adhesive tape of 25 μm thick is attached onto a surface of the oxidizing-processed copper sheet, and then is reduction-processed within an atmospheric air at 230 degree C. for one minute.

(4) Within 1 minute after the reduction process of the operation (3), the adhesive tape components existing on the surface of the reduction-processed copper sheet are removed with acetone.

(5) The copper sheet after the removal of the resin components is immediately transferred into a vacuum desiccator, and then a vacuum drying is conducted to dry the surface of the copper sheet. In addition, the copper sheet is stored under a condition of maintaining a vacuum atmosphere until an electron spectroscopy for chemical analysis (ESCA) measurement is conducted.

(6) 40 angstrom-thick surface portions of the copper sheet, which has been processed with only the oxidation process, and of the another copper sheet, which has been additionally reduction-treated, are removed via a plasma processing. Subsequently, atomic concentration of O and Cu are measured by ESCA (commercially available from ULVAC-PHI Inc.). The plasma-processing and the ESCA measurement are conducted within a vacuum atmosphere. The purpose of removing the 40 angstrom-thick surface portions of the copper sheets by the plasma-processing is to eliminate an influence of the oxidized surface during the handling in measurements.

In addition, ESCA measurement conditions employed here are as follows:
(i) Photoelectron-escaping angle: 45 degrees;
(ii) X-ray source: AlK α ray (monochrome);
(iii) Analysis range: 0.8 mm Φ.

(7) A copper oxide-reduction rate is calculated by the above formula (I).

According to the present embodiment as described above, the following advantageous effects can be obtained, in addition to the advantageous effects substantially similar as in the aforementioned embodiments. The resin spacer 6 is disposed between the first resin substrate 3 and the second resin substrate 5, and the first semiconductor chip 2 is mounted in the space section provided among the first resin substrate 3, the second resin substrate 5 and the resin spacer 6. While the first bump 11 for coupling the first resin substrate 3 to the resin spacer 6 and the second bump 12 for coupling the second resin substrate 5 to the resin spacer 6 are provided in the present embodiment, the space for disposing the first semiconductor chip 2 is formed with the resin spacer 6, such that it is not required to form the solder bumps to be thicker and larger than the first semiconductor chip, unlike the conventional configuration. This allows achieving a reduced differences in deformation volume between the first resin substrate 3 and the first bump 11 and between the second resin substrate 5 and the second bump 12 when a thermal history is encountered, thereby inhibiting a generation of a conductive failure in the semiconductor device.

Figure 21:
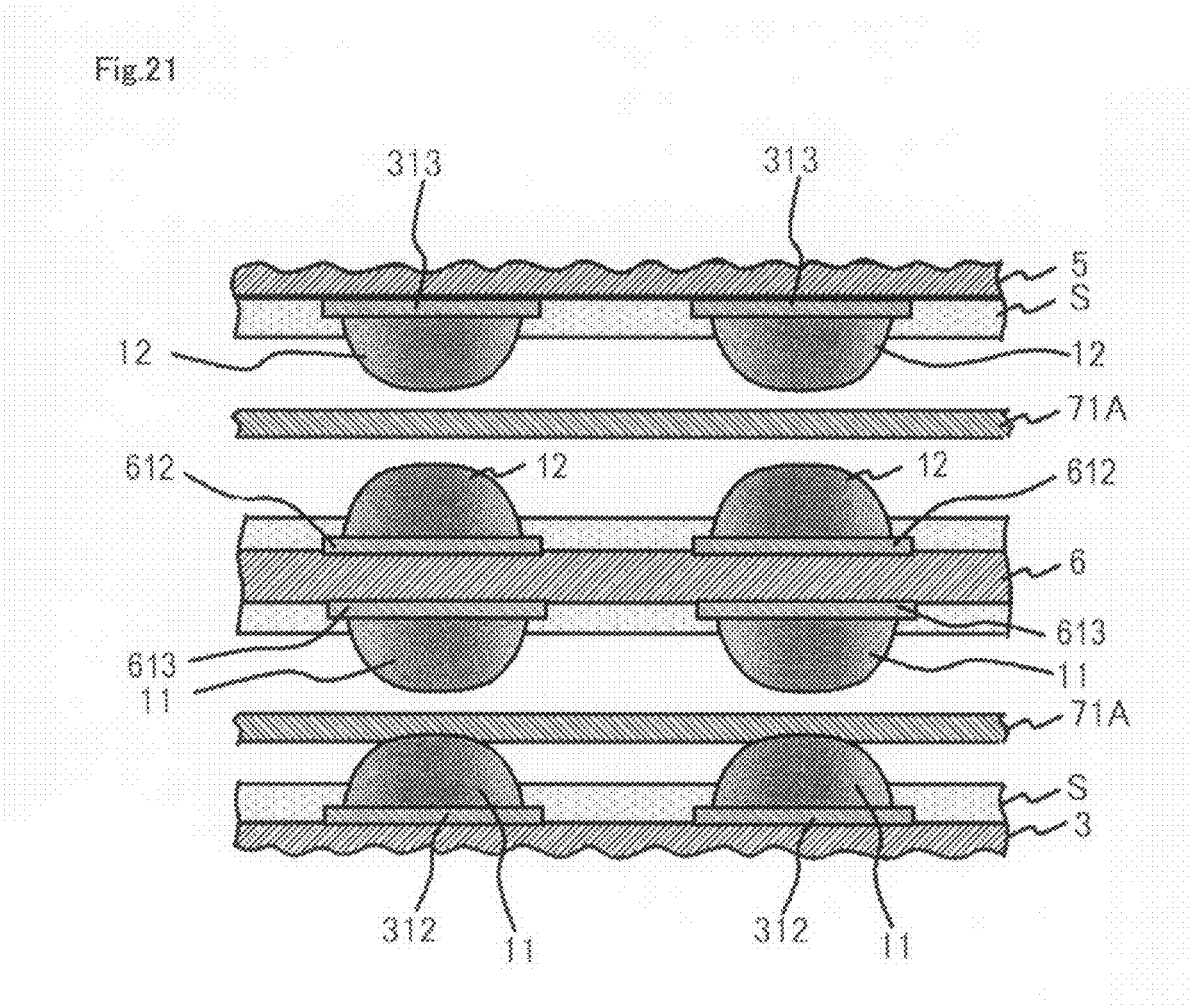
FIG. 21 is a diagram, illustrating a process for manufacturing a semiconductor device according to modified version of fifth embodiment.

While the first bump 11 for coupling the first resin substrate 3 to the resin spacer 6 is provided in the resin spacer 6 in the present embodiment, the configuration is not limited thereto, and as shown in FIG. 21, the first bumps 11 may be provided in both of the first resin substrate 3 and the resin spacer 6. Similarly, the second bumps 12 may be provided in both of the second resin substrate 5 and the resin spacer 6. Having such configuration, the coupling between the first resin substrate and the resin spacer and the coupling between the second resin substrate and the resin spacer can be stably established.

Sixth Embodiment

Figure 22:
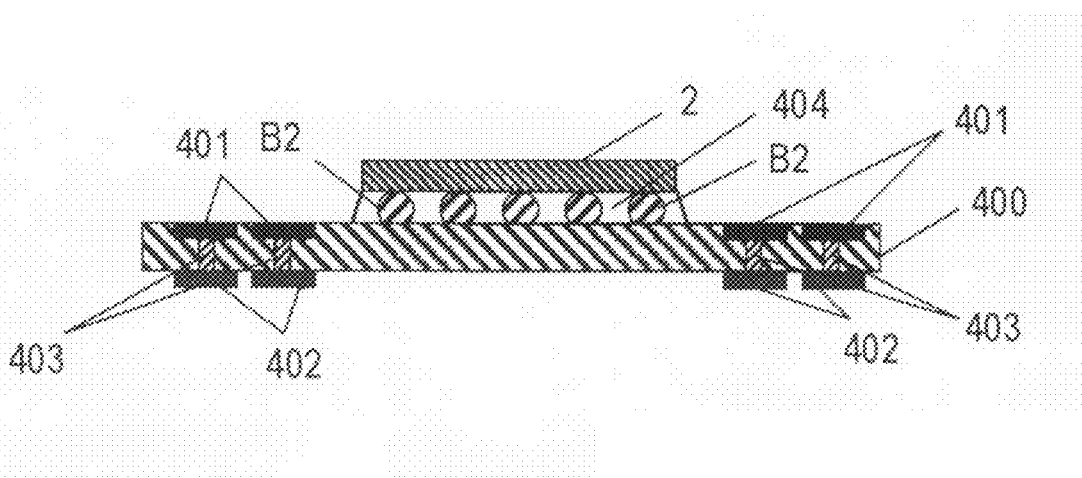
FIG. 22 is a cross-sectional view, illustrating an example of a first resin substrate in sixth embodiment.
Figure 23:
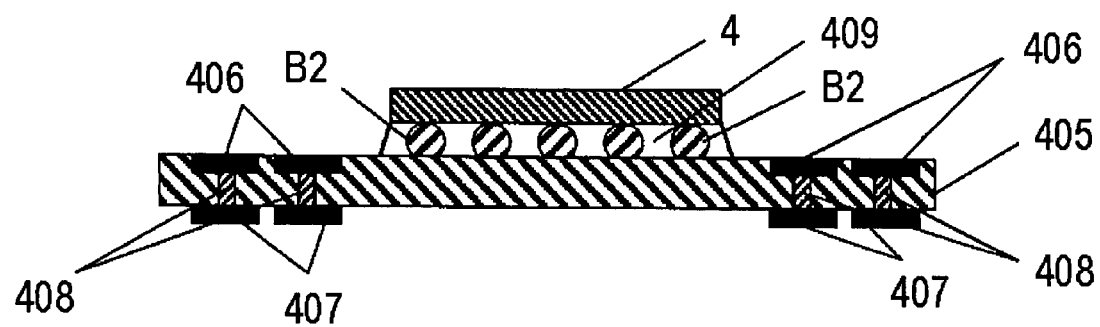
FIG. 23 is a cross-sectional view, illustrating an example of a second resin substrate in sixth embodiment.
Figure 24:
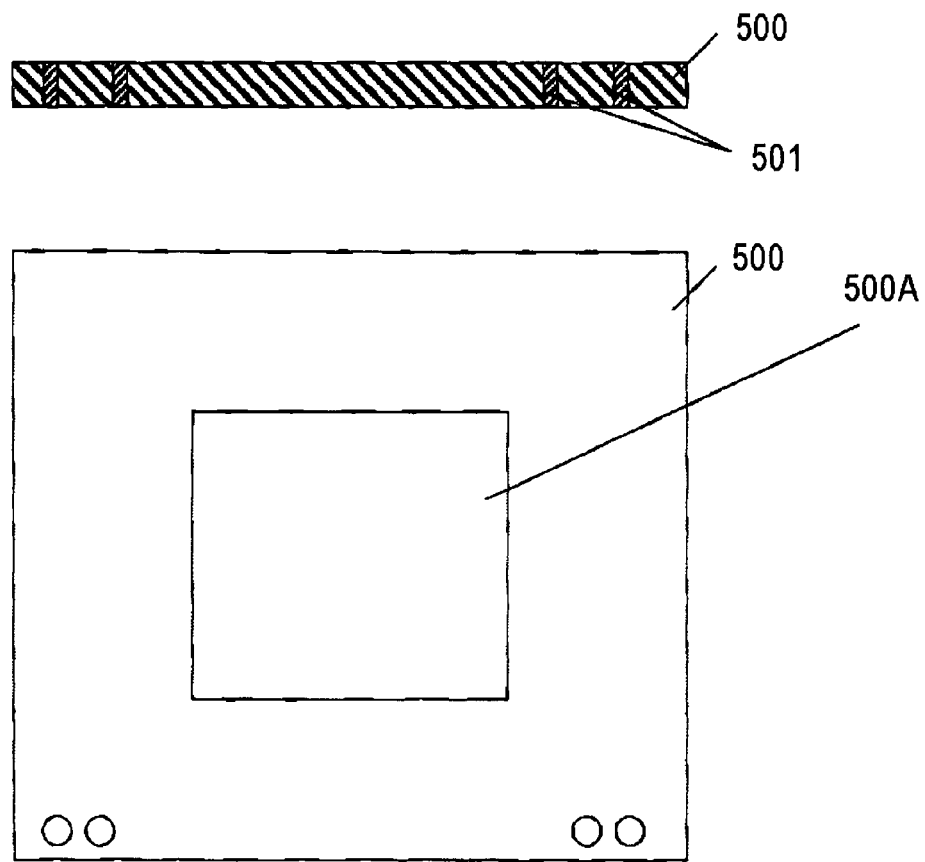
FIG. 24 is a plan view and a cross-sectional view, illustrating an example of a resin spacer in sixth embodiment.
Figure 25:
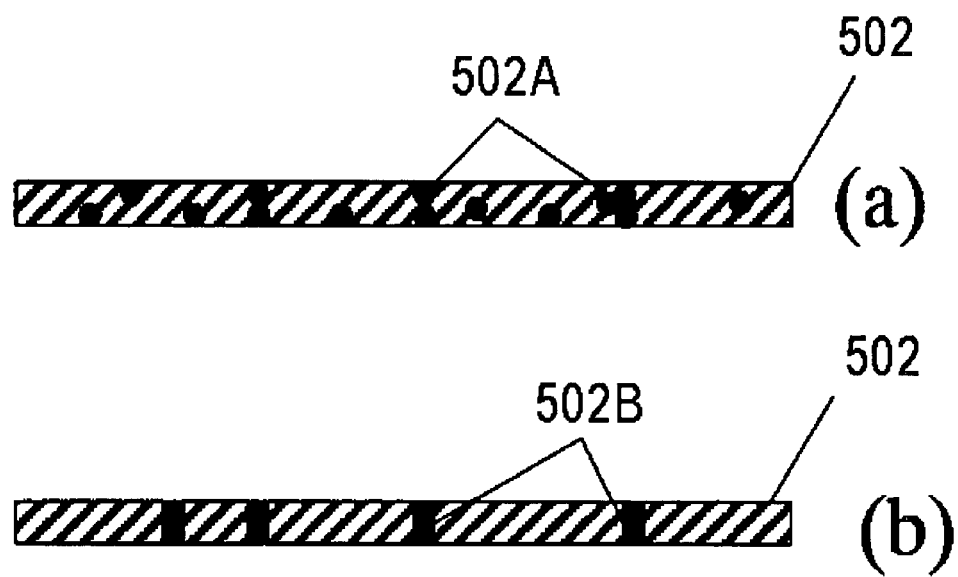
FIG. 25 is a cross-sectional view, schematically illustrating an adhesive film in sixth embodiment.
Figure 26:
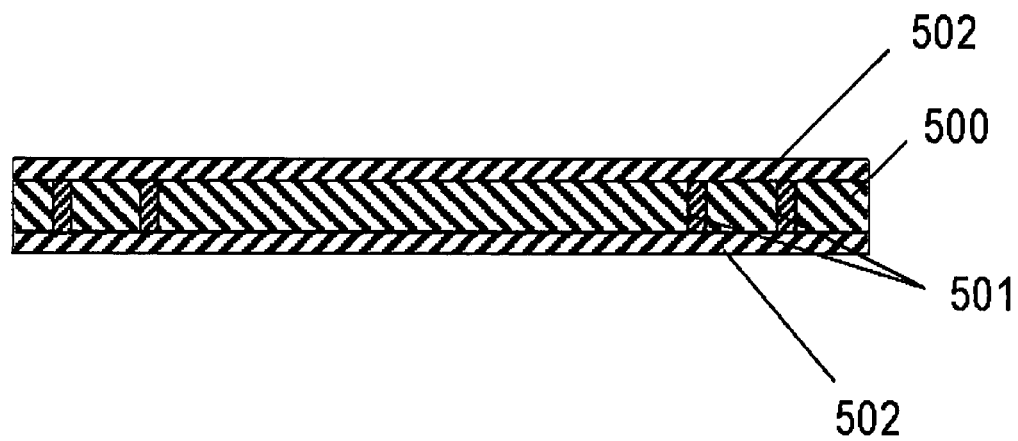
FIG. 26 is a cross-sectional view, illustrating a process for manufacturing a semiconductor device in sixth embodiment.
Figure 27:
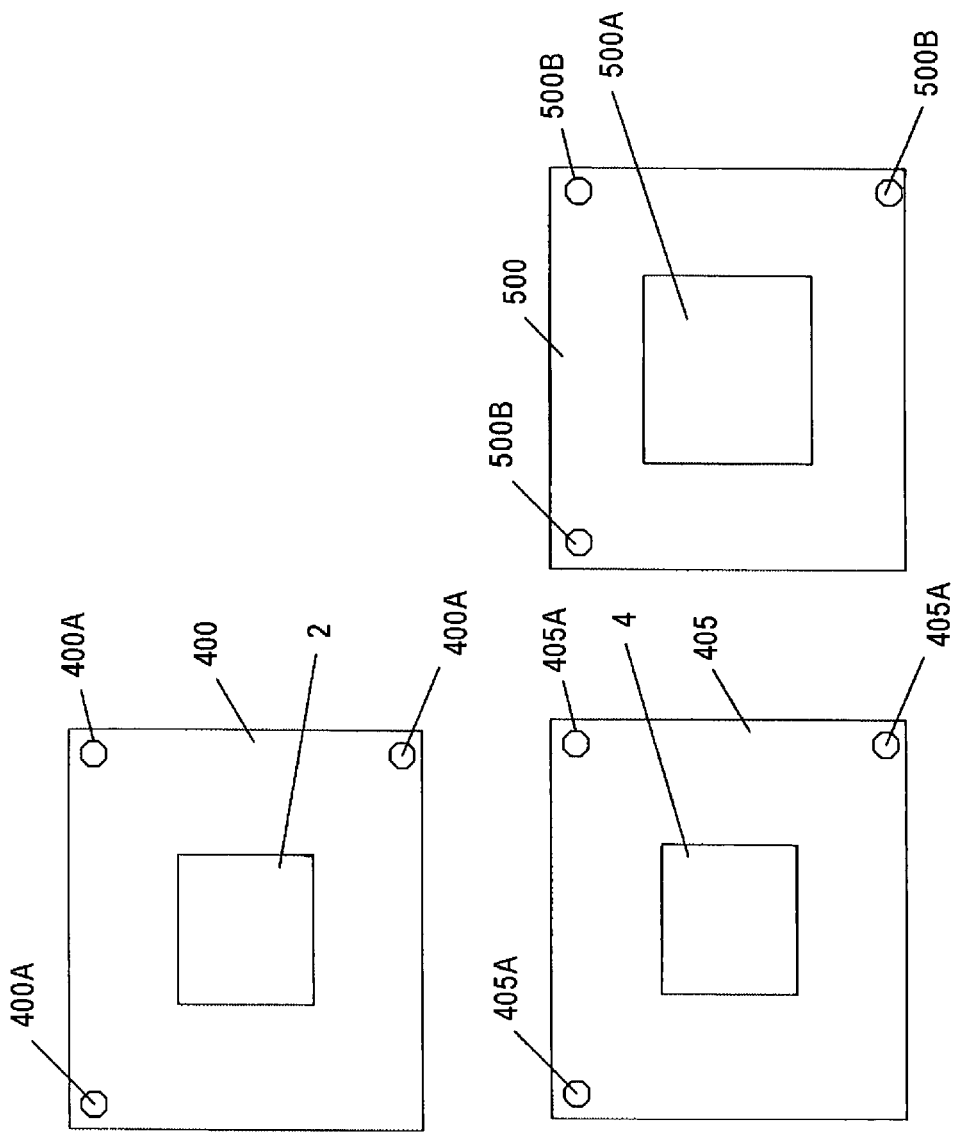
FIG. 27 is a plan view, illustrating a process for manufacturing a semiconductor device in sixth embodiment.
Figure 28:
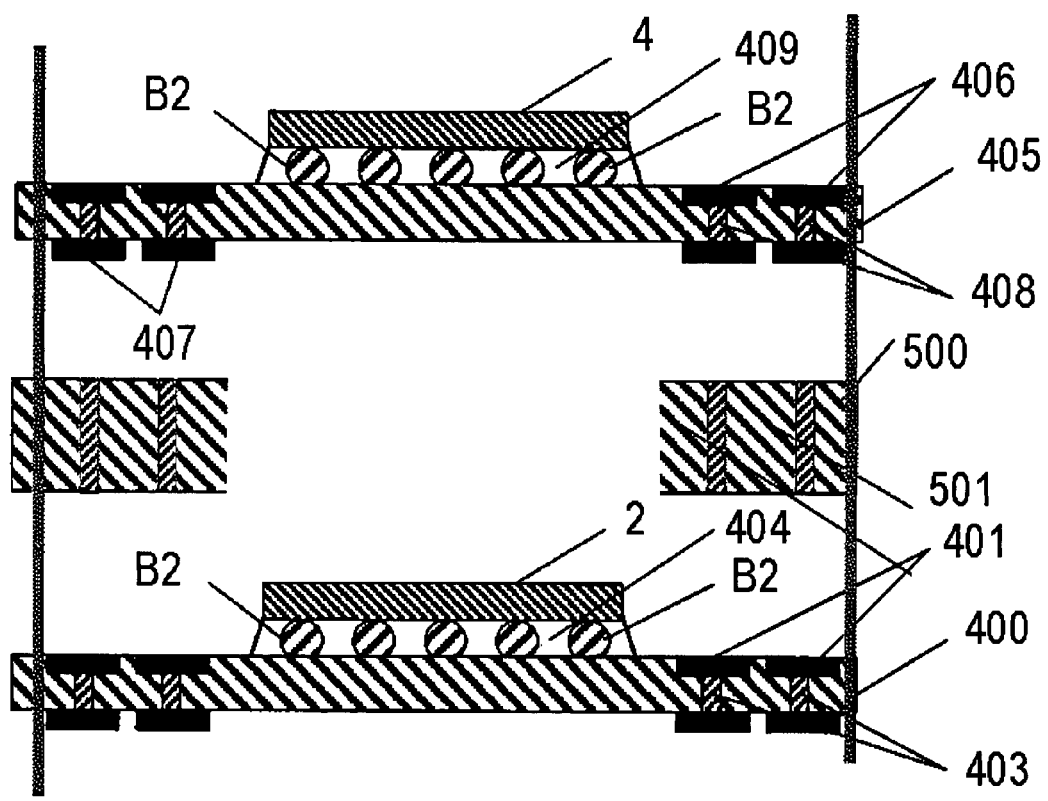
FIG. 28 is a plan view, illustrating a process for manufacturing a semiconductor device in sixth embodiment.
Figure 29:
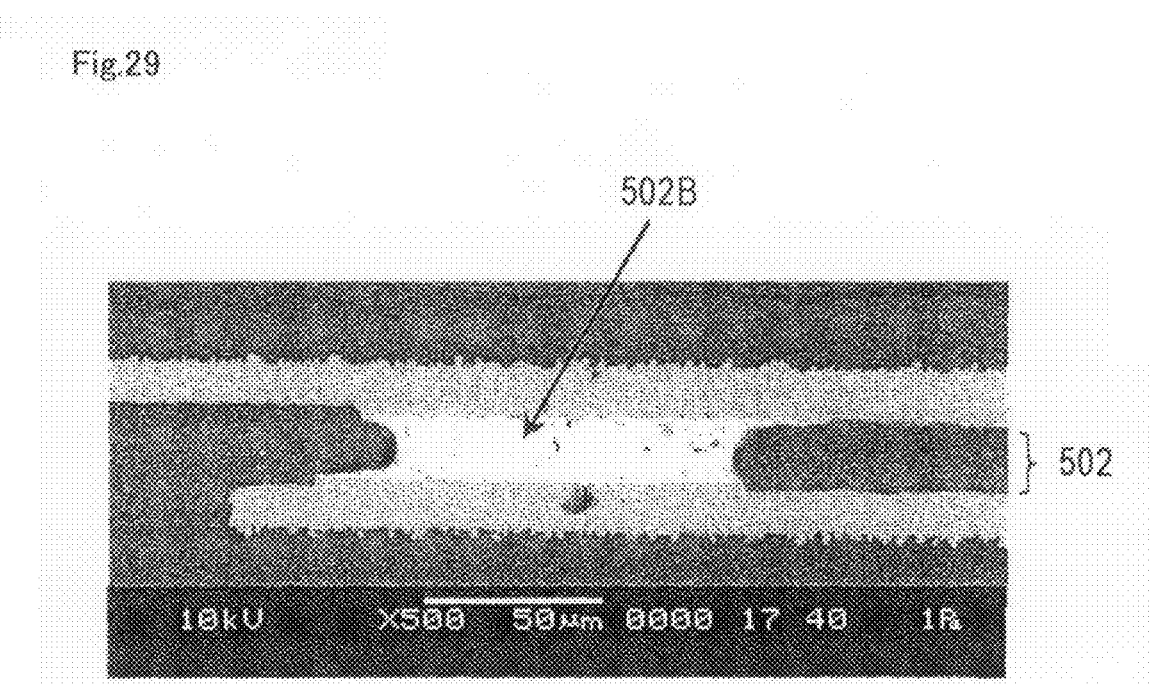
FIG. 29 is a view, showing a status, in which metallic particles dispersed in an adhesive film aggregates to form a conductor.
Figure 30:
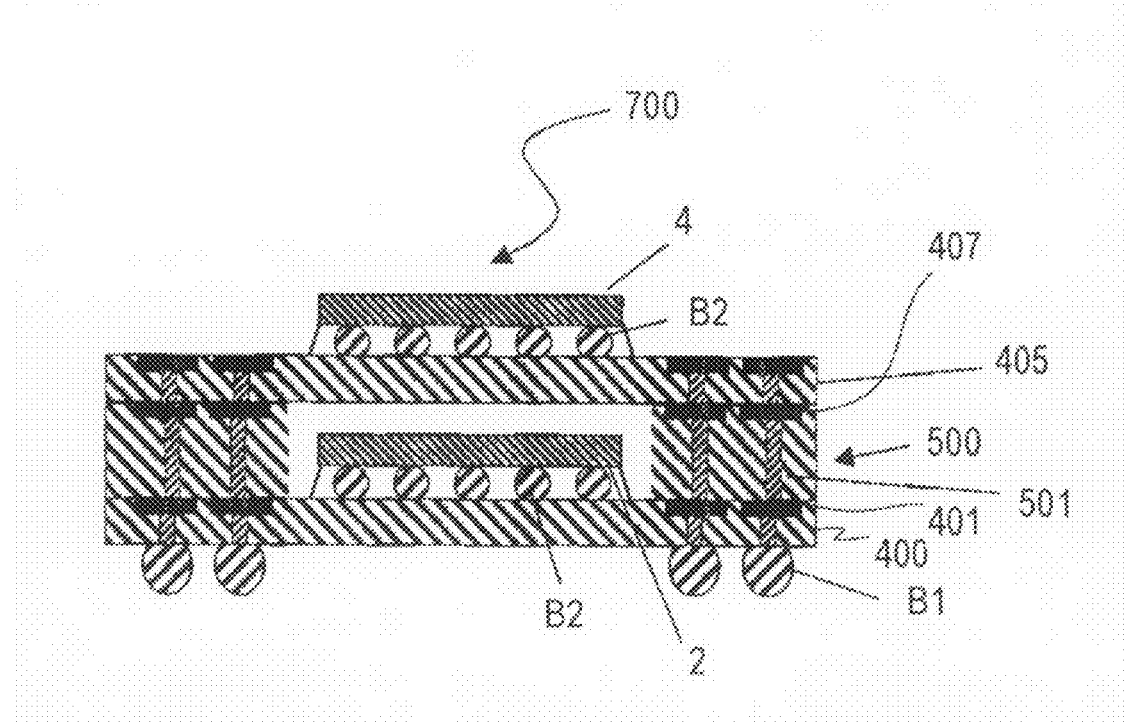
FIG. 30 is a cross-sectional view, illustrating an example of a semiconductor device in sixth embodiment.

The present embodiment will be described mainly on a method for manufacturing a semiconductor device. A method for manufacturing a semiconductor device includes depositing a second resin substrate on a first resin substrate on which a first semiconductor element (first semiconductor chip) is mounted, the second resin substrate being deposited on a side of the first resin substrate that the first the semiconductor element is mounted, and the second resin substrate on which a second semiconductor element is mounted, wherein a resin spacer is disposed between the first resin substrate and the second resin substrate, the resin spacer having a conductor extending through an interior thereof along a thickness direction, and then a thermo-compression bonding thereof are carried out to provide an electrically coupling between the first resin substrate and the second resin substrate via the conductor. FIG. 22 is a cross-sectional view, illustrating an example of the first resin substrate. FIG. 23 is a cross-sectional view, illustrating an example of the second resin substrate. FIG. 24 includes a plan view and a cross-sectional view, illustrating an example of the resin spacer. FIG. 25 includes cross-sectional views, schematically illustrating the adhesive film. FIG. 26 is a cross-sectional view, illustrating the manufacturing process of the semiconductor device. FIG. 27 includes plan views, illustrating the manufacturing process of the semiconductor device. FIG. 28 is a plan view, illustrating manufacturing process of a semiconductor device. FIG. 29 is an electron microscope photography, showing a condition of metallic particles dispersed in the adhesive film, which aggregate to form a conductor. FIG. 30 is a cross-sectional view, illustrating an example of a semiconductor device.

A preferable embodiment of a method for manufacturing semiconductor device will be described based on an annexed figures.

(First Resin Substrate and First Semiconductor Chip)

First of all, a first resin substrate (first substrate) 400 and a first semiconductor chip (first semiconductor device) 2 are prepared. A surface of the first resin substrate 400 in the upper side (upper surface in FIG. 22) is provided with the first semiconductor chip 2 mounted thereon, serving as a semiconductor element. The first resin substrate 400 is electrically connected to the first semiconductor chip 2 through the solder bumps B2, similarly as third to fifth embodiments. The periphery of the solder bumps B2 are filled with a first underfill materials 404. This allows providing an improved joint reliability between the first resin substrate 400 and the first semiconductor chip 2. The first resin substrate 400 is also provided with pad portions 401 and pad portions 402 on both sides of first resin substrate 400, which are capable of coupling with other electrode. In order to providing electrically couplings between the pad portions 401 and the pad portions 402, conductors (metallic posts) 403 are provided in the first resin substrate 400 so as to extend through the first resin substrate 400.

Typically available material for the first resin substrate 400 is, for example, a base material composed of a resin composition containing a thermosetting resin. This provides better heat resistance and lower water absorption. Typical thermosetting resins include, for example: novolac phenolic resins such as phenolic novolac resins, creosol novolac resins, bisphenol A novolac resins and the like; phenolic resins such as non-modified resol phenolic resins, resol phenolic resins typically as oil-modified resol phenolic resins that are modified with tung oil, flaxseed oil, walnut oil and the like; bisphenolic epoxy resins such as bisphenol A epoxy resins, bisphenol F epoxy resins and the like; novolac epoxy resins such as novolac epoxy resin, creosol novolac epoxy resin and the like; epoxy resins such as biphenyl epoxy resins and the like; resins having triazine ring such as urea resins, melamine resin and the like; unsaturated polyester resins; bismaleimide resins; polyurethane resins; diallylphthalate resins; silicone resin; resins having benzooxazine ring; cyanate (ester) resins; and the like. Among these, cyanate resins (in particular novolac cyanate resins) is preferable. This allows the first resin substrate 400 to exhibit lower thermal linear expansion.

The aforementioned "cyanate resins" is meant to include cyanate resins and prepolymers of cyanate resins. The aforementioned cyanate resin may be obtained by, for example, by reacting halogenated cyanide with a phenolic compound, and pre-polymerizing thereof, via heating as required. More specifically, typical cyanate resins include novolac cyanate resin, bisphenolic cyanate resin such as bisphenol-A cyanate resin, bisphenol-E cyanate resin, tetramethyl bisphenol-F cyanate resin and the like. Among these, it is preferable to employ a novolac cyanate resin. This allows an improved heat-resistant due to an increased cross linking density, and an improved flammability of the resin compositions. Novolac cyanate resin has benzene ring, which dominates the chemical structure at higher molecular proportion, and thus is easy to be carbonized.

The aforementioned novolac cyanate resins available here include for example, the compounds presented by formula (I) described above in the aforementioned embodiments.

Weight-average molecular weight of the aforementioned thermosetting resin is not particularly limited to any specific value, and weight-average molecular weight of 500 to 4,500 is preferable, and 600 to 3,000 is particularly preferable. The weight-average molecular weight of lower than the aforementioned lower limit of the range causes a tackiness when a prepreg is manufactured, which may lead to a mutual adhesion or a transfer of the resin when the prepregs are mutually contacted. On the contrary, the weight-average molecular weight of higher than the aforementioned upper limit of the range causes excessively faster reaction, which may lead to a failure in molding and a reduced inter-layer peeling resistance when this is formed to be a circuit board. The weight-average molecular weight of the aforementioned thermosetting resin may be measured with, for example, a gel permeation chromatography (GPC).

Content of the aforementioned thermosetting resin (particularly cyanate resin) is not particularly limited to any specific value, and is preferable to be 5 to 60% wt. of the whole resin compositions, and particularly 10 to 50% wt. is preferable. The content lower than the above-described lower limit may cause reduced effects for higher thermal resistance and lower thermal expansion, and the content higher than the above-described upper limit may cause higher cross linking density, increasing a free volume, thereby reducing a moisture resistance.

In addition, the aforementioned resin composition may preferably contain an inorganic filler. This allows further reduced thermal expansion. Typical inorganic fillers includes, for example: silicates such as talc, baked clay, non-baked clay, mica, glass and the like; oxides such as titanium oxide, alumina, silica, fused silica and the like; carbonates such as calcium carbonate, magnesium carbonate, hydrotalcite and the like; hydroxides such as aluminum hydroxide, magnesium hydroxide, calcium hydroxide and the like; sulfates or sulfites such as barium sulfate, calcium sulfate, calcium sulfite and the like; borates such as zinc borate, barium metaborate, boric acid aluminum, aluminum borate, calcium borate, sodium borate and the like; nitrides such as aluminum nitride, boron nitride, silicon nitride and the like. Among these, silica (in particular fused silica) is preferable. This allows a reduced thermal expansion while the electrical properties are maintained.

Mean particle diameter of the aforementioned inorganic filler is not particularly limited to any specific range, and is preferably 0.01 to 5.0 µm, and more preferably 0.2 to 2.0 µm. The particle diameter of the inorganic filler lower than the above-described lower limit provides an increased viscosity of a varnish, which may lead to adversely affecting a workability in manufacturing prepreg. On the contrary, the particle diameter higher than the above-described upper limit may cause a phenomenon of a sedimentation of the inorganic filler in the varnish.

Furthermore, spherical silica having mean particle diameter of equal to or smaller than 5.0 µm (in particular, spherical fused silica) is preferable, and in particular spherical silica having mean particle diameter of 0.01 to 2.0 µm are preferable. This allows an improved loading of the inorganic filler.

Content of the aforementioned inorganic filler is not particularly limited to any specific value, and is preferably 50 to 80% wt. of the whole resin compositions, and more preferably 60 to 70% wt. The content within the above range allows a lower thermal expansion and lower water absorption.

When a cyanate resin is employed for the aforementioned thermosetting resin, it is preferable to additionally employ a first resin exhibiting lower hygroscopicity than the aforementioned cyanate resin. This allows an improved resistance of hygroscopic. Specifically, it is preferable to employ an epoxy resin for the aforementioned first resin. The aforementioned epoxy resins typically include, for example, phenolic novolac epoxy resins, bisphenolic epoxy resins, naphthalene epoxy resins, aryl alkylene epoxy resins and the like. Among these, aryl alkylene epoxy resins are preferable. This allows an improved anti-solder crack reliability after soaking pretreatment.

The aforementioned aryl alkylene epoxy resin means an epoxy resin having one or more aryl alkylene group per a repeating unit. For example, xylylene epoxy resins, biphenyl dimethylene epoxy resins and the like are included. Among these, biphenyl dimethylene epoxy resins are preferable. Biphenyl dimethylene epoxy resins may be represented by, for example, formula (III).

Number of repeating unit "n" of biphenyl dimethylene epoxy resin presented in the above formula (III) is not particularly limited to any specific number, and is preferably 1 to 10, and in particular preferably 2 to 5. The number of repeating unit "n" lower than the above lower limit causes an easy crystallization of biphenyl dimethylene epoxy resin, leading to relatively reduced solubility for general-purpose solvents, so that a difficulty in handling may be caused. On the contrary, the number of repeating unit "n" of larger than the above upper limit causes a reduced flowability of the resin, so that a molding failure may be caused.

Content of the aforementioned first resin (in particular, epoxy resin) is not particularly limited to any specific value, and is preferably 1 to 55% wt. of the whole resin compositions, and is particularly preferably 2 to 40% wt. The content lower than the above lower limit may cause a deterioration in the reactivity of cyanate resin or a deterioration in the moisture resistance of the obtained product, and the content beyond the upper limit may cause a reduced thermal resistance.

The weight-average molecular weight of the first resin (in particular, epoxy resin) is not particularly limited to any specific value, and the weight-average molecular weight of 500 to 20,000 is preferable, and 800 to 15,000 is particularly preferable. The weight-average molecular weight of lower than the aforementioned lower limit of the range may cause a tackiness in the prepreg, and the weight-average molecular weight of higher than the aforementioned upper limit of the range may cause a reduced impregnation into the base material when a prepreg is manufactured, thereby failing to obtain uniform products. The weight-average molecular weight of the aforementioned first resin may be measured with, for example, a GPC.

When a cyanate resin is employed for the aforementioned thermosetting resin, it is preferable to additionally employ a phenolic resin. This allows controlling the reactivity of cyanate resin. Typical phenolic resins include, for example, novolac phenolic resins, resol phenolic resins, aryl alkylene phenolic resins and the like. Among these, aryl alkylene phenolic resins are preferable. This allows further improved anti-solder crack reliability after soaking pretreatment.

Typical aryl alkylene phenolic resins include, for example xylylene phenolic resins, biphenyl dimethylene phenolic res- Formula III

FORMULA (III)

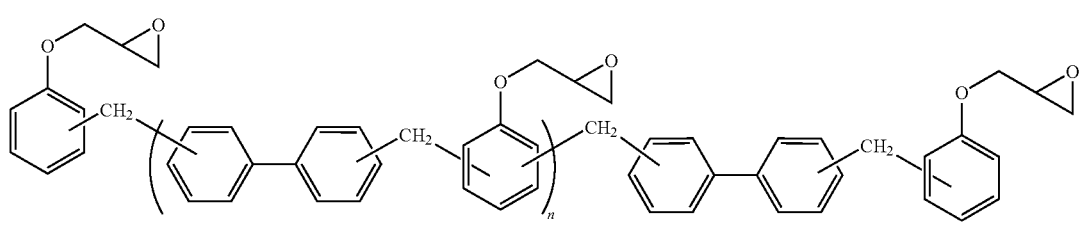

"n" IS AN ARBITRARY INTEGER NUMBER ins and the like. Biphenyl dimethylene phenolic resin may be represented by, for example, formula (IV).

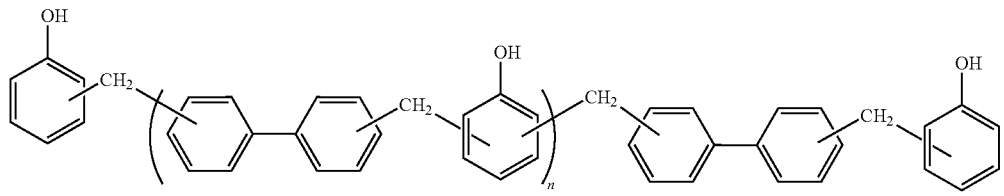

formula (IV)

"n" IS AN ARBITRARY INTEGER NUMBER

Number of repeating unit "n" of biphenyl dimethylene phenolic resin presented by with the above formula (IV) is not particularly limited to any specific number, and is preferably 1 to 12, and in particular preferably 2 to 8. The number of repeating unit "n" lower than the above lower limit may cause a reduced thermal resistance. On the contrary, the number of repeating unit "n" of larger than the above upper limit causes a reduced compatibility with other resins, thereby deteriorating a workability, and thus not preferable.

Content of the aforementioned phenolic resin is not particularly limited to any specific value, and is preferably 1 to 55% wt. of the whole resin compositions, and is particularly preferably 5 to 40% wt. The content lower than the above lower limit may cause a deterioration in the thermal resistance, and the content beyond the upper limit may cause a reduced property of low thermal expansion.

The weight-average molecular weight of the aforementioned phenolic resin is not particularly limited to any specific value, and the weight-average molecular weight of 400 to 18,000 is preferable, and 500 to 15,000 is particularly preferable. The weight-average molecular weight of lower than the aforementioned lower limit of the range may cause a tackiness in the prepreg, and the weight-average molecular weight of higher than the aforementioned upper limit of the range may cause a reduced impregnation into the base material when a prepreg is manufactured, thereby failing to obtain uniform products. The weight-average molecular weight of the aforementioned phenolic resin may be measured with, for example, a GPC.

A combination of the above-mentioned cyanate resin (in particular, novolac cyanate resin) and an aryl alkylene phenolic resin provides a control of cross linking density, thereby improving the adhesiveness between the metal and the resin.

Furthermore, when a printed circuit board is manufactured by employing a combination of the above-mentioned cyanate resin (in particular, novolac cyanate resin), a phenolic resin and an aryl alkylene epoxy resin (in particular, biphenyl dimethylene epoxy resin), particularly improved dimensional stability can be in obtained.

The aforementioned resin composition is not particularly limited to any specific resin, and it is preferable to contain a coupling agent. The above-described coupling agent provides an improved wettability in interfaces of the above-described thermosetting resin and the above-described inorganic filler, so that uniform cohesion of the thermosetting resin and the inorganic filler over the fiber base material or the like can be achieved, thereby providing an improved heat resistance, in particular, an improved anti-solder crack reliability after soaking pretreatment.

It is preferable to employ one or more coupling agent(s) selected from the group consisting of, for example, epoxysilane coupling agent, titanate-containing coupling agent, aminosilane coupling agent and silicone oil-containing coupling agent, for the above-described coupling agent. This allows particularly enhanced wettability of interface of the resin and the inorganic filler, thereby providing a further improved heat resistance.

Content of the above-described coupling agent is not particularly limited to any specific value, and it is preferable to be 0.05 to 3 parts by weight for the above-described inorganic filler of 100 parts by weight, and 0.1 to 2 parts by weight is particularly preferable. The content of lower than the above lower limit may cause an insufficient coverage for the inorganic filler, leading to deteriorating the advantageous effect of the improved heat resistance, and the content of higher than the above upper limit may adversely affect the reaction, leading to deteriorating a flexural strength or the like. The content of coupling agent within the above range provides better balance of both advantageous effects obtained by the use of the coupling agent.

Alternatively, the above-described resin composition may additionally contain other additives such as a cure accelerator, an antifoaming agent, a leveling agent, a pigment, an antioxidant agent and the like, as required, in addition to the components described above.

The first resin substrate 400 can be obtained by stacking one or more plies of a prepreg, which is formed by dissolving the resin composition as described above in a solvent to prepare a varnish, and then penetrating such varnish into a fiber base material. Alternatively, it can be also obtained by stacking one or more plies of a film, which is formed by applying the varnish on a support film. Typical fiber base materials include: glass fiber base materials such as glass cloth, non-woven glass fabric and the like; polyamide-containing resin fibers such as polyamide resin fiber, aromatic polyamide resin fiber, wholly aromatic polyamide resin fiber and the like; polyester-containing resin fibers such as polyester resin fiber, aromatic polyester resin fiber, wholly aromatic polyester resin fiber and the like; polyimide resin fibers; synthetic fiber base materials composed of a woven cloth or a non-woven fabric containing a fluorine resin fiber as a major constituent; organic fiber base materials such as kraft paper, cotton linter paper, paper base material containing mix paper of linter and kraft pulp as a major constituent and the like.

Thickness of such first resin substrate 400 is not particularly limited to any specific thickness, and 50 to 1,000 μm is preferable, and 100 to 500 μm is particularly preferable. The thickness within the above range provides a reduced thickness of the finished product of the semiconductor device.

Coefficient of thermal expansion along the thickness direction of the first resin substrate 400 is not particularly limited to any specific value, and 10 to 70 ppm is preferable, and 15 to 40 ppm is particularly preferable. That coefficient of thermal expansion within the above range provides a particularly improved joint reliability.

Coefficient of thermal expansion along the inplane direction of the first resin substrate 400 is not particularly limited to any specific value, and 5 to 30 ppm is preferable, and 10 to 15 ppm is particularly preferable. That coefficient of thermal expansion within the above range provides a particularly improved joint reliability.

The first semiconductor chip 2 mounted on the first resin substrate 400 as described above is similar to that employed in third to fifth embodiments, and typically includes chips that constitutes, for example, integrated circuit (IC), large scale integrated circuit (LSI), central processing unit (CPU), micro processing unit (MPU) and the like. A circuit that is not shown and is formed on the lower side of the first semiconductor chip 2 (lower side in FIG. 22) is electrically connected to a circuit that is not shown and is formed on the upper side the first resin substrate 400 (upper side in FIG. 22) through the solder bumps B2. The circuit formed above the first resin substrate 400 is electrically connected to the pad portion 401. On the other hand, the first resin substrate 400 also has conductor sections 403 that extend through thereof along the thickness direction, and the conductor sections 403 are electrically connected to the pad portions 402 formed on the back surface of the first resin substrate 400. This allows the circuit of the first semiconductor chip 2 transmitting and receiving signals with the pad portion 402.

Here, the dimension of the solder bumps B2 is not particularly limited to any specific value, and diameter of 50 to 500 μm is preferable, and 80 to 150 μm is particularly preferable. In addition, the distance between the solder bumps B2 is not particularly limited to any specific distance, and that distance of end to end of the solder bumps B2 is preferably 50 to 500 μm, and particularly preferable to be 70 to 150 μm.

The periphery of the solder bumps B2 is filled with the first underfill material 404 in order to improve the joint reliability. Materials similar as that employed for the underfill U in third embodiment may also be employed for the material constituting the first underfill material 404. More specifically, similarly as in third embodiment, a liquid thermosetting resin and a film thermosetting resin may be available. Among these, a liquid thermosetting resin is preferable. This allows gap between the first resin substrate 400 and the first semiconductor chip 2 being filled with an improved efficiency. In the present embodiment, the first underfill material 404 is constituted of a high modulus material. More specifically, when the bumps are of lead free solder, it is preferable to employ the material having an elastic modulus within a range of equal to or higher than 150 MPa, and more preferably equal to or higher than 200 MPa. On the contrary, when the bumps are of a solder having higher melting point, it is preferable to employ the material having an elastic modulus within a range of equal to or higher than 30 MPa, and more preferably equal to or higher than 45 MPa, for the first underfill materials 404. The upper limit of elastic modulus is not particularly limited to any value, and, for example, is 800 MPa or higher. By employing the resin material having an elastic modulus within such range, cracks in the bump periphery can be further inhibited.

Typical method for forming the first underfill material 404 includes a method of introducing a liquid adhesive material into the gap and then curing thereof, and a method for disposing sheet binding materials within the gap and then curing thereof.

The first underfill material 404 may preferably further contain an inorganic filler such as silica particles and the like, similarly as the underfill U of third embodiment. This allows reducing a coefficient of thermal expansion, thereby effectively reducing a damage on the semiconductor device.

The first underfill material 404 is not particularly limited to any specific material, and it is preferable to contain a coupling agent, similarly as the underfill U of third embodiment. This allows an improved adhesiveness among the bumps B2, the inorganic filler and the first underfill material 404, thereby reducing the coefficient of thermal expansion and more effectively reducing a damage on the first semiconductor chip 2 and the like. Similar compound as employed in third embodiment may be employed for the above-described coupling agent.

Coefficient of thermal expansion of the first underfill material 404 is not particularly limited to any specific value, and is preferably equal to or lower than 40 ppm/degree C., and is more preferably equal to or lower than 30 ppm/degree C., similarly as the underfill U of third embodiment.

(Second Resin Substrate and Second Semiconductor Chip)

Next, a second resin substrate 405 and a second semiconductor chip 4 are prepared. A surface of the second resin substrate 405 in the upper side (upper surface in FIG. 23) is provided with the second semiconductor chip 4 mounted thereon, serving as a semiconductor element. The second semiconductor chip 4 is electrically connected to the second resin substrate 405 through the solder bumps B2. The periphery of the solder bumps B2 are filled with a second underfill materials 409. This allows providing an improved joint reliability between the second resin substrate 405 and the second semiconductor chip 4. The second resin substrate 405 is provided with pad portions 406 and pad portions 407, which are capable of coupling with other electrode. In order to providing electrically couplings between the pad portions 406 and the pad portions 407, conductors (metallic posts) 408 are provided in the second resin substrate 405 so as to extend through the second resin substrate 405.

The second resin substrate 405 may be composed of a material, which is different from, or may be composed of the same material as, the material composing the first resin substrate 400, and is preferably composed of the same material. This allows reducing a difference in the coefficient of thermal expansion between the upper and lower portions of the semiconductor device, thereby reducing a warpage. Specifically, the same material as employed in the above-described first resin substrate 400 can also be employed for the material constituting the second resin substrate 405, and it is particularly preferable to employ cyanate resin (novolac cyanate resin).

Thickness of such second resin substrate 405 is not particularly limited to any specific thickness, and 50 to 1,000 μm is preferable, and 100 to 500 μm is particularly preferable. The thickness within the above range provides a reduced thickness of the finished product of the semiconductor device.

Coefficient of thermal expansion along the thickness direction of the second resin substrate 405 is not particularly limited to any specific value, and 10 to 70 ppm is preferable, and 15 to 40 ppm is particularly preferable. That coefficient of thermal expansion within the above range provides a particularly improved joint reliability.

Coefficient of thermal expansion along the inplane direction of the second resin substrate 405 is not particularly limited to any specific value, and 5 to 30 ppm is preferable, and 10 to 15 ppm is particularly preferable. That coefficient of thermal expansion within the above range provides a particularly improved joint reliability.

Further, the second semiconductor chip 4 employed here may be the same as, or may be different from the first semiconductor chip 2.

The second underfill material 409 disposed in the periphery of the solder bumps B2 may be composed of the first underfill material 404.

Coefficient of thermal expansion of the second underfill material 409 is not particularly limited to any specific value, and is preferably equal to or lower than 40 ppm/degree C., and is more preferably equal to or lower than 30 ppm/degree C. The coefficient of thermal expansion is within the above range, so that an inhibition of a damage on the Low-K layer, and an inhibition of a damage on the peripheral section of the bumps can be achieved.

A circuit that is not shown and is formed on the lower side of the second semiconductor chip 4 (lower side in FIG. 23) is electrically connected to a circuit that is not shown and is formed on the upper side of the second resin substrate 405 (upper side in FIG. 23) through the solder bumps B2. The circuit formed above the second resin substrate 405 is electrically connected to the pad portion 406. On the other hand, the second resin substrate 405 also has conductor sections 408 that extend through thereof along the thickness direction, and the conductor sections 408 are electrically connected to the pad portions 407 formed on the back surface of the second resin substrate 405. This allows the circuit of the second semiconductor chip 4 transmitting and receiving signals with the pad portion 407.

(Resin Spacer)

Next, the resin spacer is prepared. In the present embodiment, an example of employing a resin substrate 500 for the resin spacer will be described. The resin substrate 500 includes a space 500A that can house the first semiconductor chip 2 therein, similarly as each of the above embodiments, and this provides a configuration, in which the resin spacer (resin substrate 500) is disposed around the semiconductor chip. In the resin substrate 500, conductors (metallic posts) 501 for providing electrically couplings between the pad portion 401 of the first resin substrate 400 and the pad portion 407 of the second resin substrate 405 are provided as to extend through the resin substrate 500 along its thickness. The conductor 501 is formed by conducting a plating process for a through hole provided along the thickness direction of the resin substrate 500, and then filling the through hole with an non-conductive paste, an electroconductive paste or the like. A pattern of the conductor 501 corresponds to the pad portion 401 of the first resin substrate 400 and the pad portion 407 of the second resin substrate 405, respectively, and provides electrically couplings between the pad portions 401 and the pad portions 407, which are located the upper and the lower ends of the conductor 501, respectively, when the first resin substrate 400, the resin substrate 500 and the second resin substrate 405 are stacked.

Thickness of resin substrate 500 is not particularly limited to any specific value provided that the thickness allows housing the first semiconductor chip 2 (specifically, equal to or higher than a height from an upper surface of the first resin substrate 400 to an upper surface of the first semiconductor chip 2), and more specifically, 50 to 2,000 µm is preferable, and 200 to 1,000 µm is particularly preferable. The thickness within the above range particularly provides a reduced thickness of the finished product of the semiconductor device.

The material constituting the resin substrate 500 may be the same material as, or may be different from, the above-described material composing the first resin substrate 400 and the second resin substrate 405, and is preferably the same material. This allows reducing a warpage of the first resin substrate 400 and the second resin substrate 405, thereby providing an improved joint reliability. Specifically, the same material as employed in the above-described first resin substrate 400 and the second resin substrate 405 can also be employed for the material constituting the resin substrate 500, and among these, it is particularly preferable to employ cyanate resin (novolac cyanate resin).

Geometry of resin substrate 500 may be, in addition to the geometry having the space in the center as described above, a geometry of a horseshoe-shaped, in which a portion of the perimeter of the first semiconductor chip 2 is lacking, a geometry, in which rod-shaped resin substrates are disposed in two sides of the first semiconductor chip 2 facing each other, and the like.

(Adhesive Film)

In order to join the first resin substrate 400 with the resin substrate 500 and/or to join the second resin substrate 405 with the resin substrate 500, it is preferable to employ adhesive film (adhesive tape) 502 having an electroconductivity. This provides an electrical coupling between the first resin substrate 400 and the resin substrate 500 and/or between the second resin substrate 405 and the resin substrate 500, while better joint reliability of the semiconductor device is maintained. The adhesive film 502 is similar as the adhesive tapes of first to fourth embodiments, and is composed of resin components and conductive components. More specifically, the typical adhesive film includes an adhesive film containing the conductive particles 502A (anisotropic conductor adhesive film) (FIG. 25 a), an adhesive film containing metal fine particles such as solder powder dispersing therein, and the like (FIG. 25 b shows a condition of forming a conductor 502B by an aggregation of the metallic fine particles such as solder powder).

The resin composition constituting the adhesive film 502 is similar to the resin composition employed for the adhesive tape of third embodiment. For example, it is composed of a thermosetting resin such as an epoxy resin and a thermoplastic resin such as an acrylic resin. The thermosetting resins here typically include, for example, epoxy resins, oxetane resins, phenolic resins, (meta) acrylate resins, unsaturated polyester resins, diallylphthalate resins, maleimide resins or the like may be employed. Among these, epoxy resins are preferable. This allows providing an improved balancing of a cure-ability and a shelf life. Further, an improved heat resistance, moisture resistance and chemical resistance are also provided. In addition, for a chemical compound exhibiting a flux activity contained in the adhesive film 502 (curing agent), the same compound as employed in third embodiment may also be employed.

The above-described conductive component typically includes conductive particles and metallic fine particles. For the above-described conductive particles, the particles same as the conductive particles 82A described in fourth embodiment may be employed.

Typically, for example, the solder powder described third embodiment may be employed for the above-described metallic fine particles. Among various solder powders, a lead free solder is preferable. The aforementioned lead free solder may be an alloy containing at least two or more elements selected from the group consisting of Sn, Ag, Bi, In, Zn and Cu. Among these, in consideration of the melting temperature and the mechanical properties, it is preferable to employ an alloy containing Sn such as an alloy of Sn—Bi, an alloy of Sn—Ag—Cu, an alloy of Sn—In or the like.

The melting temperature, the particle diameter, and the content in the case of employing the solder powder as the above-described metallic fine particle are similar to that employed in third embodiment.

Metallic particles may be contained as the conductive component, and the content of the above-described metallic particles is preferably 20 to 250 parts by weight, provided that the total components except the metallic particles is assumed to be 100 parts by weight, and 60 to 200 parts by weight is particularly preferable.

In addition to above, a combination of the above-described metallic particles and the above-described metallic fine particles may also be available.

The above-described resin composition may additionally contains a curing agent, a curing catalyst, an antioxidant agent and the like. The above-described curing agent is not particularly limited to any specific compound, and typically phenolics, amines, thiols may be available, and in consideration of the reactivity and the physical properties of the cured product, phenolics may be preferably employed.

(Stacking Process)

First of all, as shown in FIG. 26, the adhesive films 502 are preliminary attached on both sides of the resin substrate 500 (here, the adhesive film 502 containing the solder fine particles as metallic fine particle dispersing therein is employed). Heating and compressively bonding processing is conducted at, for example, 50 to 150 degree C. for 1 to 10 seconds to adhere the adhesive films 502 onto the resin substrate 500. Typical method for adhering the adhesive film 502 to the resin substrate 500 includes, for example, a method of adhering with a roll laminate, a method of adhering with a thermocompression bonding press and the like. Next, through holes (400A, 405A, 500B) configured to be able to be inserted with pins as will be discussed later are formed in ends of the first resin substrate 400, the resin substrate 500 and the second resin substrate 405 (three places), respectively (FIG. 27). Then, as shown in FIG. 28, while the pins are inserted into the through holes (400A, 405A, 500B) to align these substrates, the first resin substrate 400, the resin substrate 500 and the second resin substrate 405 are stacked in this order to form a multiple-layered material. Then, a thermo-compression bonding is conducted from an upper and lower side of the multiple-layered material by employing hot plates. The condition for the thermo-compression bonding depends on the types of the resins constituting the employed first resin substrate 400, the resin substrate 500 and the second resin substrate 405 and the like, and for example, it is preferable to conduct the thermo-compression bonding at 150 to 250 degree C. for 10 to 600 sec at 0.01 to 10 MPa, and it is particularly preferable to conduct the thermo-compression bonding at 160 to 220 degree C. for 60 to 300 sec at 1 to 3 MPa. When the thermo-compression bonding with the pin laminate process is conducted as described above, an improved productivity and workability are achieved.

Here, when the adhesive film containing the metallic fine particles such as solder powder dispersing therein is employed for the adhesive film 502, the first resin substrate 400, the resin substrate 500 and the second resin substrate 405 are thermo-compression bonded, and an aggregation of the metallic fine particle (for example, solder powder) in the adhesive film 502 is preferably induced to form the conductor. This provides adhering the resin spacer to the substrate, and also provides an electrical coupling. For example, the operation of the thermo-compression bonding process as described above induces the aggregation of the metallic particles dispersing in the adhesive film 502 to form a conductor 502B shown in FIG. 29.

In this way, a semiconductor device 700 as shown in FIG. 30 can be obtained. The semiconductor device 700 includes the first resin substrate 400 having the first semiconductor chip 2 mounted thereon, the resin substrate 500 and the second resin substrate 405 having the second semiconductor chip 4 mounted thereon, which are stacked in this sequence. The resin substrate 500 includes the space 500A in the center, and the first semiconductor chip 2 is housed within a space formed by the first resin substrate 400, the space 500A of the resin substrate 500 and the second resin substrate 405. This provides a protection to the first semiconductor chip 2, eliminating a need for encapsulating the first semiconductor chip 2 with an encapsulating resin. The pad portion 401 in the upper portion (the upper side in FIG. 30) of first resin substrate 400 is joined to the conductor 501 of the resin substrate 500 so as to create an electrical coupling. In addition, the pad portion 407 in the lower portion (the bottom side in FIG. 30) of the second resin substrate 405 is joined to the conductor 501 of the resin substrate 500 so as to create an electrical coupling. The pad portion 402 in the lower portion of the first resin substrate 400 is provided with the solder bumps (solder balls) B1, which are joined to a mother board that is not shown.

A circuit that is not shown and is formed on the lower side of the first semiconductor chip 2 (lower side in FIG. 30) is electrically connected to a circuit that is not shown and is formed on the upper side of the first resin substrate 400 (upper side in FIG. 30) through the solder bumps B2. The circuit formed above the first resin substrate 400 is electrically connected to the pad portion 401. In addition, a circuit that is not shown and is formed on the lower side of the second semiconductor chip 4 (lower side surface in FIG. 30) is electrically connected to a circuit that is not shown and is formed on the upper side of the second resin substrate 405 (upper side in FIG. 30) through the solder bumps B2. The circuit formed above the second resin substrate 405 is electrically connected to the pad portion 406. In addition, the resin substrate 500 is provided with the conductors 501 formed therein, which provide electrical couplings between the pad portion 401 and the pad portion 407 through an adhesive film exhibiting an anisotropic conductivity that is not shown. In this way, the respective electrical couplings of the first semiconductor chip 2 an the second semiconductor chip 4 with substrates such as a mother board that is not shown. Then, these are joined to a mother board that is not shown via the solder balls B1 provided on the lower surface of first resin substrate 400 (bottom in FIG. 30).

A signal transmitted via the solder balls B1 from the mother board is transmitted through the conductors 403 of the first resin substrate 400 and a circuit that is not shown and is formed in the first resin substrate 400 and the like, and eventually is input into the first semiconductor chip 2. The above-described signal, which is processed in the first semiconductor chip 2, is transmitted through the similar path, and then is output to the mother board. Similarly, a signal transmitted via the solder balls B1 from the mother board is transmitted through the conductors 403 of the first resin substrate 400, the conductors 501 of the resin substrate 500, the conductors 408 of the second resin substrate 405 and a circuit that is not shown and is formed in the second resin substrate 405 and the like, and eventually is input into the second semiconductor chip 4. The above-described signal, which is processed in the second semiconductor chip 4, is transmitted through the similar path, and then is output to the mother board.

As such, the semiconductor device, which is obtained by the above-described method, exhibits the advantageous effects similar as in second to fourth embodiments. More specifically, since the resin spacer (resin substrate 500) is disposed between the first resin substrate 400 and the second resin substrate 405, warpages and the like are reduced, thereby providing an improved joint reliability. In particular, if the first resin substrate 400, the second resin substrate 405 and the resin substrate 500 are composed of the same resin material, mismatching of coefficient of thermal expansions can be particularly reduced, thereby further reducing the warpage.

Figure 31:
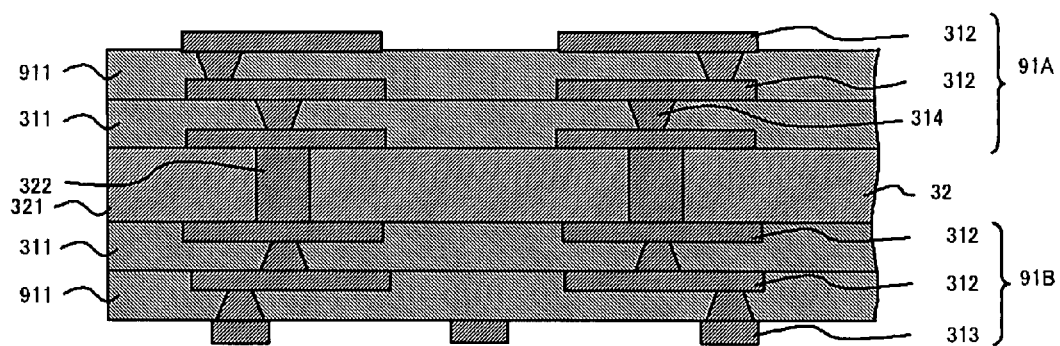
FIG. 31 is a cross-sectional view of a first resin substrate according to a modified embodiment of the present invention.
Figure 32:
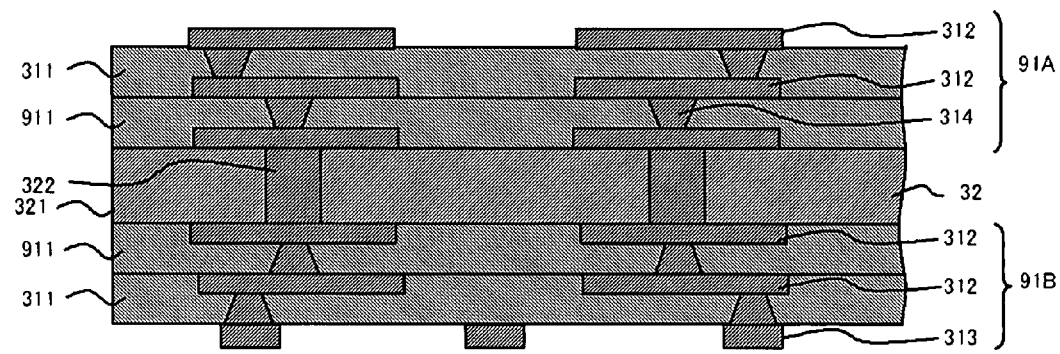
FIG. 32 is a cross-sectional view of a first resin substrate according to a modified embodiment of the present invention.

It is intended that the present invention are not limited to the configurations illustrated in the above-described embodiments, and thus various modifications thereof, provided that these can achieve the object of the present invention, should be construed as being included within the scope of the present invention. For example, while all the insulating layers 311 of the buildup layers 31A and 31B of the first resin substrate 3 are configured to exhibit the average coefficient of thermal expansion along a substrate inplane direction for temperature range of from 25 degree C. to a glass transition point thereof of equal to or lower than 30 ppm/degree C. and the average coefficient of thermal expansion along a substrate thickness direction of equal to or lower than 30 ppm/degree C. in third to fifth embodiments, the configuration is not limited thereto. For example, as shown in FIG. 31 and FIG. 32, each of the buildup layers 91A and 91B may include the insulating layer 311 having an average coefficient of thermal expansion along a substrate inplane direction for temperature range of from 25 degree C. to a glass transition point thereof is equal to or lower than 30 ppm/degree C., and an average coefficient of thermal expansion along a substrate thickness direction is equal to or lower than 30 ppm/degree C., and the insulating layer 911 having an average coefficient of thermal expansion along a substrate inplane direction for temperature range of from 25 degree C. to a glass transition point thereof is higher than 30 ppm/degree C. (for example, 60 ppm/degree C.), and an average coefficient of thermal expansion along a substrate thickness direction is higher than 30 ppm/degree C. (for example, 60 ppm/degree C.). In such configuration, it is preferable that the coefficients of thermal expansion of the insulating layers of the buildup layers disposed in substantially symmetric locations across the core layer 32 are mutually equivalent. Here, the equivalent coefficients of thermal expansion of the insulating layers of the buildup layer includes that a difference in coefficient of thermal expansion between the insulating layers disposed in the symmetric locations across the core layer is zero or equal to or lower than 5 ppm/degree C. As described above, coefficients of thermal expansion of the insulating layers disposed in the symmetric locations across the core layer 32 are selected to be mutually equivalent, so that a warpage of the insulating layer disposed across the core layer 32 is symmetrically generated. This allows inhibiting a generation of a warpage of the substrate. In the second resin substrate, the layer-structure similarly as shown in FIG. 31 and FIG. 32 may also be employed. In addition, in the resin spacer, the layer-structure similarly as shown in FIG. 31 and FIG. 32 may also be employed.

Further, while the first resin substrate and the second resin substrate are configured to have the respective core layers in the above-described first to fifth embodiments, the configuration is not limited thereto, and the substrate may alternatively be configured of only the buildup layer. By employing such substrate, the thickness of the semiconductor device can be reduced. In addition, while the insulating layer 321 of the core layers 32 is configured to exhibit the average coefficient of thermal expansion along a substrate inplane direction preferably is equal to or lower than 12 ppm/degree C. and the average coefficient of thermal expansion along a substrate thickness direction of equal to or lower than 20 ppm/degree C. in third embodiments, the configuration is not limited thereto. In addition, while it is configured that the insulating layers 311 and 611 are not reinforced with fibers in third to fifth embodiments, the configuration is not limited thereto, and the insulating layers 311 and 611 may alternatively be configured to contain glass fibers or the like. Having such configuration, further reduced average coefficient of thermal expansion the insulating layers 311 and 611 in a direction of the substrate thickness can be achieved.

Further, it is configured that coupling are provided by the solder bumps between the first resin substrate and the first semiconductor chip and between the second resin substrate and the second semiconductor chip in third to sixth embodiments, the configuration is not limited thereto, and the coupling may alternatively be provided via a bonding wire. Further, the semiconductor device having a pair of substrates and a pair of semiconductor chips, or more specifically, the device having two stacked semiconductor packages is illustrated in the respective aforementioned embodiments, the configuration is not limited thereto, and more than two semiconductor packages may also be stacked.

Figure 33:
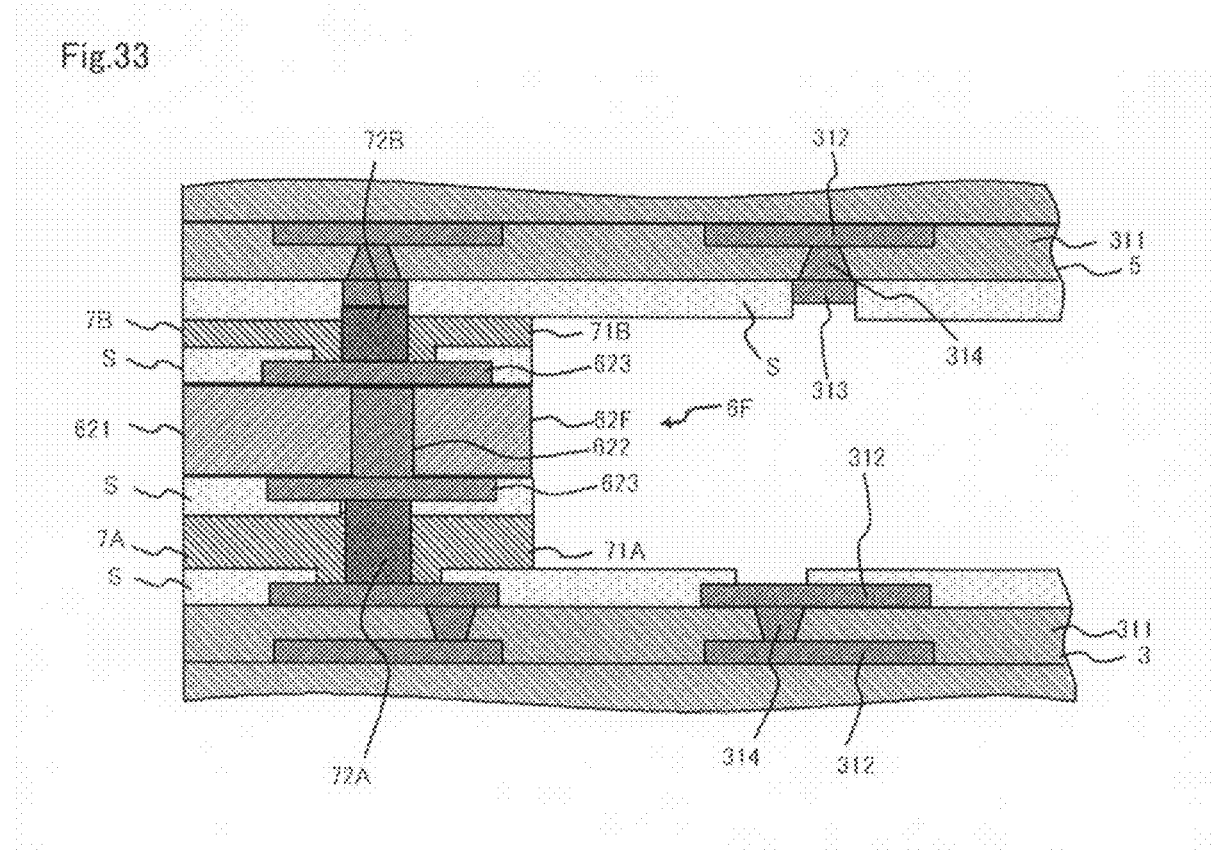
FIG. 33 is a cross-sectional view of a semiconductor device according to a modified embodiment of the present invention.

While the resin spacer is composed to have similar layer-structure and composed of similar substrate material to the first resin substrate and the second resin substrate in first to fifth embodiments, the configuration is not limited thereto, and for example, the resin spacer may be composed of a substrate having larger numbers of layers than the first resin substrate or the second resin substrate. Alternatively, for example, as shown in FIG. 33, a resin spacer 6F, which has no buildup layer and includes an insulating layer 621 and a pair of conductor interconnect layers 623 provided on the front and the back surfaces of such insulating layer 621, may alternatively be employed. The conductor interconnect layer 623 is composed of the material same as that employed for the conductor interconnect layer 312, and has the two-dimensional geometry same as the two-dimensional geometry of the conductor interconnect layer 312. Further, a resin spacer composed of a substrate material that is different from the first resin substrate and the second resin substrate may be employed.

In addition, while it is configured that the adhesive tape contains the curing agent exhibiting the flux activity in third to fifth embodiments, the configuration may alternatively include another chemical compound exhibiting a flux activity, which does not serve as a curing agent.

EXAMPLES

Examples 1 to 3, and Comparative Example 1

In the following examples and a comparative example, manufactures and evaluations of semiconductor devices, which are configured that the connection between the resin substrate and the chip in first embodiment was provided by a wire, were conducted.

(Manufacture of Multiple-Layered Material)

In the following examples, as shown in FIG. 2, the first semiconductor chip 125 and the second semiconductor chip 131 were mounted on the surfaces of the first resin substrate 101 and the second resin substrate 111, respectively, and then, a multiple-layered material having the first resin substrate 101, the adhesive layer 119, the resin base material 109, the adhesive layer 121 and the second resin substrate 111 stacked in this order from the underneath was manufactured. In addition to above, while the example having the bump electrodes 123 on the back surface of the first resin substrate 101 is illustrated in FIG. 2, the bump electrode 123 was not provided, and terminals for detecting a conductive resistance between the substrates were provided, in the following description of the present examples.

Materials of the first and the second resin substrates and the resin base material 109 employed in the respective examples and the comparative example are shown in table 1. Besides, FIG. 34 (a) to FIG. 34 (c) are diagrams, illustrating two-dimensional geometries of the resin base material 109 employed in each of examples and the First resin substrate 101 and the second resin substrate 111 employed in each of examples and comparative example.

Further, in the following examples and comparative example, the first and the second resin substrates are configured as follows:

Two-dimensional geometry (first resin substrate: FIG. 34 (a), second resin substrate: FIG. 34 (c))): square, 34 mm×34 mm;
Substrate thickness: 0.2 mm;
Copper foil (conductor interconnect layer): 12 μm thick;
Solder resist thickness (thickness from circuit upper surface): 12 μm;
Electrode pad for conduction in depositing direction: Ni/Au plating, Circuit width (diameter of opening of conductor interconnect layer)/circuit distance (distance between adjacent opening of conductor interconnect layer)=300 μm/300 μm; and
Circuit geometry (geometry of opening of conductor interconnect layer): circle.

Further, in the following examples, the resin base material 109 (spacer) is configured as follows:

Two-dimensional geometry (FIG. 34 (b)): a geometry formed by hollowing 20 mm×20 mm square of a central portion out from a substrate of 34 mm×34 mm square;
Substrate thickness: 0.4 mm;
Copper foil: 12 μm thick;
Solder resist thickness (thickness from circuit upper surface): 12 μm;
Electrode pad for conduction in depositing direction: Ni/Au plating, Circuit width (diameter of opening of conductor interconnect layer)/circuit distance (distance between adjacent opening of conductor interconnect layer)=300 μm/300 μm; and
Circuit geometry (geometry of an opening of a conductor interconnect layer):

Example 1

In the present example, in both of the first resin substrate 101 and the second resin substrate 111, "ELC4785GS" (commercially available from Sumitomo Bakelite Co., Ltd., cyanate resin impregnation substrate) was employed for cores, and "APL 3601" (commercially available from Sumitomo Bakelite Co., Ltd., cyanate resin impregnation substrate) was employed for built-ups.

In addition, for the resin spacer that is disposed between the substrates, "ELC4785GS" (commercially available from Sumitomo Bakelite Co., Ltd., cyanate resin impregnation substrate) was employed for core, and "APL 3601" (commercially available from Sumitomo Bakelite Co., Ltd., cyanate resin impregnation substrate) was employed for built-ups.

Adhesive tapes were sandwiched between the first resin substrate 101 and the resin base material 109 and between the resin base material 109 and the second resin substrate 111, and further, a silicone rubber of 200 μm thick was disposed on an upper surface of the second resin substrate 111, so as to uniformly exerting a pressure, and then a compressively bonding at 180 degree C. and 2 MPa for 100 seconds was conducted to achieved an adhesion thereof. For the adhesive tape, a tape of 45 μm thick and 2.0 mm wide containing a thermosetting insulating adhesive agent, which also contains a curing agent exhibiting a flux activity and solder powder (Sn42/Bi58, mean particle diameter=35 μm) dispersed therein, was employed. In addition, the adhesive tape was attached along the circumference of the first resin substrate 101 and the second resin substrate 111.

Example 2

A multiple-layered material was manufactured by employing the method of example 1, except that "ELC-4765" (commercially available from Sumitomo Bakelite Co., Ltd., FR-4 substrate) was employed as the material of the resin spacer 109.

Example 3

A multiple-layered material was manufactured by employing the method of example 1, except that "BT (bismaleimide triazine)" (commercially available from Mitsubishi Gas Chemical Co., Ltd., bismaleimide triazine resin impregnation substrate) was employed for the materials of the cores and the built-ups of the first and the second resin substrates and the resin spacer 109.

Comparative Example 1

A multiple-layered material was manufactured by employing the method of example 3, except that bump electrodes are employed in place of the spacer. Material of the bump electrode was Sn95/Ag3.0/Cu0.5. Bump electrodes were arranged on the first resin substrate along the circumference of the first resin substrate and were joined to the second resin substrate.

(Evaluation of Chip Crack)

An existence of a chip crack in the first semiconductor chips of the semiconductor devices obtained in the respective examples and the comparative example were examined by an observation with a scan acoustic tomograph (SAT), and a result of free of chip crack is indicated as "o", and a result of chip crack is indicated as "x". The results of the evaluation are shown in table 1.

(Evaluation of Conductive Failure)

Heat cycle tests at −55 degree C. for one hour and at 125 degree C. for one hour were conducted for the semiconductor devices obtained in the respective examples and the comparative example for 1,000 cycles. Conductive resistances between adjacent terminals provided on the back surface of first resin substrate 101 were measured before and after the heat cycle test for ten points via four-probe method. Spot exhibiting the conductive resistance after the cycle test, which was higher than 5 times of the conductive resistance before the cycle test, was counted as a conductive failure. Evaluation results are shown in table 1.

TABLE 1

| SUBSTRATE | STRUCTURAL COMPONENT | EXAMPLE 1 | EXAMPLE 2 | EXAMPLE 3 | COMPARATIVE EXAMPLE 1 |
|---|---|---|---|---|---|
| first resin substrate | core | ELC4785GS | ELC4785GS | BT | BT |
|  | build-up | APL3601 | APL3061 | BT | BT |
| second resin substrate | core | ELC4785GS | ELC4785GS | BT | BT |
|  | build-up | APL3601 | APL3601 | BT | BT |
| spacer (resin base material) | core | ELC4785GS | ELC4765 | BT | No spacer, coupling via bump electrodes |
|  | build-up | APL3601 |  | BT |  |
|  | chip crack | ○ | ○ | ○ | X |
|  | conductive failure | 0/10 | 0/10 | 0/10 | 10/10 |

ELC4785GS, APL3601 Sumitomo Bakelite, cyanate resin impregnation substrate
ELC4765 Sumitomo Bakelite, FR-4 substrate
BT Mitsubishi Gas Chemical, bismaleimide triazine resin impregnation substrate Examples 4 to 6, Comparative Example 2

In these examples, relationships among the average coefficient of thermal expansion, the conductive failure and the chip crack for the first resin substrate, the resin spacer, and the second resin substrate, and an influence of the type of the adhesive tape were evaluated.

Example 4

(Manufacture of a Multiple-Layered Material)

A semiconductor device having a structure similar to that of example 1 was manufactured. In addition to above, the back surface of the first resin substrate was provided with terminals for detecting a conductive resistance between the substrates, similarly as in example 1. In addition, in the present example, an adhesive tape of 2 mm-wide containing dispersed conductive particles produced by coating polymer core materials with Ni/Au plating (AUL-704, commercially available from Sekisui Chemical Co., Ltd.) was employed for adhesive tapes constituting the first adhesive member and the second adhesive member.

The first resin substrate and the second resin substrate were constituted with the similar layer-structure and the similar substrate material. More specifically, the first resin substrate and the second resin substrate include a buildup layer that is composed of alternately stacked three insulating layers and four conductor interconnect layers, and a core layer. In addition, the resin spacer has the structure shown in FIG. 33, and has no buildup layer, and is composed of only the core layer, which includes an insulating layer, and a pair of conductor interconnect layers. In table 2, resin components of the insulating layers in the buildup layer and the insulating layer in the core layer employed in the first resin substrate and the second resin substrate are shown. In addition to above, the insulating layer in the core layer of the resin spacer has the same resin component as employed for the insulating layer in the core layer employed in the first resin substrate and the second resin substrate. In addition, an average coefficient of thermal expansion of the insulating layer in the core layer of the resin spacer for temperature range of from 25 degree C. to a glass transition point thereof was the same as that for the insulating layer in the core layer employed in the first resin substrate and the second resin substrate. Further, the insulating layers of the core layers of the first resin substrate and the second resin substrate and the insulating layer of the core layer of the resin spacer contain glass clothes, and the insulating layers in the buildup layers of the first resin substrate and the second resin substrate does not contain a glass cloth.

TABLE 2

| | | PARTS BY WEIGHT | |
|---|---|---|---|
| RESINS | TRADE NAME ETC. | INSULATING LAYER IN CORE LAYER | INSULATING LAYER IN BUILD-UP LAYER |
| cyanate resins | Novolac cyanate resin, Lonza Co., "PRIMASET PT-30", weight average molecular weight (Mw) = 700 | 19.7 | 25 |
| epoxy resins | biphenyl dimethylene epoxy resin, Nihon Kayaku Co., "NC-3000", epoxy equivalent = 275, MW = 2,000 | 11 | 24.7 |
| phenoxy resins | copolymer of biphenyl epoxy resin and bisphenol S epoxy resin having epoxy group as terminating group, Japan Epoxy Resin Co.,, "YX-8100H30", Mw = 30,000 | | 10 |
| curing agent | biphenyl dimethylene phenol resin, Meiwa Plastic Industries Co., "MEH-7851-3H", hydroxyl equivalent = 230 | 9 | |
| curing catalyst | imidazole compound, Shikoku Chemicals Corporation, "1B2PZ", 1-benzyl-2-phenyl imidazole | | 0.1 |
| inorganic filler | spherical fused silica, Admatechs Co., "SO-25H", mean particle size = 0.5 µm | 60 | 40 |
| coupling agent | epoxy silane coupling agent, GE Toshiba Silicone Co., "A-187" | 0.3 | 0.2 |

Two-dimensional geometry, substrate thickness, conductor interconnect layer thickness, solder resist thickness, electrode pad, circuit width, circuit layout of the resin spacer employed in the present example and of the first resin substrate and the second resin substrate employed in the present example are same as employed in example 1.

Adhesive tapes were sandwiched between the first resin substrate and the resin spacer and between the resin spacer and the second resin substrate, and further, a silicone rubber of 200 μm thick was disposed on an upper surface of the second resin substrate, so as to uniformly exerting a pressure, and then a thermally compressively bonding at 220 degree C. and 2 MPa for 100 seconds was conducted to achieved an adhesion thereof. In addition, the adhesive tape was attached along the circumference of the first resin substrate and the second resin substrate.

Example 5

Resin components of the insulating layers in the buildup layer and the insulating layer in the core layer in the first resin substrate and the second resin substrate are shown as follows (table 3). Other conditions are similar to example 4. In addition to above, in this case, the insulating layer of the buildup layer also contained a glass cloth.

TABLE 3

| RESIN | PARTS BY WEIGHT |
| --- | --- |
| brominated bisphenol A epoxy resin, epoxy equivalent = 475, brominated rate = 21% | 90 |
| cresol novolac epoxy resin, epoxy equivalent = 210 | 10 |
| dicyan diamide | 2.5 |
| imidazole | 0.1 |

Example 6

An adhesive tape constituting an adhesive member containing a resin solder powder and a curing agent exhibiting a flux activity was employed, similarly as in third embodiment. Other conditions are similar to example 4. Components of the adhesive tapes are shown in table 4 (by unit of part by weight).

TABLE 4

| | FUNCTION | COMPONENT | STRUCTURE ETC. | EXAMPLE 3 |
| --- | --- | --- | --- | --- |
| FORMULATION | providing film-formability, reducing elastic modulus, cure component 1 | acrylic rubber | (butyl acrylate)-(ethyl acrylate)-(acrylonitrile) = 30 mol %/30 mol %/40 mol %, molecular weight = 850,000 | 25.9 |
| | | epoxy resin | see *1 | 24.5 |
| | cure component 2 | epoxy resin | cresol novolac epoxy resin, softening point (melting point) = 80 degree C. | 16.3 |
| | cure component 3 | epoxy resin | liquid bis F epoxy, epoxy equivalent = 170 | 7.5 |
| | curing agent | phenol novolac | softening point (melting point) = 100 degree C., OH equivalent = 104 | 20.2 |
| | improved adhesiveness 1 | silane coupling agent | 3-glycidoxy propyl trimethoxysilane | 0.1 |
| | improved adhesiveness 2 | silane coupling agent | N-phenyl-3-aminopropyl trimethoxysilane | 0.35 |
| | curing catalyst, | imidazole | 2-phenyl 4,5-dihydroxy imidazole | 0.15 |
| | curing agent exhibiting flux activity | sebacic acid | $HOOC-(CH_2)_8-COOH$ | 5.0 |
| | RESIN TOTAL | | | 100 |
| | conductive particles | solder powder | Sn/Bi = 42/58, melting point = 138 degree C. mean particle diameter = 35 μm | 60 |

*1: Mixture of 2-[4-(2,3,epoxypropoxy)phenyl]-2-[4[1,1-bis[4-(2,3-epoxypropoxy)phenyl]ethyl]phenyl]propane and 1,3-bis[4-[1-[4-(2,3epoxypropoxy)phenyl]-1-[4-[1-[4-(2,3epoxypropoxy)phenyl]-1-methyl]ethyl]phenyl]phenoxy]-2-propanol

Comparative Example 2

A "BT" substrate (commercially available from Mitsubishi Gas Chemical Co., Ltd., CCL-HL832HS Type HS) was employed for the core layers of the first resin substrate and the second resin substrate. In addition, ABFGX-13 (commercially available from Ajinomoto Co., Ltd.) was employed for the insulating layers in the buildup layers of the first resin substrate and the second resin substrate. Further, bump electrodes were employed in place of the resin spacer. Material of the bump electrode was Sn/Ag3.0/Cu0.5. The bump electrodes were arranged on the first resin substrate along the circumference of the first resin substrate and were joined to the second resin substrate. Since the bump electrodes were employed in comparative example 2, the first adhesive member and the second adhesive member are not employed. The others are the same as example 4.

(Average Coefficient of Thermal Expansion and Glass Transition Point)

The average coefficient of thermal expansion and the glass transition point of the insulating layer in the core layer, and the average coefficient of thermal expansion and the glass transition point of the insulating layer of the built-up layer of the first resin substrate, the average coefficient of thermal expansion and the glass transition point of the insulating layer in the core layer and the average coefficient of thermal expansion and the glass transition point of the insulating layer of the built-up layer of the second resin substrate, and the average coefficient of thermal expansion and the glass transition point of the insulating layer in the core layer of resin spacer, for examples 4 to 6 and comparative example 2, were measured. Measurement procedure for the average coefficient of thermal expansion and the glass transition point are same as described in the above-described embodiments.

(Evaluation of Chip Crack)

An existence of a chip crack was examined for the first semiconductor chips of the semiconductor devices obtained in the respective examples and the comparative example by an observation with a scan acoustic tomograph (SAT), and a result of free of chip crack is indicated as "o", and a result of chip crack is indicated as "x". The results of the evaluation are shown in table 5. Further, an existence of a chip crack was examined for the first semiconductor chips of the semiconductor devices obtained in the respective examples and the comparative example immediately after the manufacture of the semiconductor device was finished and after 1,000 cycles of the heat cycle test at −65 degree C. for one hour and at 150 degree C. for one hour were conducted by an observation with a scan acoustic tomograph (SAT), and a result of free of chip crack is indicated as "o", and a result of chip crack is indicated as "x". The results of the evaluation are shown in table 6.

(Evaluation of Conductive Failure)

Heat cycle tests at −55 degree C. for one hour and at 125 degree C. for one hour were conducted for the semiconductor devices obtained in the respective examples and the comparative example for 1,000 cycles. Conductive resistances between adjacent terminals provided on the back surface of first resin substrate were measured before and after the heat cycle test for ten points via four-probe method. Spot exhibiting the conductive resistance after the cycle test, which was higher than 5 times of the conductive resistance before the cycle test, was counted as a conductive failure. The results of the evaluation are shown in table 5. Further, heat cycle tests at −65 degree C. for one hour and at 150 degree C. for one hour were conducted for the semiconductor devices obtained in the respective examples and the comparative example for 1,000 cycles. Conductive resistances between adjacent terminals provided on the back surface of first resin substrate were measured before and after the heat cycle test for ten points via four-probe method. Spot exhibiting the conductive resistance after the cycle test, which was higher than 5 times of the conductive resistance before the cycle test, was counted as a conductive failure. The results of the evaluation are shown in table 6.

TABLE 5

| | | | AVERAGE COEFFICIENT OF THERMAL EXPANSION (along thickness) | AVERAGE COEFFICIENT OF THERMAL EXPANSION (along surface) | GLASS TRANSITION POINT | CHIP CRACK | CONDUCTION FAILURE |
|---|---|---|---|---|---|---|---|
| Example 4 | first resin substrate | insulating layer in buildup layer | 30 | 30 | 180 | o | 0/10 |
| | | insulating layer in core layer | 16 | 11 | 220 | | |
| | second resin substrate | insulating layer in buildup layer | 30 | 30 | 180 | | |
| | | insulating layer in core layer | 16 | 11 | 220 | | |
| | resin spacer | insulating layer in core layer | 16 | 11 | 220 | | |
| Example 5 | first resin substrate | insulating layer in buildup layer | 65 | 15 | 125 | o | 0/10 |
| | | insulating layer in core layer | 65 | 15 | 125 | | |
| | second resin substrate | insulating layer in buildup layer | 65 | 15 | 125 | | |
| | | insulating layer in core layer | 65 | 15 | 125 | | |
| | resin spacer | insulating layer in core layer | 16 | 11 | 220 | | |
| Example 6 | first resin substrate | insulating layer in buildup layer | 30 | 30 | 180 | o | 0/10 |
| | | insulating layer in core layer | 16 | 11 | 220 | | |
| | second resin substrate | insulating layer in buildup layer | 30 | 30 | 180 | | |
| | | insulating layer in core layer | 16 | 11 | 220 | | |
| | resin spacer | insulating layer in core layer | 16 | 11 | 220 | | |
| Comparative Example 2 | first resin substrate | insulating layer in buildup layer | 47 | 46 | 185 | X | 10/10 |
| | | insulating layer in core layer | 45 | 14 | 156 | | |
| | second resin substrate | insulating layer in buildup layer | 47 | 46 | 185 | | |
| | | insulating layer in core layer | 45 | 14 | 156 | | |

TABLE 6

| | CHIP CRACK | | |
| --- | --- | --- | --- |
| | IMMEDIATELY AFTER MANUFACTURE OF SEMICONDUCTOR DEVICE | AFTER 1,000 HEAT CYCLES | CONDUCTION FAILURE |
| Example 4 | o | o | 0/10 |
| Example 5 | o | x | 0/10 |
| Example 6 | o | o | 0/10 |
| Comparative Example 2 | x | x | 10/10 |

In examples 4 to 6, no conductive failure was generated in the heat cycle tests at −55 degree C. for one hour and at 125 degree C. for one hour. Further, no chip crack was generated. On the contrary, in comparative example 2, a chip crack was generated, and a conductive failure was also generated. Further, in examples 4 and 6, no chip crack was generated in the heat cycle tests at −65 degree C. for one hour and at 150 degree C. for one hour. On the contrary, in example 5 and in comparative example 2, a chip crack was generated after the heat cycle tests at −65 degree C. for one hour and at 150 degree C. for one hour. Further, in comparative example 2, a conductive failure was also generated after the heat cycle tests at −65 degree C. for one hour and at 150 degree C. for one hour. This shows that the average coefficient of thermal expansion of the insulating layer of equal to or lower than 30 ppm/degree C. is preferable.

Examples 7 and 8

Here, the semiconductor devices same as employed in fifth embodiment were manufactured.

(Manufacture of Adhesive Tape)

20 parts by weight of phenoxy resin (YL6954, commercially available from Japan Epoxy Resin Co., Ltd), 40 parts by weight of liquid bisphenol A epoxy resin (EPICLON 840S, commercially available from Dainippon Ink and Chemical Co., Ltd), 20 parts by weight of phenolic novolac resin (PR-53467, commercially available from Sumitomo Bakelite Co., Ltd), and 20 parts by weight of phenolphthalin (commercially available from Tokyo Chemical Industry Co., Ltd) serving as a curing agent exhibiting a flux activity were dissolved in methyl ethyl ketone to obtain a varnish, and the obtained varnish was applied on a polyester sheet, and then was dried at a temperature that can achieve vaporizing the above-described solvent to obtain an adhesive tape of 25 μm thick. Copper oxide (CuO) rate of reduction of this adhesive tape (%) is 65%.

(Evaluation Substrate)

In the following examples and a comparative example, two-dimensional geometry, substrate thickness, conductor interconnect layer thickness, solder resist thickness, electrode pad, circuit width, circuit layout of the first resin substrate, the second resin substrate and the resin spacer are same as employed in example 1.

The second bumps provided in the second resin substrate were as follows:
second bump: Sn/3.5Ag; and
second bump height: 45 μm.

The first bump provided in the resin spacer were as follows:
first bump: Sn/3.5Ag; and
first bump height: 45 μm.

In addition to above, for the second resin substrate and resin spacer, the first bumps and the second bumps of Sn/3.5Ag were formed in the following manner. Sn-3.5Ag soldering-paste (commercially available from Tamura Kaken Co., Ltd., LF-101) was printed on a coupling pad by utilizing a metallic mask having opening holes in locations corresponding to electrode pads formed on the resin substrate. After removing the metallic mask, a reflow was passed therethrough to form solder bumps.

Example 7

In the present example, in both of the first resin substrate and the second resin substrate, "ELC4785GS" (commercially available from Sumitomo Bakelite Co., Ltd., cyanate resin impregnation substrate) was employed for cores, and "APL 3601" (commercially available from Sumitomo Bakelite Co., Ltd., cyanate resin impregnation substrate) was employed for built-ups.

In addition, for the resin spacer that is disposed between the substrates, "ELC4785GS" (commercially available from Sumitomo Bakelite Co., Ltd., cyanate resin impregnation substrate) was employed for core, and "APL 3601" (commercially available from Sumitomo Bakelite Co., Ltd., cyanate resin impregnation substrate) was employed for built-ups.

By employing the second resin substrate having the solder bumps formed in the back surface thereof and the resin spacer having the solder bumps formed in the back surface thereof, adhesive tapes having a flux activity were sandwiched between the first resin substrate and the resin spacer and between the resin spacer and the second resin substrate, and further, a silicone rubber of 200 μm thick was disposed on an upper surface of the second resin substrate, so as to uniformly exerting a pressure, and then a compressively bonding at 260 degree C. and 0.5 MPa for 10 seconds was conducted to achieved an adhesion thereof. In addition, the adhesive tape having the flux activity was attached along the circumference of the first resin substrate and the second resin substrate.

Example 8

A multiple-layered material was manufactured by employing the method of example 7, except that "ELC-4765" (commercially available from Sumitomo Bakelite Co., Ltd., FR-4 substrate) was employed as the material of the resin spacer.

(Evaluation of Chip Crack)

An existence of a chip crack in the first semiconductor chips of the semiconductor devices obtained in the respective examples and the comparative example were examined by an observation with a scan acoustic tomograph (SAT), and a result of free of chip crack is indicated as "o", and a result of chip crack is indicated as "x". The results of the evaluation are shown in table 7.

(Evaluation of Conductive Failure)

Heat cycle tests at −55 degree C. for 1 hour and at 125 degree C. of one hour were conducted for the semiconductor devices obtained in the respective examples and the comparative example for 1,000 cycles. Conductive resistances between adjacent terminals provided on the back surface of first resin substrate were measured before and after the heat cycle test for ten points via four-probe method. Spot exhibiting the conductive resistance after the cycle test, which was higher than 5 times of the conductive resistance before the cycle test, was counted as a conductive failure. Evaluation results are shown in table 7.

TABLE 7

| SUBSTRATE | STRUCTURAL COMPONENT | EXAMPLE 7 | EXAMPLE 8 |
|---|---|---|---|
| first resin substrate | core layer | ELC4785GS | ELC4785GS |
|  | build-up layer | APL3601 | APL3601 |
| second resin substrate | core layer | ELC4785GS | ELC4785GS |
|  | build-up layer | APL3601 | APL3601 |
|  | solder bump | back surface | back surface |
| resin spacer | core layer | ELC4785GS | ELC4765 |
|  | build-up layer | APL3601 | APL3601 |
|  | solder bump | back surface | back surface |
|  | chip crack | ○ | ○ |
|  | conductive failure | 0/10 | 0/10 |

Example 9

Here, investigations of the method for manufacturing the semiconductor device were conducted.

1. Manufacture of First Resin Substrate, Second Resin Substrate and Resin Spacer The first resin substrate, the second resin substrate and the resin spacer employed here include a buildup layer that is composed of alternately stacked three insulating layers and three conductor interconnect layers, and a core layer. In table 8, resin components of the insulating layers and the insulating layer in the core layer employed in the first resin substrate, the second resin substrate and the resin spacer are shown.

TABLE 8

| | | PARTS BY WEIGHT | |
|---|---|---|---|
| RESINS | TRADE NAME ETC. | CORE LAYER | BUILD-UP LAYER |
| cyanate resins | Novolac cyanate resin, Lonza Co., "PRIMASET PT-30", weight average molecular weight (Mw) = 700 | 19.7 | 25.0 |
| epoxy resins | biphenyl dimethylene epoxy resin, Nihon Kayaku Co., "NC-3000", epoxy equivalent = 275, MW = 2,000 | 11.0 | 24.7 |
| phenoxy resins | copolymer of biphenyl epoxy resin and bisphenol S epoxy resin having epoxy group as terminating group, Japan Epoxy Resin Co.,, "YX-8100H30", Mw = 30,000 | | 10.0 |
| curing agent | biphenyl dimethylene phenol resin, Meiwa Plastic Industries Co., "MEH-7851-3H", hydroxyl equivalent = 230 | 9.0 | |
| curing catalyst | imidazole compound, Shikoku Chemicals Corporation, "1B2PZ", 1-benzyl-2-phenyl imidazole | | 0.1 |
| inorganic filler | spherical fused silica, Admatechs Co., "SO-25H", mean particle size = 0.5 μm | 60 | 40 |
| coupling agent | epoxy silane coupling agent, GE Toshiba Silicone Co., "A-187" | 0.3 | 0.2 |

2. Manufacture of Adhesive Film (Adhesive Tape)

Thermosetting resins of 20 parts by weight of cresol novolac epoxy resin (commercially available from Nippon Kayaku Co., Ltd., EOCN-1020, softening point: 80 degree C.) and 30 parts by weight of epoxy resin (commercially available from Nippon Kayaku Co., Ltd., NC-6000); thermoplastic resin of 20 parts by weight of acrylic rubber (commercially available from Nagase Chemtex Co., Ltd., SG-PZ, butyl acrylate/ethyl acrylate/acrylonitrile=30% mol/30% mol/40% mol, molecular weight: 850,000); curing agent of 16 parts by weight of liquid phenolic compound (commercially available from Meiwa Plastic Industries Co., Ltd., MEH-8000H) and 8 parts by weight of solid phenolic resin (commercially available from Sumitomo Bakelite Co., Ltd., PR-HF-3); curing agent exhibiting a flux activity of 5 parts by weight of sebacic acid (commercially available from Tokyo Chemical Industry Co., Ltd); cure accelerator of 0.15 part by weight of imidazole compound (commercially available from Shikoku Chemicals Corporation, 2PHZ-PW); coupling agent of 0.5 part by weight of γ-glycidoxy propyl trimethoxysilane (commercially available from Shin-Etsu Chemical Co., Ltd., KBM403E); and conductive component of 60 parts by weight of solder powder (commercially available from Mitsui Mining & Smelting Co., Ltd., Sn42/Bi58), were uniformly dispersed in a solvent of 50 parts by weight of toluene and 80 parts by weight of methyl ethyl ketone. Further, the obtained resin varnish was applied onto polyethylene terephthalate that has been demolding-processed so as to have a thickness of dried film of 20 μm, and then was dried. The drying process was conducted by exposing the applied surface within a drying-machine at an inside temperature of 60 degree C., and air velocity of 15 m/min for ten minutes. The dried product was cut to have a width of 2.0 mm to obtain the adhesive film.

3. Manufacture of Semiconductor Device

Through holes configured to be able to be inserted with pins were formed in the ends of the first resin substrate, the resin spacer and the second resin substrate, respectively. Then, the pins are inserted into these through holes to achieve alignments (pin laminate method), and then, the above-described adhesive tapes were sandwiched between the first resin substrate and the resin spacer and between the resin spacer and the second resin substrate, and further, a silicone rubber of 200 μm thick was disposed on an upper surface of the second substrate, so as to uniformly exerting a pressure, and then a compressively bonding at 220 degree C. and 2 MPa for 100 seconds was conducted to achieved an adhesion thereof. In addition, the adhesive tape was attached along the circumference of the first resin substrate and the second resin substrate. This provides the semiconductor device provided with the resin spacer between the first resin substrate and the second resin substrate.

Example 10

Similar procedure as in example 1 was employed to manufacture the semiconductor device, except that the condition for the thermo-compression bonding was as follows. The thermo-compression bonding was carried out at 220 degree C. and 0.5 MPa for 100 seconds.

Example 11

Similar procedure as in example 1 was employed except that an anisotropic conductive film as set forth in the following description was employed for the adhesive film. 100 parts by weight of bisphenol A phenoxy resin (commercially available from Inchem Co., Ltd., PKHC, weight-average molecular weight Mw=50,000, solution of 20% wt. ethyl acetate); 50 parts by weight of polyvinylbutyral resin (commercially available from Sekisui Chemical Co., Ltd., BX, degree of polymerization: 1,700, butyral rate 65% mol, solution of 20% wt. ethyl acetate); 20 parts by weight of bisphenol A epoxy resin (commercially available from Japan Epoxy Resin Co., Ltd., EPICOTE 828, weight per epoxy equivalent 180 g/eq); 30 parts by weight of bisphenol F epoxy resin (commercially available from Japan Epoxy Resin Co., Ltd., EPICOTE 806, weight per epoxy equivalent 175 g/eq); 20 parts by weight of microencapsulated 2-methyl imidazole epoxy compound (mean particle diameter 3 μm, capsule membrane matrix thickness 0.2 μm); and 3 parts by weight of Ni/Au plated acrylic particle (commercially available from Sekisui Chemical Co., Ltd., Micropearl AUL-705, mean particle diameter 5 μm), were mixed, and were uniformly dispersed. Then, 100 parts by weight of a mixture of microencapsulated 2-methyl imidazole epoxy compound and epoxy resin components employed for blending, which were mixed by employing a compounding ratio, was transferred in a 200 ml container, and a preheating of the mixture was conducted. The condition of the preheating is described in the table. This was applied onto polyethylene terephthalate that has been demolding-processed so as to have a thickness of dried film of 15 μm, and then was dried. The dried product was cut to have a width of 1.5 mm to obtain the anisotropic conductor adhesive agent film.

Example 12

Similar procedure as in example 1 was employed except that the following method was employed for stacking of the first resin substrate, the resin spacer and the second resin substrate, in place of employing a pin laminate method. An alignment of the first resin substrate, the resin spacer and the second resin substrate was conducted by an image recognition with a camera.

Comparative Example 3

Similar procedure as in example 1 was employed except that the coupling of the above-described first resin substrate and the second resin substrate was achieved by the bump electrodes as set forth below is place of the resin spacer. The material of the bump electrode was Sn/Ag3.0/Cu0.5. The bump electrodes were arranged on the first resin substrate along the circumference of the first resin substrate and were joined to the second resin substrate. Since the bump electrodes were employed in comparative example 3, no adhesive tape was employed.

The following evaluations were conducted for the semiconductor devices obtained in the respective examples and the comparative example. The evaluation contents are shown with the items. Obtained results are shown in table 9.

1. Joint Reliability

Heat cycle tests at −55 degree C. for 1 hour and at 125 degree C. of one hour were conducted for the obtained semiconductor devices for 1,000 cycles. Conductive resistances between adjacent terminals provided on the back surface of first substrate were measured before and after the heat cycle test for ten points via four-probe method. Spot exhibiting the conductive resistance after the cycle test, which was higher than 5 times of the conductive resistance before the cycle test, was counted as a conductive failure.

2. Evaluation of Chip Crack

An existence of a chip crack was examined for the first semiconductor devices of the obtained semiconductor devices by an observation with a scan acoustic tomograph (SAT), and a result of free of chip crack is indicated as "○", and a result of chip crack is indicated as "x".

3. Productivity

Comparison of the productivity was conducted, when a reference is assumed that the manufacture of a semiconductor device in example 9 is (100).

TABLE 9

|  | EXAMPLE 9 | EXAMPLE 10 | EXAMPLE 11 | EXAMPLE 12 | COMPARATIVE EXAMPLE 3 |
| --- | --- | --- | --- | --- | --- |
| JOINT RELIABILITY | 0/10 | 0/10 | 0/10 | 0/10 | 10/10 |
| CHIP CRACK | ○ | ○ | ○ | ○ | X |
| PRODUCTIVITY | 100 | 100 | 100 | 80 | 100 |

As can be seen from table 9, the semiconductor devices of examples 9 to 12 exhibit improved coupling reliabilities. In addition, no chip crack was observed in the semiconductor devices of examples 9 to 12. Further, an improved productivity is achieved for each of the semiconductor devices in examples 9 to 12.

The invention claimed is:

1. A semiconductor device, comprising:
a first resin substrate on which a first semiconductor chip is mounted;
a second resin substrate on which a second semiconductor chip is mounted; and
a resin spacer, contacted with a front surface of said first resin substrate and to a back surface of the second said resin substrate, so that said front first resin substrate is electrically connected to said second resin substrate,
wherein said resin spacer is disposed in a circumference of said first semiconductor chip on the surface of said first resin substrate,
wherein said first semiconductor chip is disposed in a space section provided among said first resin substrate, said second resin substrate and said resin spacer on the surface of said first resin substrate,
wherein said first resin substrate includes a buildup layer, which is formed of insulating layers containing resin and conductor interconnect layers that are alternately stacked, each of said conductor interconnect layers being electrically mutually coupled via conductor layers formed in the via holes of said insulating layers,
wherein said second resin substrate includes a buildup layer, which is formed of insulating layers containing resin and conductor interconnect layers that are alternately stacked, each of said conductor interconnect layers being electrically mutually coupled via conductor layers formed in the via holes of said insulating layers, and wherein, among insulating layers of said buildup layer of at least one of said first resin substrate and said second resin substrate, in at least one insulating layer, an average coefficient of thermal expansion along a substrate inplane direction for temperature range of from 25 degree C. to a glass transition point thereof is equal to or lower than 30 ppm/degree C., and an average coefficient of thermal expansion along a substrate thickness direction for temperature range of from 25 degree C. to a glass transition point thereof is equal to or lower than 30 ppm/ degree C.

2. The semiconductor device as set forth in claim 1, wherein at least one layer in said insulating layer of said buildup layer contains a cyanate resin.

3. The semiconductor device as set forth in claim 2, wherein said cyanate resin is a novolac cyanate resin.

4. The semiconductor device as set forth in claim 1, wherein at least one of said first resin substrate and said second resin substrate includes a core layer wherein a through hole provided with a conductor layer is formed in the inside of a insulating layer, and said conductor layer in the through hole is coupled to the conductor interconnect layer of said buildup layer is formed, and wherein an average coefficient of thermal expansion along a substrate inplane direction of said insulating layer of said core layer for temperature range of from 25 degree C. to a glass transition point thereof is equal to or lower than 12 ppm/degree C, and an average coefficient of thermal expansion along a substrate thickness direction of the insulating layer of the core layer for temperature range of from 25 degree C. to a glass transition point thereof is equal to or lower than 20 ppm/ degree C.

5. The semiconductor device as set forth in claim 4, wherein a resin of said insulating layer of said core layer contains a cyanate resin.

6. The semiconductor device as set forth in claim 4, wherein said cyanate resin is a novolac cyanate resin.

7. The semiconductor device as set forth in claim 4, wherein a pair of said buildup layers are disposed across said core layer, and coefficient of thermal expansions of said insulating layers of said buildup layers disposed in substantially symmetric locations across said core layer are mutually equivalent.

8. The semiconductor device as set forth in claim 1, wherein said resin spacer includes a core layer having an insulating layer where a conductor layer is provided within a through hole, in the insulating layer of the core layer, an average coefficient of thermal expansion along an inplane direction for temperature range of from 25 degree C. to a glass transition point thereof is equal to or lower than 12 ppm/ degree C, and an average coefficient of thermal expansion along a thickness direction for temperature range of from 25 degree C. to a glass transition point thereof is equal to or lower than 20 ppm/ degree C.

9. The semiconductor device as set forth in claim 8, wherein said resin spacer includes a buildup layer which is formed on said core layer and which is formed of insulating layers containing resin and conductor interconnect layers that are alternately stacked, each of said conductor interconnect layers being electrically mutually coupled via conductor layers formed in the via holes of said insulating layers, and wherein, among insulating layers in said buildup layer of said resin spacer, in at least one insulating layer, an average coefficient of thermal expansion along a substrate inplane direction for temperature range of from 25 degree C. to a glass transition point thereof is equal to or lower than 30 ppm/degree C, and an average coefficient of thermal expansion along a substrate thickness direction for temperature range of from 25 degree C. to a glass transition point thereof is equal to or lower than 30 ppm/ degree C.

10. The semiconductor device as set forth in claim 9, wherein a resin of said insulating layer in said core layer of said resin spacer and a resin of said insulating layer in said buildup layer of said resin spacer include a cyanate resin, respectively.

11. The semiconductor device as set forth in claim 1, wherein said first resin substrate has a planar geometry of substantially rectangular, and said resin spacer is provided along each side of said rectangular geometry of said first resin substrate.

12. The semiconductor device as set forth in claim 1,
wherein said first resin substrate is connected to first semiconductor chip via a bump and said second resin substrate is connected to the second semiconductor chip via a bump, and wherein an underfill filled therein is mounted in a periphery of each of the bumps, said underfill being composed of a resin material whose elastic modulus in atmosphere at 125 degrees centigrade is 150 MPa or more and 800 MPa or less.

13. The semiconductor device as set forth in claim 8,
wherein the insulating layers in said buildup layers of said first resin substrate and said second resin substrate exhibit average coefficient of thermal expansions along a substrate inplane direction for temperature range of from 25 degree C. to a glass transition point thereof is equal to or lower than 30 ppm/degree C and average coefficient of thermal expansions along a substrate thickness direction for temperature range of from 25 degree C. to a glass transition point thereof is equal to or lower than 30 ppm/ degree C., and wherein said insulating layers in said buildup layers of said first resin substrate and the second resin substrate and the insulating layer in the core layer of said resin spacer contain cyanate resins, respectively.

14. A semiconductor device, comprising
a first resin substrate on which a first semiconductor chip is mounted;
a second resin substrate on which a second semiconductor chip is mounted; and
a resin spacer, disposed between a front surface of said first resin substrate and a back surface of said second resin substrate, so that said front surface of said first resin substrate is electrically connected to said back surface of the second said resin substrate,
wherein said resin spacer is disposed in a circumference of said first semiconductor chip on said surface of said first resin substrate, and said first semiconductor chip is disposed in a space section provided among said first resin substrate, said second resin substrate and said resin spacer on said surface of said first resin substrate,
wherein a first adhesive member, including an adhesive first resin layer that is capable of adhering said first resin substrate to said resin spacer and a first electric conductor disposed in the first resin layer, is provided between said first resin substrate and said resin spacer,
wherein a second adhesive member, including an adhesive second resin layer that is capable of adhering said resin spacer to said second resin substrate and a second electric conductor disposed in the second resin layer, is provided between said resin spacer and said second resin substrate, wherein said first resin substrate is electrically connected to said resin spacer through said first electric conductor of said first adhesive member, wherein said second resin substrate is electrically connected to said resin spacer through said second electric conductor of said second adhesive member, wherein the first electric conductor of said first adhesive member and the second electric conductor of said second adhesive member are conductive particles, respectively, wherein said first resin substrate is electrically connected to said resin spacer, through said conductive particles of said first adhesive member, wherein said second resin substrate is electrically connected to said resin spacer through said conductive particles of said second adhesive member, wherein said first resin substrate has a conductor interconnect layer in the front surface and an insulating layer is provided on said conductor interconnect layer so as to expose at least a part of said conductor interconnect layer, wherein said second resin substrate has a conductor interconnect layer in the back surface and an insulating layer is provided on said conductor interconnect layer so as to expose at least a part of said conductor interconnect layer, wherein said resin spacer has conductor interconnect layers in front and back surfaces, respectively, wherein said conductive particles of said first adhesive member disposed between said resin spacer and said first resin substrate provide a coupling between the conductor interconnect layer of said first resin substrate exposed from the insulating layer and the conductor interconnect layer of the resin spacer, and wherein said conductive particles of said second adhesive member disposed between said resin spacer and said second resin substrate provide a coupling between the conductor interconnect layer of said second resin substrate exposed from the insulating layer and the conductor interconnect layer of the resin spacer.

15. The semiconductor device as set forth in claim 14, wherein, among said conductive particles of said first adhesive member provided between said resin spacer and said first resin substrate, the conductive particles disposed between said resin spacer and the insulating layer provided on said first resin substrate are disposed so as to be wedged into said insulating layer, and wherein, among said conductive particles of said second adhesive member provided between said resin spacer and said second resin substrate, the conductive particles disposed between said resin spacer and the insulating layer provided on said second resin substrate are disposed so as to be wedged into said insulating layer.

16. The semiconductor device as set forth in claim 14, wherein said conductive particle is formed of a core material of resin, which is coated with a metallic film.

* * * * *